US012672287B2

(12) United States Patent
Tokita et al.

(10) Patent No.: US 12,672,287 B2
(45) Date of Patent: Jun. 30, 2026

(54) THREE-DIMENSIONAL MEMORY DEVICE CONTAINING SCALELESS STAIRCASE STRUCTURES AND METHODS OF FORMING THE SAME

(71) Applicant: SANDISK TECHNOLOGIES LLC, Addison, TX (US)

(72) Inventors: Hirofumi Tokita, Yokkaichi (JP); Kazuto Ohsawa, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 386 days.

(21) Appl. No.: 18/416,460

(22) Filed: Jan. 18, 2024

(65) Prior Publication Data

US 2025/0240955 A1     Jul. 24, 2025

(51) Int. Cl.
    *H10B 43/27*     (2023.01)
    *H10B 41/27*     (2023.01)
(52) U.S. Cl.
    CPC ............. *H10B 43/27* (2023.02); *H10B 41/27* (2023.02)
(58) Field of Classification Search
    CPC ........ H10B 43/27; H10B 41/27; H10B 43/20; H10B 41/20
    USPC ........................................................ 257/315
    See application file for complete search history.

(56) References Cited

U.S. PATENT DOCUMENTS 11,114,459 B2     9/2021     Iwai et al.
11,133,252 B2     9/2021     Ito et al.
11,139,237 B2    10/2021     Shao et al.
2013/0161821 A1*  6/2013     Hwang ................... H10B 41/20
                                                     257/E21.585
2018/0301372 A1* 10/2018     Noh ....................... H10P 74/203
2019/0221574 A1*  7/2019     Shimabukuro ........ H10B 41/20
2019/0319040 A1* 10/2019     Ishii ....................... H10B 43/27
2020/0251381 A1*  8/2020     Zhou ...................... H10B 41/50
2021/0057336 A1   2/2021     Shao et al.
2021/0134827 A1   5/2021     Iwai et al.
2021/0242128 A1   8/2021     Ito et al.

OTHER PUBLICATIONS

Endoh, T. et al., "Novel Ultra High-Density Flash Memory with a Stacked-Surrounding Gate Transistor (S-GT) Structured Cell," IEDM Proc., pp. 33-36, (2001).
U.S. Appl. No. 18/360,541, filed Jul. 27, 2023, SanDisk Technologies, LLC.
U.S. Appl. No. 18/360,641, filed Jul. 27, 2023, SanDisk Technologies, LLC.

* cited by examiner

*Primary Examiner* — Nduka E Ojeh
(74) *Attorney, Agent, or Firm* — THE MARBURY LAW GROUP PLLC

(57)                ABSTRACT

A method of forming a staircase structure in a semiconductor device includes forming primary terrace patterns in an alternating stack, repeating a respective anisotropic etch process that etches unmasked portions of the alternating stack and a respective mask trimming process to form additional terrace patterns, determining if the respective mask trimming process trimmed the mask within a desired distance range using the primary terrace patterns in the staircase structure as alignment marks, and forming layer contact via structures which contact electrically conductive layers in the primary terrace patterns and the additional terrace patterns.

20 Claims, 56 Drawing Sheets

THREE-DIMENSIONAL MEMORY DEVICE CONTAINING SCALELESS STAIRCASE STRUCTURES AND METHODS OF FORMING THE SAME

FIELD

The present disclosure relates generally to the field of semiconductor devices, and particularly to three-dimensional memory devices including scaleless staircase structures and methods of forming the same.

BACKGROUND

A three-dimensional memory device including three-dimensional vertical NAND strings having one bit per cell are disclosed in an article by T. Endoh et al, titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a semiconductor structure is provided. The method comprises: forming an alternating stack of insulating layers and spacer material layers over a substrate, wherein the spacer material layers are formed as, or are subsequently replaced with, electrically conductive layers; forming primary terrace patterns at a top portion of the alternating stack, wherein the primary terrace patterns comprise a first terrace pattern embodied as a first top-level terrace and a second terrace pattern as embodied as a second top-level terrace, wherein the first top-level terrace and the second top-level terrace are laterally spaced along a first horizontal direction, and are formed by patterning a pair of a topmost insulating layer and a topmost spacer material layer within the alternating stack; forming a patterned trimmable etch mask layer comprising two trimmable etch mask patterns over the alternating stack, wherein the two trimmable etch mask patterns comprise planar sidewalls that laterally extend along a second horizontal direction that is perpendicular to the first horizontal direction, and are laterally spaced from each other along the first horizontal direction; forming additional terrace patterns in the alternating stack by performing iterations of a set of processing steps multiple times, wherein each iteration of the set of processing steps comprises a respective anisotropic etch process that etches unmasked portions of the alternating stack and a respective mask trimming process that isotropically trims the two trimmable etch mask patterns; determining if the respective mask trimming process trimmed the two trimmable etch mask patterns within desired distance ranges using the primary terrace patterns as alignment marks; and forming layer contact via structures which contact the electrically conductive layers in the primary terrace patterns and the additional terrace patterns.

According to another embodiment of the present disclosure, a three-dimensional memory device is provided, which comprises: an alternating stack of insulating layers and electrically conductive layers located over a semiconductor material layer; and a two-dimensional array of memory stack structures located in a memory array region and vertically extending through the alternating stack, wherein each of the memory stack structures comprises a respective vertical stack of memory elements and a vertical semiconductor channel; and wherein the alternating stack comprises a staircase structure located in a contact region, wherein the staircase structure comprises, in order from one side to another along a first horizontal direction: a first horizontal surface segment; a first upward vertical step having a first height that equals a unit height, the unit height being equal to a vertical distance between top surfaces of a vertically neighboring pair of insulating layers within the alternating stack; a second horizontal surface segment through which a first layer contact via structure extends which contacts a first electrically conductive layer among the electrically conductive layer, the second horizontal surface segment having a first edge that coincides with a top edge of the first upward vertical step; a downward vertical step having a height that equals the unit height and having a top edge that coincides with a second edge of the second horizontal surface segment; a third horizontal surface segment through which a third layer contact via structure extends which contacts a second electrically conductive layer among the electrically conductive layers, the third horizontal surface segment having a first edge that coincides with a bottom edge of the downward vertical step; a second upward vertical step having a second height that equals double the unit height and having a bottom edge that coincides with a second edge of the third horizontal surface segment; a fourth horizontal surface segment through which a third layer contact via structure extends which contacts a third electrically conductive layer among the electrically conductive layers, the fourth horizontal surface segment having a first edge that coincides with a top edge of the second upward vertical step; a third upward vertical step having a third height that equals the unit height and having a bottom edge that coincides with a second edge of the fourth horizontal surface segment; and a fifth horizontal surface segment through which a fourth layer contact via structure extends which contacts a fourth electrically conductive layer among the electrically conductive layers, the fifth horizontal surface segment having a first edge that coincides with a top edge of the third upward vertical step.

According to yet another aspect of the present disclosure, a three-dimensional memory device is provided, which comprises: an alternating stack of insulating layers and electrically conductive layers located over a semiconductor material layer; and a two-dimensional array of memory stack structures located in a memory array region and vertically extending through the alternating stack, wherein each of the memory stack structures comprises a respective vertical stack of memory elements and a vertical semiconductor channel; and wherein the alternating stack comprises a staircase structure located in a contact region, wherein the staircase structure comprises, in order from one side to another along a first horizontal direction: a first horizontal surface segment through which a first layer contact via structure extends which contacts a first electrically conductive layer among the electrically conductive layer; a first upward vertical step having a first height that equals a unit height, the unit height being equal to a vertical distance between top surfaces of a vertically neighboring pair of insulating layers within the alternating stack; a second horizontal surface segment through which a second layer contact via structure extends which contacts a second electrically conductive layer among the electrically conductive layers; a second upward vertical step having a second height that equals double the unit height and having a bottom edge that coincides with an edge of the second horizontal surface segment; a third horizontal surface segment through which a third layer contact via structure extends which contacts a third electrically conductive layer among the electrically conductive layers, the third horizontal surface segment having a first edge that coincides with a top edge of the second upward vertical step; a downward vertical step having a height that equals the unit height and having a top edge that coincides with a second edge of the third horizontal surface segment; a fourth horizontal surface segment through which a fourth layer contact via structure extends which contacts a fourth electrically conductive layer among the electrically conductive layers, the fourth horizontal surface segment having a first edge that coincides with a bottom edge of the downward vertical step; and a third upward vertical step having a third height that equals double the unit height and having a bottom edge that coincides with a second edge of the fourth horizontal surface segment.

DETAILED DESCRIPTION

Figure 1:
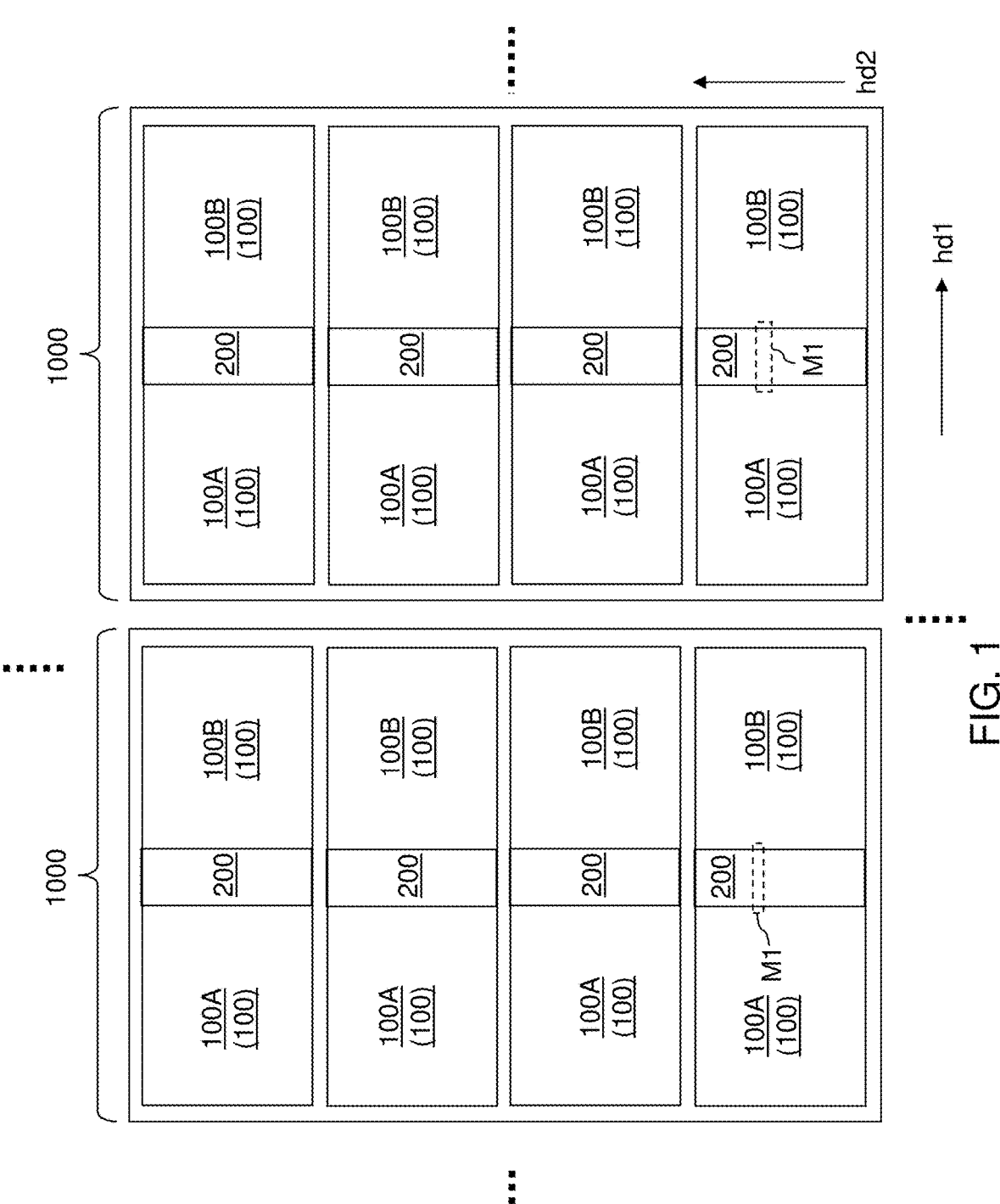
FIG. 1 is a plan view of a portion of a semiconductor wafer including semiconductor dies according to an embodiment of the present disclosure.

Staircase structures may be employed to provide stepped surfaces for an alternating stack of insulating layers and electrically conductive layers (e.g., word lines and select gate electrodes). Word line and select gate contact via structures are formed in contact with the stepped surfaces (e.g., "terraces") of the electrically conductive layers in the staircase structures. The staircase structures may be formed by iteratively performing a set of processing steps employing a trimming process that trims a trimmable etch mask and an anisotropic etch process that transfers the pattern of the trimmable etch mask. Alignment mark structures, typically known as "scales", are formed within the areas of the staircase structures, and can be employed to measure the trimming distances during the trimming processes. The scales occupy a fraction of the area of the staircase structure, but do not provide functionality in a final memory device. The embodiments of the present disclosure are directed to methods of making three-dimensional memory devices including staircase structures in which some steps are used both as alignment marks and as terrace steps to which contact via structures are made, the various aspects of which are now described in detail. This reduces the size of the staircase structure and/or permits more contact via structures to be formed per given staircase structure lateral size.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of a surface of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a portion of an exemplary semiconductor wafer is illustrated in a plan view. The illustrated portion of the exemplary semiconductor wafer includes areas of two semiconductor dies 1000. Generally, a two-dimensional periodic array of semiconductor dies 1000 can be formed on a semiconductor wafer. In one embodiment, each semiconductor die 1000 may have a rectangular area in a plan view, such as a top-down view. In one embodiment, edges of the semiconductor dies 1000 may be parallel to a first horizontal direction hd1 or a second horizontal direction hd2 that is perpendicular to the first horizontal direction hd1. Repetition of the illustrated portion of the exemplary structure in a two-dimensional periodic array along the first horizontal direction hd1 and the second horizontal direction hd2 is schematically represented by dotted lines.

Each semiconductor die 1000 may include multiple planes, each of which includes two memory array regions 100, such as a first memory array region 100A and a second memory array region 100B that are laterally spaced apart by a respective contact region 200. Generally, a semiconductor die 1000 may include a single plane or multiple planes. The total number of planes in the semiconductor die 1000 may be selected based on performance requirements on the semiconductor die 1000.

A pair of memory array regions 100 in a plane may be laterally spaced apart along a first horizontal direction hd1 (which may be the word line direction). For example, each pair of memory array regions 100 in a plane may include first memory array region 100A and a second memory array region 100B that are laterally spaced apart along the first horizontal direction hd1 by a contact region 200. A second horizontal direction hd2 (which may be the bit line direction) can be perpendicular to the first horizontal direction hd1. The semiconductor dies 1000 illustrated in FIG. 1 can be manufactured employing various embodiments of the present disclosure to be described below. Region M1 in FIG. 1 is illustrated in more detail in subsequent figures.

Figure 2:
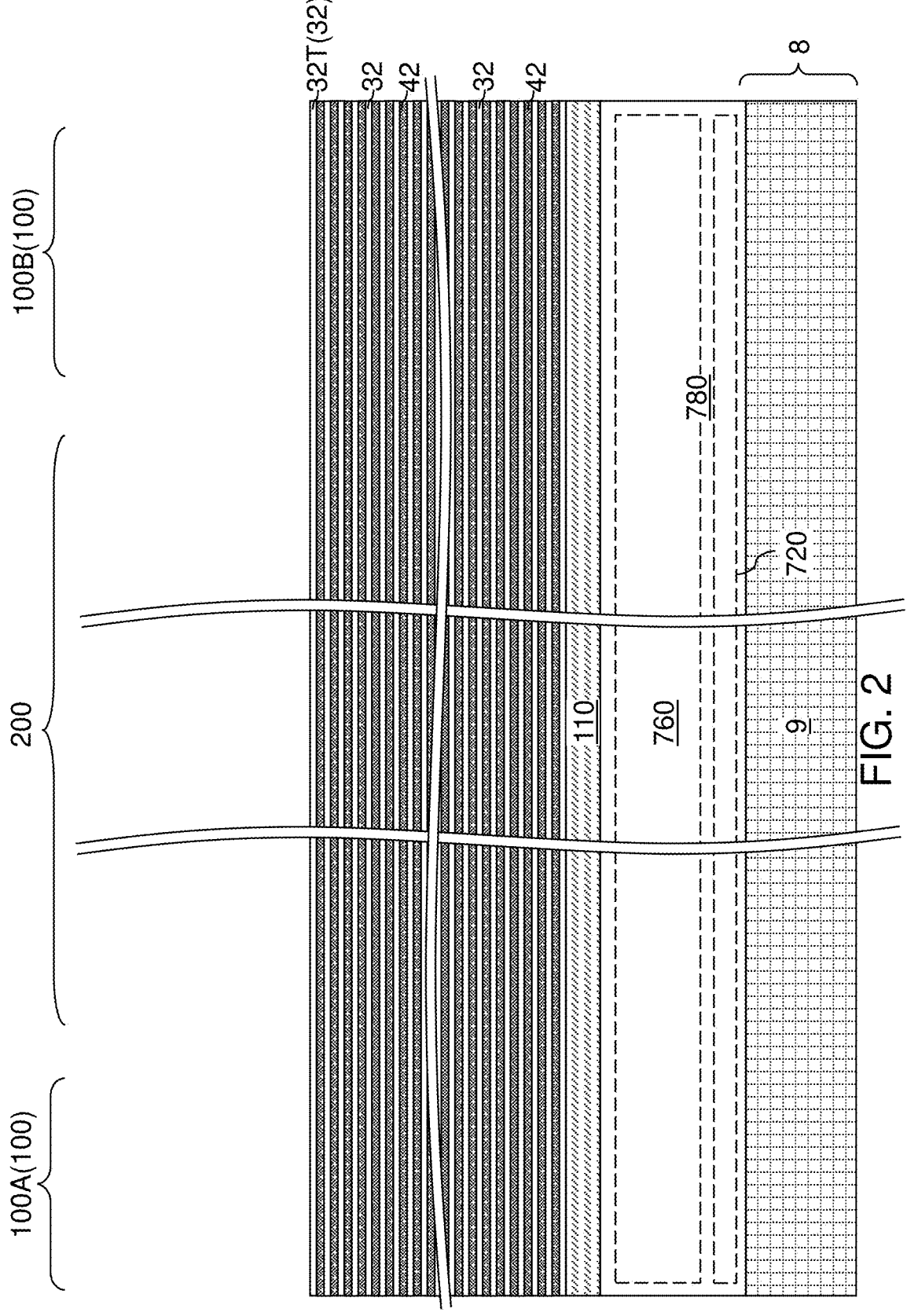
FIG. 2 is a vertical cross-sectional view of an exemplary structure after formation of optional semiconductor devices, optional lower-level dielectric material layers, optional lower-level metal interconnect structures, a semiconductor material layer, and an alternating layer stack of insulating layers and sacrificial material layers according to an embodiment of the present disclosure. The view shown in FIG. 2 corresponds to a vertical cross-sectional view of region M1 in FIG. 1 of a first configuration of the exemplary structure along a first horizontal direction.

FIG. 2 is a vertical cross-sectional view of region M1 in FIG. 1 of a first configuration of an exemplary structure is illustrated after formation of optional semiconductor devices 720, optional lower-level dielectric material layers 760, optional lower-level metal interconnect structures 780, a semiconductor material layer 110, an alternating layer stack of insulating layers 32 and spacer material layers (such as sacrificial material layers 42) over a substrate 8.

The substrate 8 may be a single crystalline silicon wafer, a silicon on insulator (SOI) substrate, or an insulating (e.g., glass or quartz) substrate. The substrate 8 comprises a substrate semiconductor layer 9 at a top portion thereof. The substrate semiconductor layer 9 may be a single crystalline semiconductor material layer such as a single crystalline silicon layer that is epitaxially grown on a silicon wafer or SOI substrate, or a doped well in an upper portion of a silicon wafer or SOI substrate.

The semiconductor devices 720 can be formed on the top surface of the substrate semiconductor layer 9. For example, the semiconductor devices 720 may include field effect transistors, resistors, capacitors, diodes, and/or various other semiconductor devices known in the art. In one embodiment, the semiconductor devices 720 may include a peripheral (i.e., driver) circuit for controlling the operation of three-dimensional memory arrays to be subsequently formed thereabove. Metal interconnect structures embedded in dielectric material layers can be formed above the semiconductor devices. The metal interconnect structures are herein referred to as lower-level metal interconnect structures 780, and the dielectric material layers are herein referred to as lower-level dielectric material layers 760. The lower-level metal interconnect structures 780 are electrically connected to various nodes of the semiconductor devices 720, and can include metal line structures and metal via structures located at various levels of the lower-level dielectric material layers 760.

A semiconductor material layer 110 can be formed on the top surface of the lower-level dielectric material layers 760. The semiconductor material layer 110 may be single crystalline or polycrystalline, and may be formed by a layer transfer from a source substrate (such as a single crystalline silicon layer including a buried hydrogen implantation layer), or may be formed by deposition of a semiconductor material (which may be a polycrystalline semiconductor material, such as polysilicon).

An alternating stack (32, 42) of insulating layers 32 and spacer material layers can be formed over the semiconductor material layer 110. The spacer material layers are formed as, or are subsequently replaced with, electrically conductive layers. In case the spacer material layers are subsequently replaced with the electrically conductive layers, the spacer material layers may be formed as sacrificial material layers 42.

As used herein, an alternating stack refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element. An alternating stack refers to a sequence of multiple instances of a first material layer and multiple instances of a second material layer such that the instances of the first material layer and the instances of the second material layer are interlaced.

While an embodiment is illustrated in which the spacer material layers are formed as sacrificial material layers 42, alternative embodiments are expressly contemplated herein in which the spacer material layers are formed as electrically conductive layers. In this case, processing steps for replacing the sacrificial material layers 42 with electrically conductive layers can be omitted.

The insulating layers 32 can be composed of the first material, and the sacrificial material layers 42 can be composed of the second material, which is different from the first material. Each of the insulating layers 32 continuously extends over the entire area of the substrate 8, and may have a uniform thickness throughout. Each of the sacrificial material layers 42 includes a sacrificial dielectric material and continuously extends over the entire area of the substrate 8, and may have a uniform thickness throughout. Insulating materials that may be used for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a dielectric material, which is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the sacrificial material layers 42 may be subsequently replaced with electrically conductive electrodes which may function, for example, as control gate electrodes of a vertical NAND device. In one embodiment, the sacrificial material layers 42 may be material layers that comprise silicon nitride.

Each insulating layer 32 may have a first thickness, which may be in a range from 15 nm to 60 nm, although lesser and greater thicknesses may also be employed. Each sacrificial material layer 42 may have a second thickness, which may be in a range from 15 nm to 60 nm, although lesser and greater thicknesses may also be employed. The total number of repetitions of a pair of an insulating layer 32 and a sacrificial material layer 42 in the alternating stack (32, 42) may be in a range from 16 to 1,024, such as from 64 to 512, although lesser and greater numbers may also be employed. The topmost layer among the insulating layers 32 is herein referred to as a topmost insulating layer 32T.

A hard mask layer 28 can be formed over the alternating stack (32, 42). The hard mask layer 28 comprises a material that can be removed selective to the material of the topmost insulating layer 32T. In one embodiment, the hard mask layer 28 comprises silicon nitride or a conductive material, such as titanium nitride. The thickness of the hard mask layer 28 may be in a range from 100 nm to 300 nm, although lesser and greater thicknesses may also be employed.

In an alternative embodiment, the semiconductor devices 720, the lower-level metal interconnect structures 780, and the lower-level dielectric material layers 760 may be located next to the alternating stack (32, 42) over the substrate 8 rather than underneath the alternating stack (32, 42). In yet another alternative embodiment, the semiconductor devices 720, the lower-level metal interconnect structures 780, and the lower-level dielectric material layers 760 may be omitted and not formed over the substrate 8. Instead, the semiconductor devices 720 of the peripheral (i.e., driver) circuit may be formed over a separate substrate and then bonded over the three-dimensional memory device. Optionally, the semiconductor material layer 110 may also be omitted in case the substrate 8 is later removed and a top source contact layer is formed on an exposed surface of the memory device, or it may be modified to function as part of a lateral source contact (e.g., direct strap contact) which is subsequently formed under the alternating stack.

FIGS. 3A-3H are sequential vertical cross-sectional views of a first configuration of the exemplary structure during formation of staircase structures and a retro-stepped dielectric material portion 65 according to an embodiment of the present disclosure.

Figure 3A:
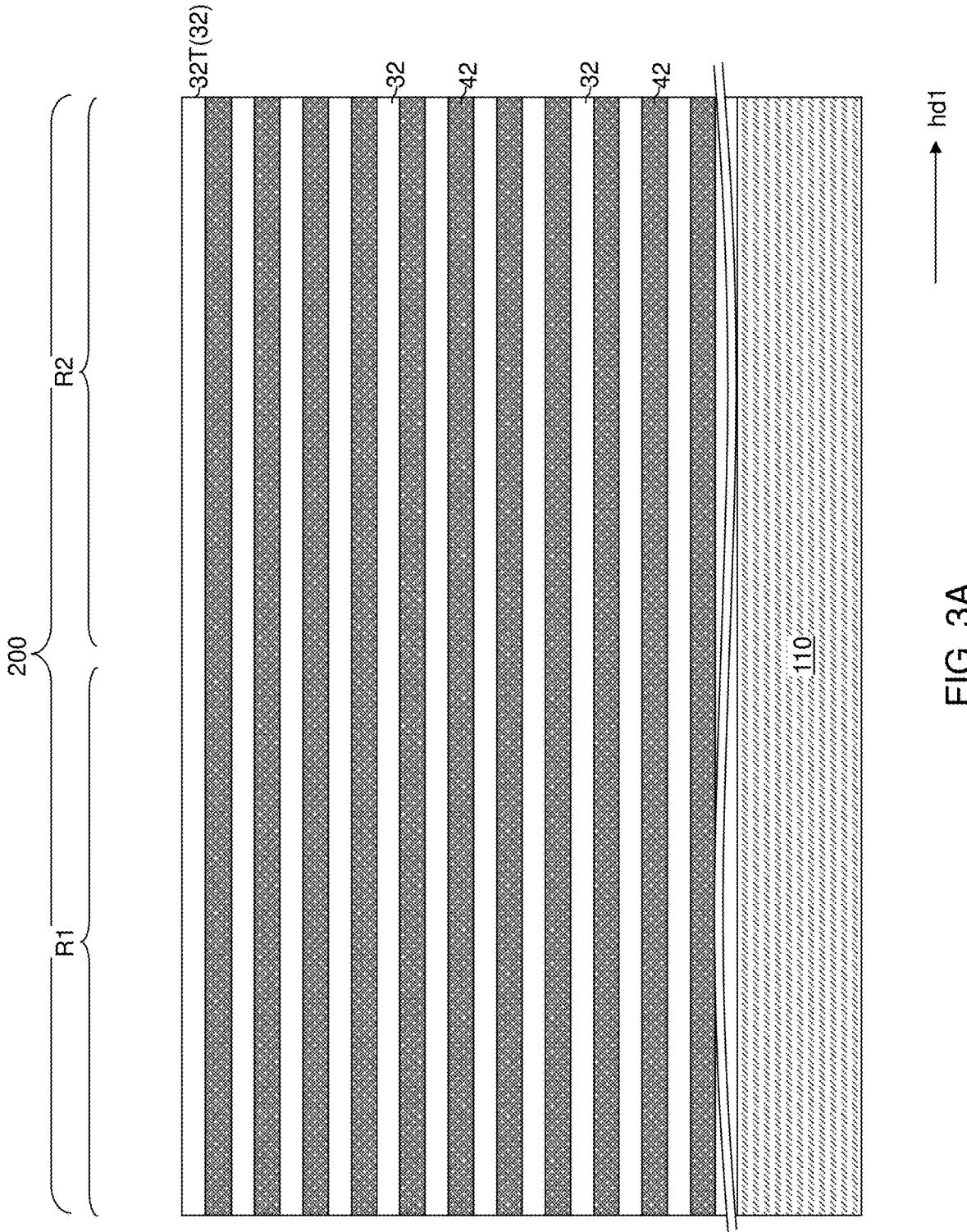
FIGS. 3A-3H are sequential vertical cross-sectional views of a first configuration of the exemplary structure during formation of staircase structures and a retro-stepped dielectric material portion according to a first embodiment of the present disclosure.

Referring to FIG. 3A, a portion of the contact region 200 is illustrated, which comprises a first region R1 and a second region R2 that are laterally spaced from each other along the first horizontal direction hd1.

Figure 3B:
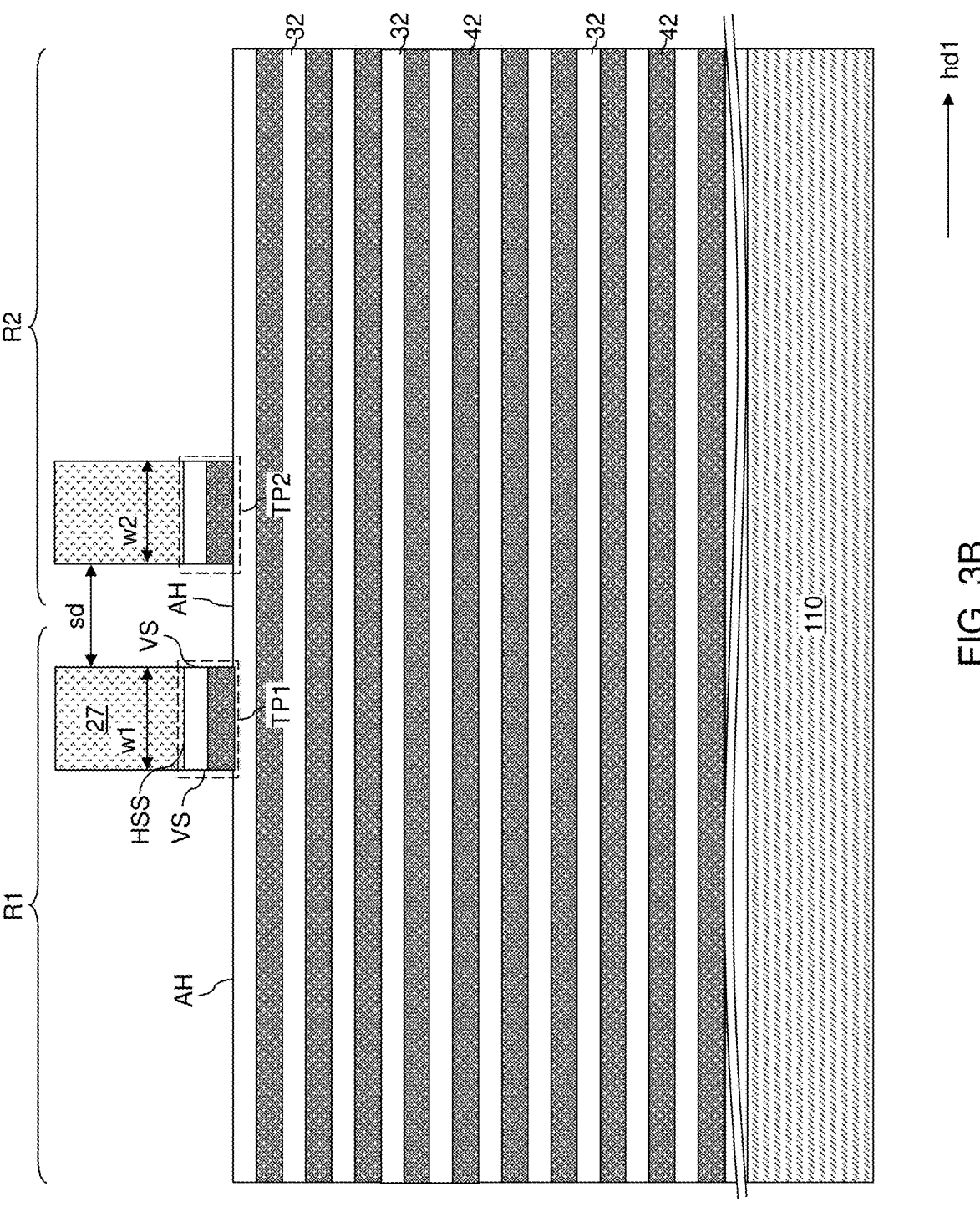

Referring to FIG. 3B, a photoresist layer 27 can be applied over the alternating stack (32, 42), and can be lithographically patterned into patterned photoresist material portions. The patterned photoresist material portions comprise pairs of photoresist material portions that are laterally spaced from each other along the first horizontal direction hd1 and laterally extend along the second horizontal direction hd2. For example, the patterned photoresist material portions may comprise a first strip-shaped photoresist material portion that is formed in the first region R1 and a second strip-shaped photoresist material portion that is formed in the second region R2. Additional pairs of strip-shaped photoresist material portions (not illustrated) may be formed in additional regions (not illustrated) of the contact region 200.

The first strip-shaped photoresist material portion may have a first width w1 along the first horizontal direction hd1, and the second strip-shaped photoresist material portion may have a second width w2 along the first horizontal direction hd1. The first width w1 and the second width w2 correspond to the widths of horizontal surface segments of stepped surfaces to be subsequently formed. In one embodiment, the first width w1 and the second width w2 may be the same, and may be in a range from 300 nm to 1.5 microns, such as from 500 nm to 1 micron. The first strip-shaped photoresist material portion and the second strip-shaped photoresist material portion may be laterally spaced apart from each other by a uniform distance, which is herein referred to as a separation distance sd. In one embodiment, the separation distance sd may be the same as or may be about the same as the first width w1 and the second width w2.

An anisotropic etch process can be performed to transfer the pattern in the photoresist layer 27 through the topmost insulating layer 32T of the alternating stack (32, 42) and through a topmost spacer material layer (such as the topmost sacrificial material layer 42) within the alternating stack (32, 42). The anisotropic etch process may stop at the top surface of a second-from-the-top insulating layer 32 within the alternating stack (32, 42), i.e., a second insulating layer 32 within the alternating stack (32, 42) as counted from top to bottom. Primary terrace patterns (TP1, TP2) can be formed at a top portion of the alternating stack (32, 42). As used herein, a terrace pattern (e.g., terrace segment) refers to any contiguous combination of a horizontal surface segment HSS and two vertical steps VS having edges (e.g., top edges in FIG. 3B) that coincide with two edges of the horizontal surface segment HSS. In this case, the horizontal surface segment HSS is vertically offset from two underlying adjacent horizontal surface segments AH that are adjoined to additional (e.g., bottom) edges of the vertical steps VS that are not adjoined to the horizontal surface segment HSS.

In one embodiment, the primary terrace patterns (TP1, TP2) comprise a first terrace pattern TP1 comprising first top-level terrace, and a second terrace pattern TP2 comprising a second top-level terrace, wherein the first top-level terrace and the second top-level terrace are laterally spaced along a first horizontal direction hd1. Generally, the first terrace pattern TP1 and the second terrace pattern TP2 may be formed by patterning a pair of a topmost insulating layer 32 and a topmost spacer material layer (such as a topmost sacrificial material layer 42) within the alternating stack (32, 42). The photoresist layer 27 can be subsequently removed, for example, by ashing.

Figure 3C:
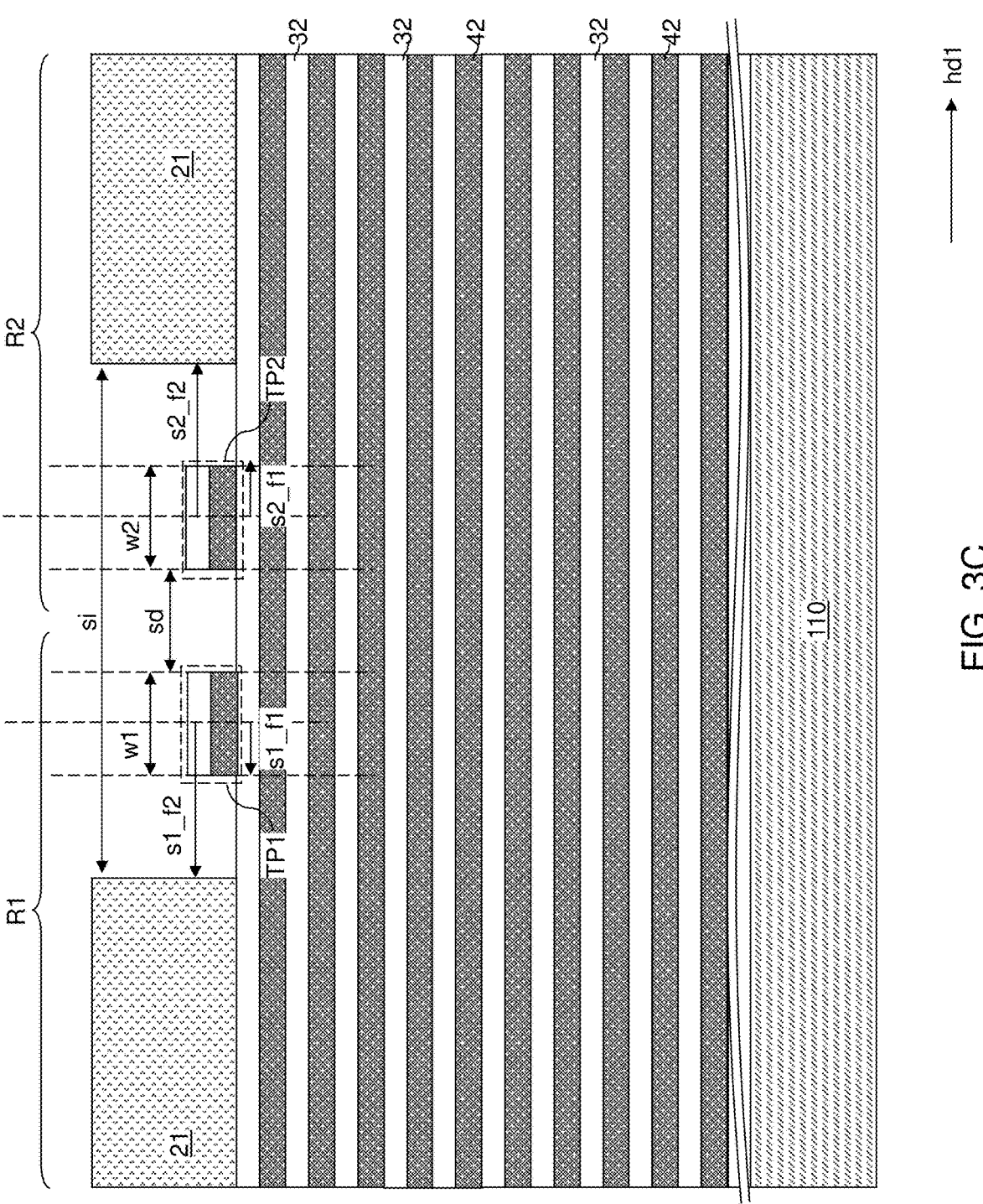

Referring to FIG. 3C, a patterned trimmable etch mask layer can be formed over the alternating stack (32, 42). The patterned trimmable etch mask layer comprises a photoresist material that can be isotropically recessed by slow ashing. The patterned trimmable etch mask layer can be lithographically patterned into trimmable etch mask patterns 21. In one embodiment, the patterned trimmable etch mask layer comprises two trimmable etch mask patterns 21 that are formed over the alternating stack (32, 42) in the first region R1 and in the second region R2. In one embodiment, the two trimmable etch mask patterns 21 comprise planar sidewalls that laterally extend along the second horizontal direction hd2 that is perpendicular to the first horizontal direction hd1, and are laterally spaced from each other along the first horizontal direction hd1 by an initial gap having a uniform spacing, which is herein referred to as an initial spacing "si". In one embodiment, the initial spacing "si" is greater than a separation distance "sd" between the first terrace pattern TP1 and the second terrace pattern TP2.

In one embodiment, the first terrace pattern TP1 and the second terrace pattern TP2 can be formed entirely within a gap between the two trimmable etch mask patterns 21 of the patterned trimmable etch mask layer. A dimensional metrology tool may be employed to measure the lateral offset of edges of the trimmable etch mask patterns 21 relative to the first terrace pattern TP1 and the second terrace pattern TP2. As used herein, a dimensional metrology tool refers to a measurement tool that can characterize dimensional parameters of semiconductor structures. The dimensional metrology tool may be a scanning electron microscopy (SEM) tool or an optical image analysis tool which may use a diffraction based measurement scheme, a phase-shift-based measurement scheme, and/or an image-based based measurement scheme to measure distances.

In one embodiment, the dimensional metrology tool may identify two edges (e.g., edges of the sidewalls of the vertical steps VS) of the first terrace pattern TP1 that are perpendicular to the first horizontal direction hd1, and can use the midpoint line of the two edges as a first reference line. The dimensional metrology tool may measure the lateral distance between the first reference line and an edge of the first terrace pattern TP1 that is distal from the second terrace pattern TP2, which is herein referred to as a first-staircase first lateral distance s1_f1. The dimensional metrology tool may measure the lateral distance between the first reference line and a sidewall of a trimmable etch mask patterns 21 that is proximal to the first terrace pattern TP1, which is herein referred to as a first-staircase second lateral distance s1_f2. In one embodiment, the pattern of the patterned trimmable etch mask layer can be selected such that a difference between the first-staircase second lateral distance s1_f2 and the first-staircase first lateral distance s1_f1 is the same as the first width w1, and/or is the same as the separation distance sd.

Likewise, the dimensional metrology tool may identify two edges of the second terrace pattern TP2 that are perpendicular to the first horizontal direction hd1, and can use the midpoint line of the two edges as a second reference line. The dimensional metrology tool may measure the lateral distance between the second reference line and an edge of the second terrace pattern TP2 that is distal from the first terrace pattern TP1, which is herein referred to as a second-staircase first lateral distance s2_f1. The dimensional metrology tool may measure the lateral distance between the second reference line and a sidewall of a trimmable etch mask patterns 21 that is proximal to the second terrace pattern TP2, which is herein referred to as a second-staircase second lateral distance s2_f2. In one embodiment, the pattern of the patterned trimmable etch mask layer can be selected such that a difference between the second-staircase second lateral distance s2_f2 and the second-staircase first lateral distance s2_f1 is the same as the second width w2, and/or is the same as the separation distance sd. In one embodiment, the first width w1, the second width w2, and the separation distance sd may be the same.

Figure 3D:
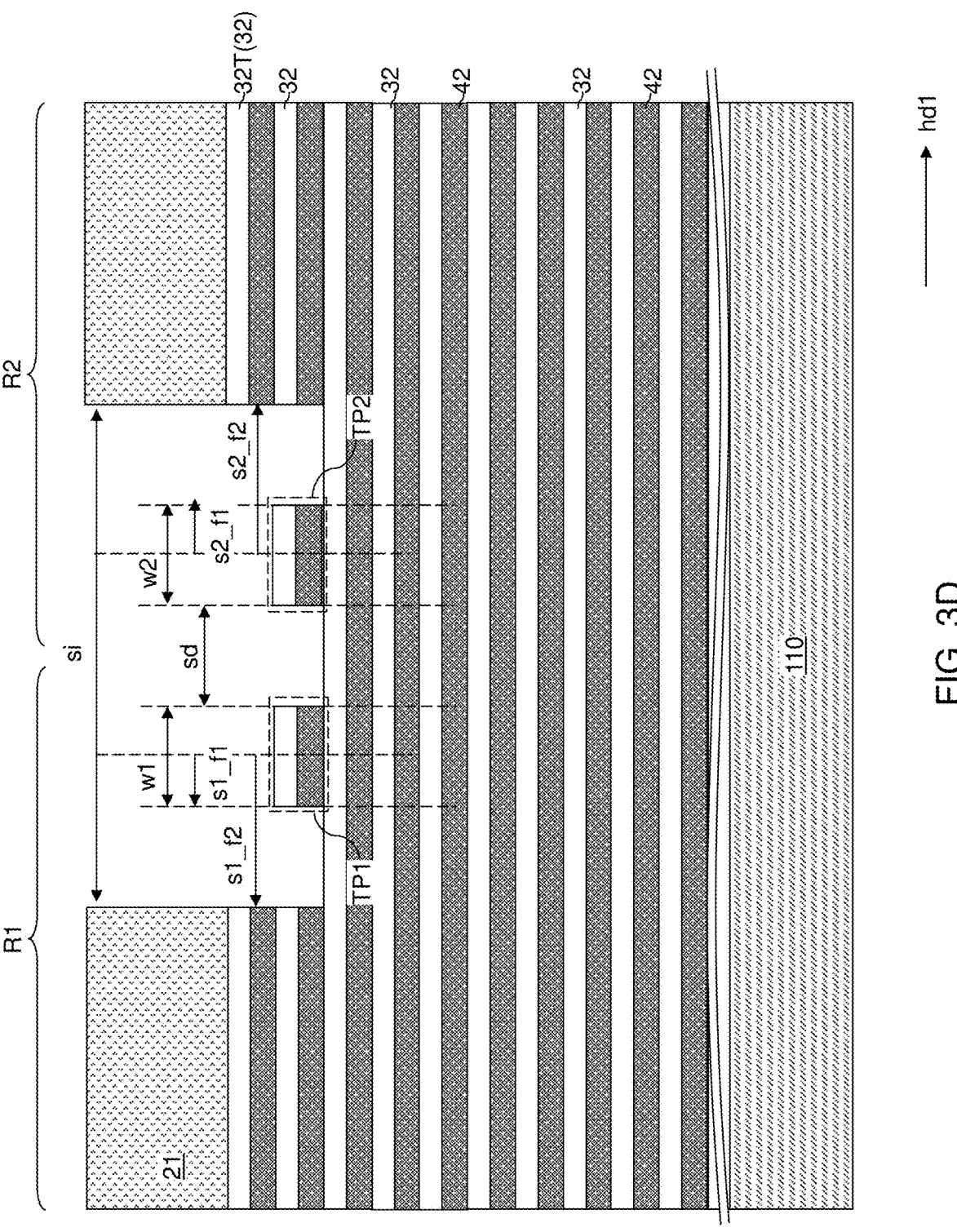
Figure 3E:
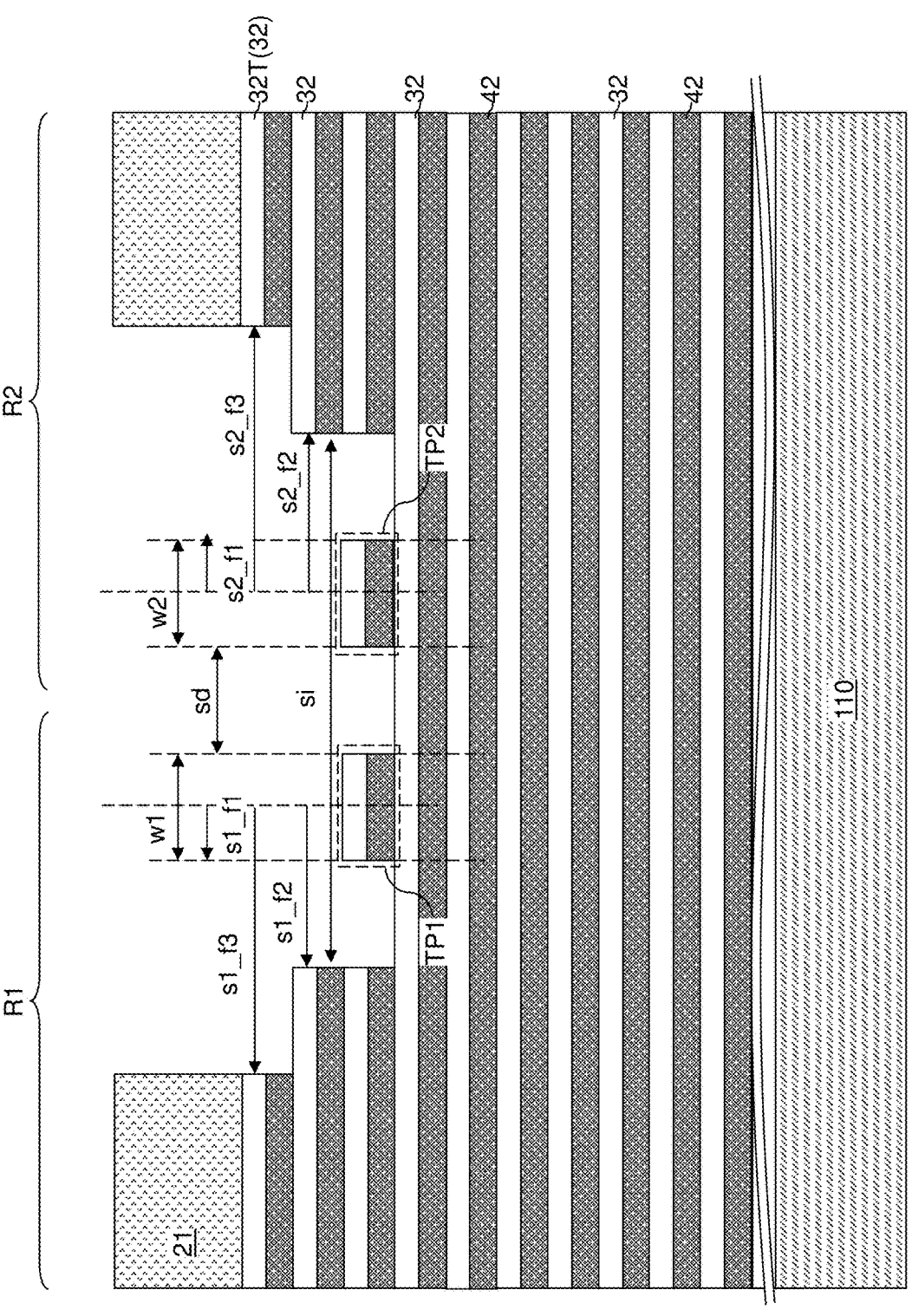

If the distances measured by the metrology tool are within the desired distance ranges, then additional terrace patterns can be formed in the alternating stack (32, 42) by performing one iteration of a set of processing steps (e.g., the steps of FIGS. 3D and 3E). Each iteration of the set of processing steps comprises a respective anisotropic etch process that etches unmasked portions of the alternating stack (32, 42) (e.g., the process step shown in FIG. 3D) and a respective mask trimming process (e.g., the process step shown in FIG. 3E) that isotropically trims the two trimmable etch mask patterns 21. In contrast, if the distances measured by the metrology tool are outside the desired distance ranges, then the two trimmable etch mask patterns 21 are removed, and a new photoresist layer is deposited and patterned into two new trimmable etch mask patterns 21. The above distances are again measured by the metrology tool to determine if they are within the desired distance ranges, and one of the above sets of steps (e.g., etching/trimming or new photoresist deposition/patterning) is performed depending on whether the distances measured by the metrology tool are within the desired distance ranges. The determination may be performed by the metrology tool and/or by a controller (e.g., computer) or a human operator which receives the measured distances from the metrology tool.

Referring to FIG. 3D, a first anisotropic etch process can be performed to transfer the pattern of the openings in the patterned trimmable etch mask layer into the alternating stack (32, 42). The first anisotropic etch process is a processing step within the first iteration of the set of processing steps. The first anisotropic etch process may comprise a sequence of processing steps including an anisotropic etch step for etching an insulating layer 32 selective to an underlying sacrificial material layer 42, an anisotropic etch step for etching a sacrificial material layer 42 selective to an underlying insulating layer 32, an anisotropic etch step for an insulating layer 32 selective to an underlying sacrificial material layer 42, and an anisotropic etch step for etching a sacrificial material layer 42 selective to an underlying insulating layer 32.

Referring to FIG. 3E, each trimmable etch mask pattern 21 within the patterned trimmable etch mask layer can be isotropically trimmed by performing a first mask trimming process, which is a processing step within the first iteration of the set of processing steps. The lateral trimming distance is herein referred to as a first isotropic trimming distance. In one embodiment, the first isotropic trimming distance may be 1/(2N) times the difference between the initial spacing si and the separation distance sd, in which N is an integer not less than 2. In the illustrated example, N may be 2.

In one embodiment, a dimensional metrology tool may be employed to measure the lateral trimming distance of the trimmable etch mask pattern 21. In one embodiment, the dimensional metrology tool may identify two edges of the first terrace pattern TP1 that are perpendicular to the first horizontal direction hd1, and can use the midpoint line of the two edges as a first reference line. The dimensional metrology tool may measure the lateral distance between the first reference line and an edge of the first terrace pattern TP1 that is distal from the second terrace pattern TP2, which is the first-staircase first lateral distance s1_f1. The dimensional metrology tool may measure the lateral distance between the first reference line and a sidewall of a next proximal vertical step in the first region R1, which is the first-staircase second lateral distance s1_f2. The dimensional metrology tool may measure the lateral distance between the first reference line and the sidewall of the trimmable etch mask pattern 21 in the first device region R1, which is the first-staircase third lateral distance s1_f3. In one embodiment, the pattern of the patterned trimmable etch mask layer can be selected such that a difference between the first-staircase third lateral distance s1_f3 and the first-staircase second lateral distance s1_f2 is the same as the first width w1, and/or is the same as the separation distance sd.

Likewise, the dimensional metrology tool may identify two edges of the second terrace pattern TP2 that are perpendicular to the first horizontal direction hd1, and can use the midpoint line of the two edges as a second reference line. The dimensional metrology tool may measure the lateral distance between the second reference line and an edge of the second terrace pattern TP2 that is distal from the first terrace pattern TP1, which is the second-staircase first lateral distance s2_f1. The dimensional metrology tool may measure the lateral distance between the second reference line and a sidewall of a next proximal vertical step in the second region R2, which is the second-staircase second lateral distance s2_f2. The dimensional metrology tool may measure the lateral distance between the second reference line and the sidewall of the trimmable etch mask pattern 21 in the second device region R2, which is the second-staircase third lateral distance s2_f3. In one embodiment, the pattern of the patterned trimmable etch mask layer can be selected such that a difference between the second-staircase third lateral distance s2_f3 and the second-staircase second lateral distance s2_f2 is the same as the second width w2, and/or is the same as the separation distance sd.

If the distances measured by the metrology tool are within the desired distance ranges, then additional terrace patterns can be formed in the alternating stack (32, 42) by performing a second anisotropic etch process to transfer the pattern of the openings in the patterned trimmable etch mask layer into the alternating stack (32, 42), as shown in FIG. 3E, followed by a second trimming of the trimmable etch mask patterns 21. The second anisotropic etch process is a processing step within the second iteration of the set of processing steps. The second anisotropic etch process may comprise a sequence of processing steps including an anisotropic etch step for etching an insulating layer 32 selective to an underlying sacrificial material layer 42, and an anisotropic etch step for etching a sacrificial material layer 42 selective to an underlying insulating layer 32.

If the distances measured by the metrology tool are outside the desired distance ranges, then the two trimmable etch mask patterns 21 are removed, and a new photoresist layer is deposited and patterned into two new trimmable etch mask patterns 21. The above distances are again measured by the metrology tool to determine if they are within the desired distance ranges, and one of the above sets of steps (e.g., etching/trimming or new photoresist deposition/patterning.

Figure 3F:
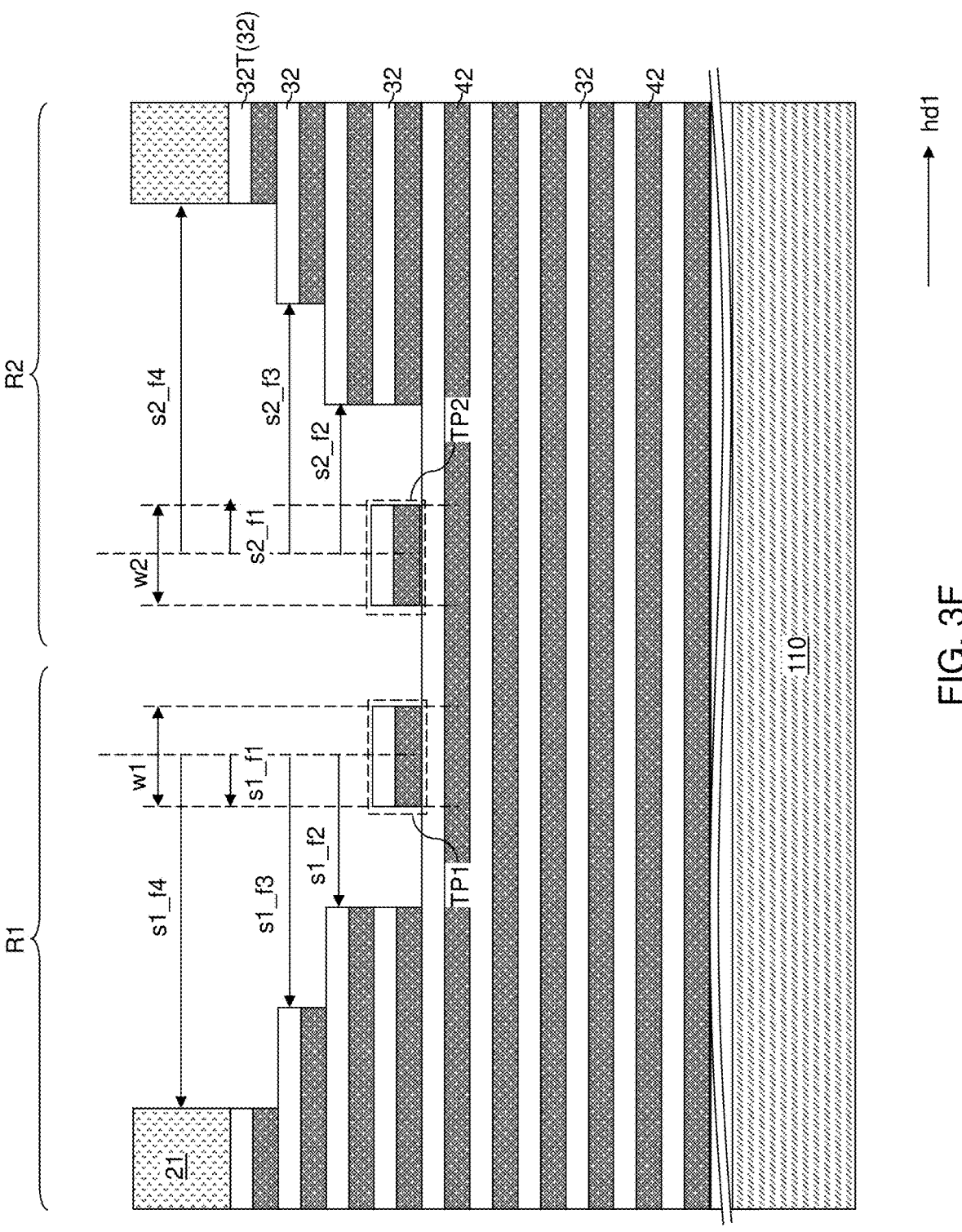

Referring to FIG. 3F, each trimmable etch mask pattern 21 within the patterned trimmable etch mask layer can be isotropically trimmed by performing a second mask trimming process, which is a processing step within the second iteration of the set of processing steps. The lateral trimming distance can be the same as the first isotropic trimming distance. As discussed above, the first isotropic trimming distance may be 1/(2N) times the difference between the initial spacing si and the separation distance sd, in which N is an integer not less than 2. In the illustrated example, N may be 2.

Additional terrace patterns can be formed in the alternating stack (32, 42) by performing iterations of the set of processing steps multiple times. Each iteration of the set of processing steps comprises a respective anisotropic etch process that etches unmasked portions of the alternating stack (32, 42) and a respective mask trimming process that isotropically trims the two trimmable etch mask patterns 21. Optionally, a dimensional metrology tool may be employed to measure the lateral trimming distance after one or more of the mask trimming processes and/or the anisotropic etch processes. While an embodiment is described in which the set of processing steps is repeated twice, alternative embodiments are expressly contemplated herein in which the total number of iterations of the set of processing steps is 3 or more.

A terminal anisotropic etch process can be performed to transfer the pattern of the openings in the patterned trimmable etch mask layer into the alternating stack (32, 42). The terminal anisotropic etch process may comprise a sequence of processing steps including an anisotropic etch step for etching an insulating layer 32 selective to an underlying sacrificial material layer 42, and an anisotropic etch step for etching a sacrificial material layer 42 selective to an underlying insulating layer 32.

Generally, the two trimmable etch mask patterns 21 within the patterned trimmable etch mask layer may be trimmed by the first isotropic trimming distance during each mask trimming process within each of the iterations of the set of processing steps. In one embodiment, the first isotropic trimming distance equals 1/(2N) times a difference between the initial spacing si and the separation distance sd, N being an integer not less than 2.

Optionally, a measurement operation can be performed, which measures locations of vertical steps of at least one of the additional terrace patterns relative to the primary terrace patterns (TP1, TP2) employing a dimensional metrology tool that identifies one of the primary terrace patterns (TP1, TP2) as a reference structure. In one embodiment, the dimensional metrology tool may measure a lateral distance along the first horizontal direction hd1 between a midpoint of two edges of each of the primary terrace patterns (TP1, TP2) and a selected vertical step among the vertical steps. In the illustrated example, the dimensional metrology tool may measure the lateral distance between the first reference line and the sidewall of the trimmable etch mask pattern 21 in the first device region R1, which is the first-staircase fourth lateral distance s1_ʄ4. Further, the dimensional metrology tool may measure the lateral distance between the second reference line and the sidewall of the trimmable etch mask pattern 21 in the second device region R1, which is the second-staircase fourth lateral distance s2_ʄ4.

A first staircase structure is formed in the first region R1, and a second staircase structure is formed in the second region R2. The first staircase structure comprises all terrace patterns in the first region R1, which comprise the first terrace pattern TP1 and a first subset of the additional terrace patterns that are formed during the processing steps described with reference to FIGS. 3C-3F. The second staircase structure comprises all terrace patterns in the second region R1, which comprise the second terrace pattern TP2 and a second subset of the additional terrace patterns that are formed during the processing steps described with reference to FIGS. 3C-3F. Thus, the first and second terrace patterns are used as alignment marks to determine if the trimming distance of the trimmable etch mask patterns 21 is within desired ranges followed by forming the additional terrace patterns.

In one embodiment, each horizontal surface HSS segment located entirely in the first region R1 or located entirely in the second region R2 may have the same lateral extent that equals the first trimming distance. In one embodiment, the first region R1 may comprise K horizontal surface segments of the insulating layers 32 that are located at K different levels that are vertically spaced from each other. Generally, K is an integer greater than 2. In the illustrated example, the integer K is 5. The trimmable etch mask patterns 21 can be subsequently removed, for example, by ashing.

Figure 3G:
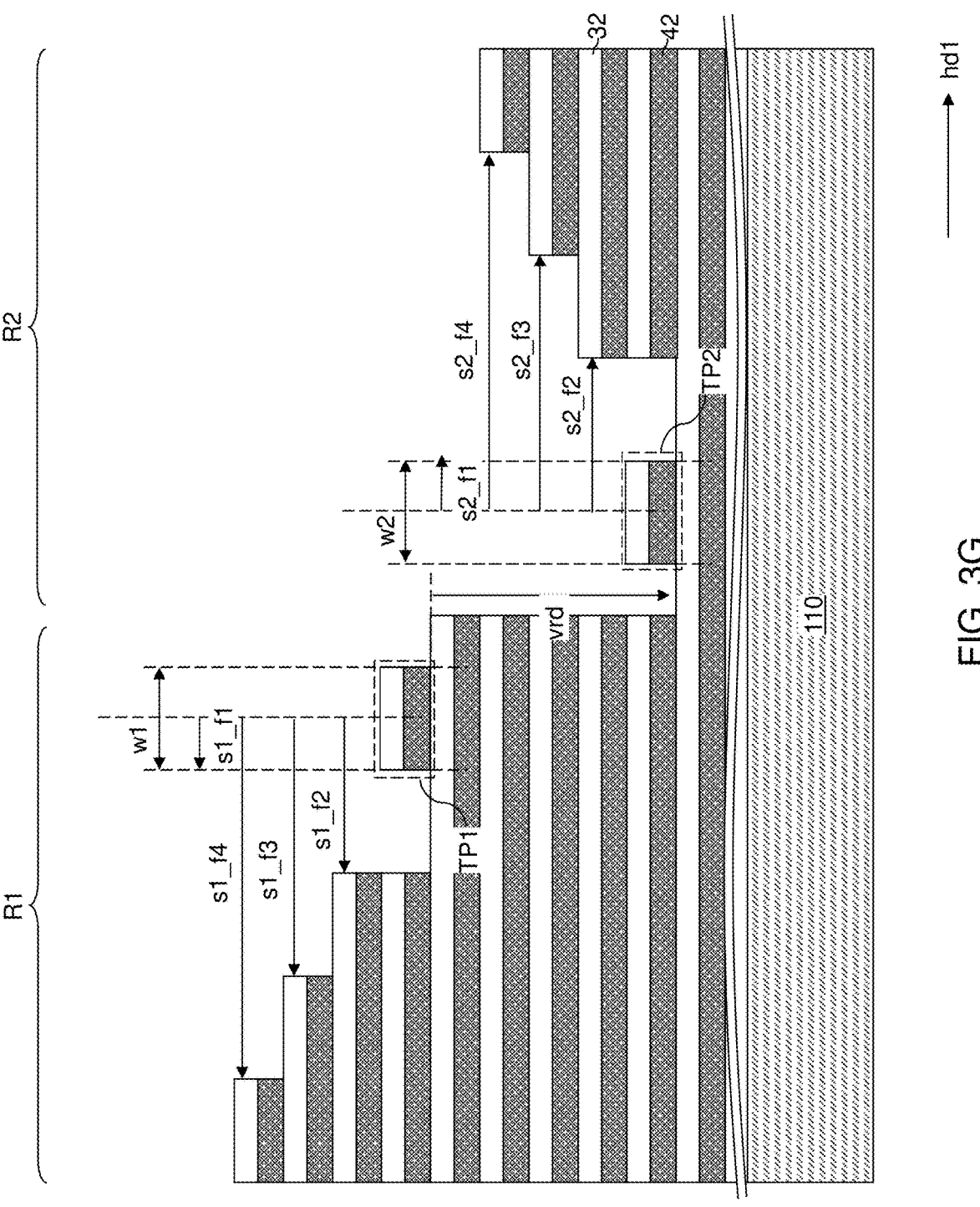

Referring to FIG. 3G, the various regions, such as the first region R1 and the second region R2, within the contact region 200 can be selectively vertically recessed such that staircase structures in the various regions can be vertically spaced from each other. For example, the various staircase structures in the various regions within the contact region 200 can be vertically spaced from each other by integer multiples of K times the sum of a thickness of an insulating layer 32 within the alternating stack (32, 42) and a thickness of a spacer material layer (such as sacrificial material layers 42) within the alternating stack (32, 42).

For example, the first region R1 of the alternating stack (32, 42) that includes the first terrace pattern TP1 and a first subset of the additional terrace patterns can be covered with a photoresist material portion (not shown) without covering the second region R2 of the alternating stack (32, 42) that includes the second terrace pattern TP2 and a second subset of the additional terrace patterns. The second region R2 of the alternating stack (32, 42) can be vertically recessed by a vertical recess distance vrd while the photoresist material portion covers the first region R1. In the illustrated example, the vertical recess distance vrd equals K times the sum of a thickness of an insulating layer 32 within the alternating stack (32, 42) and a thickness of a spacer material layer (such as sacrificial material layers 42) within the alternating stack (32, 42), in which K is the total number of levels of the horizontal surface segments within the first region R1. Generally, the vertical recess distance vrd may be an integer multiple of K times the sum of a thickness of an insulating layer 32 within the alternating stack (32, 42) and a thickness of a spacer material layer (such as sacrificial material layers 42) within the alternating stack (32, 42). A sidewall having a height of a respective vertical recess distance vrd may be formed between each neighboring pair of staircase structures in regions R1 and R2.

Optionally, a measurement operation described with reference to FIG. 3F may be performed in addition to or in lieu of the measurement operation described with reference to FIG. 3F.

Figure 3H:
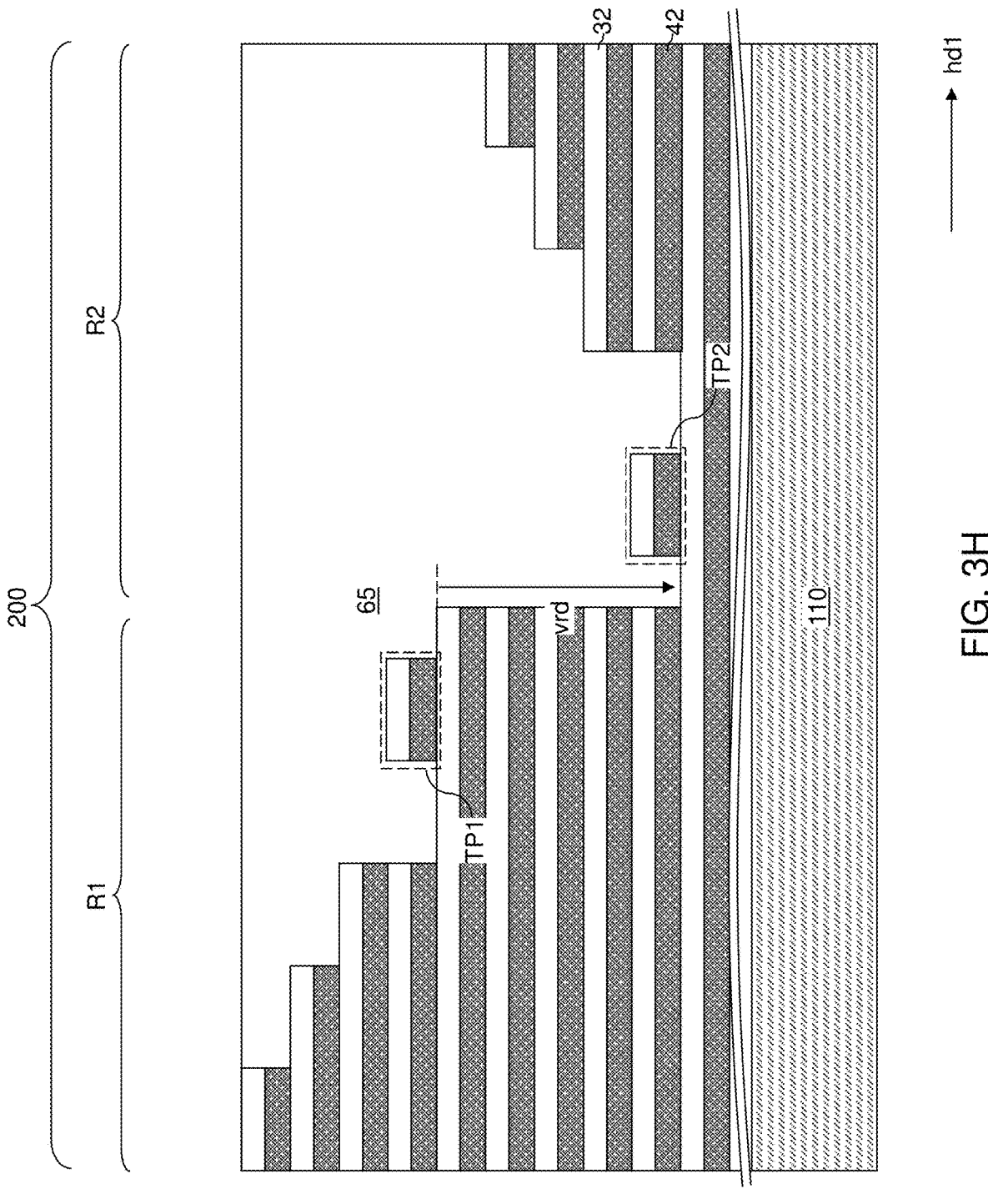

Referring FIG. 3H, a dielectric fill material, such as silicon oxide, can be deposited over the staircase structures. A planarization process, such as a chemical mechanical polishing process, can be performed to remove excess portions of the dielectric fill material from above a horizontal plane located at or above the topmost surface of remaining portions of the alternating stack (32, 42). It is noted that the topmost insulating layer 32T and the topmost sacrificial material layer 42 as formed at the processing steps of FIG. 2 may be completely removed during the processing steps of FIG. 3D, and the topmost surface of remaining portions of the alternating stack (32, 42) can be the topmost surface of a second-from-the-top insulating layer 32 as formed during the processing steps described with reference to FIG. 2.

FIGS. 4A-4G are sequential vertical cross-sectional views of a second configuration of the exemplary structure during formation of staircase structures and a retro-stepped dielectric material portion 65 according to a second embodiment of the present disclosure. In the second embodiment, the primary terrace patterns are located at the top of the respective staircase structures.

Figure 4A:
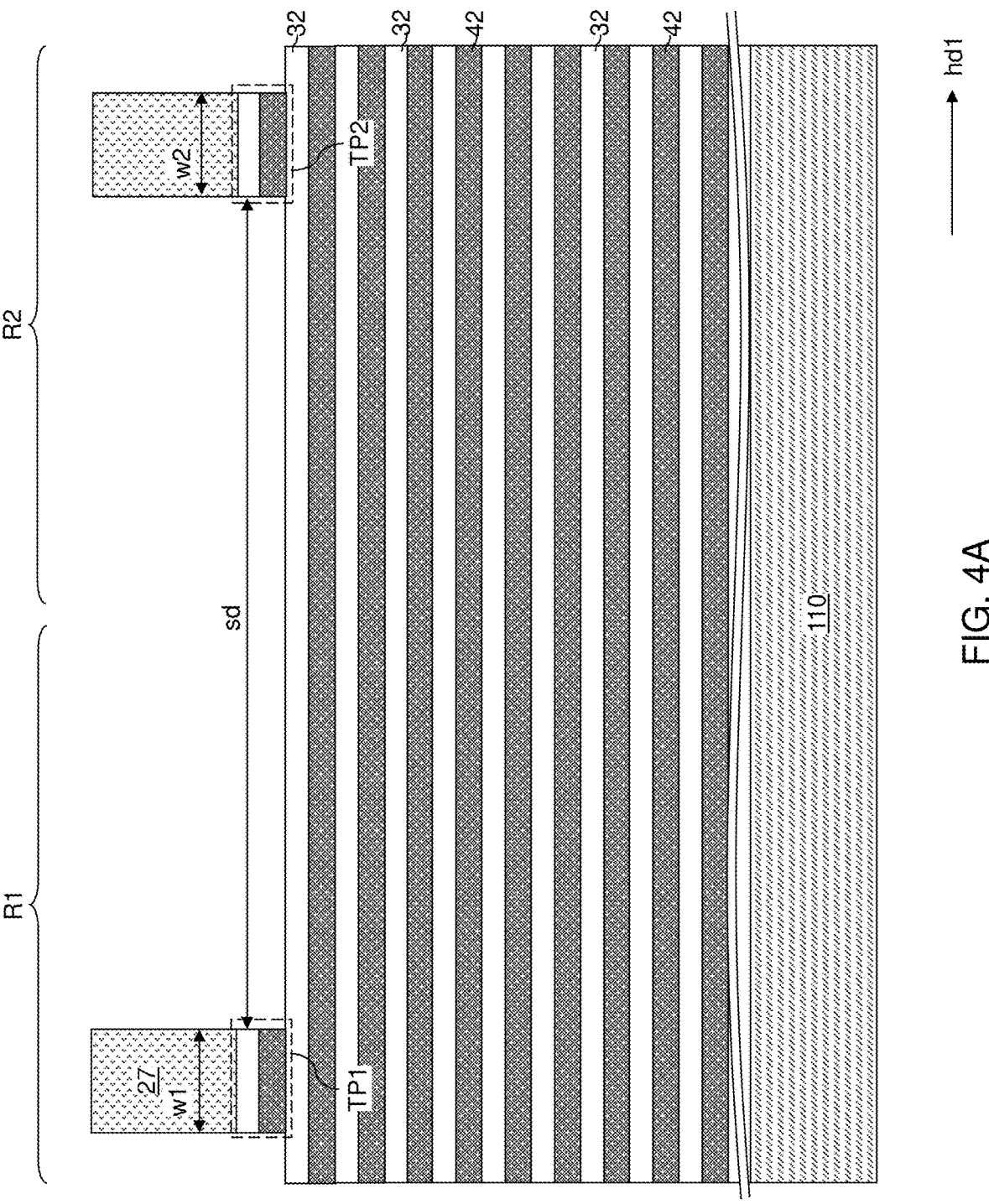
FIGS. 4A-4G are sequential vertical cross-sectional views of a second configuration of the exemplary structure during formation of staircase structures and a retro-stepped dielectric material portion according to a second embodiment of the present disclosure.

Referring to FIG. 4A, the second configuration of the exemplary structure can be derived from the first configuration of the exemplary structure by increasing the lateral gap between the primary terrace patterns (TP1, TP2). The separation distance sd may be an integer multiple of the length of horizontal surface segments to be subsequently formed. The primary terrace patterns (TP1, TP2) are formed at a top portion of the alternating stack (32, 42). The primary terrace patterns (TP1, TP2) comprise a first terrace pattern TP1 comprising a first top-level terrace and a second terrace pattern TP2 comprising a second top-level terrace. The first top-level terrace and the second top-level terrace are laterally spaced along a first horizontal direction hd1 by the separation distance sd, and are formed by patterning a pair of a topmost insulating layer 32 and a topmost spacer material layer (such as a topmost sacrificial material layer 42) within the alternating stack (32, 42).

Figure 4B:
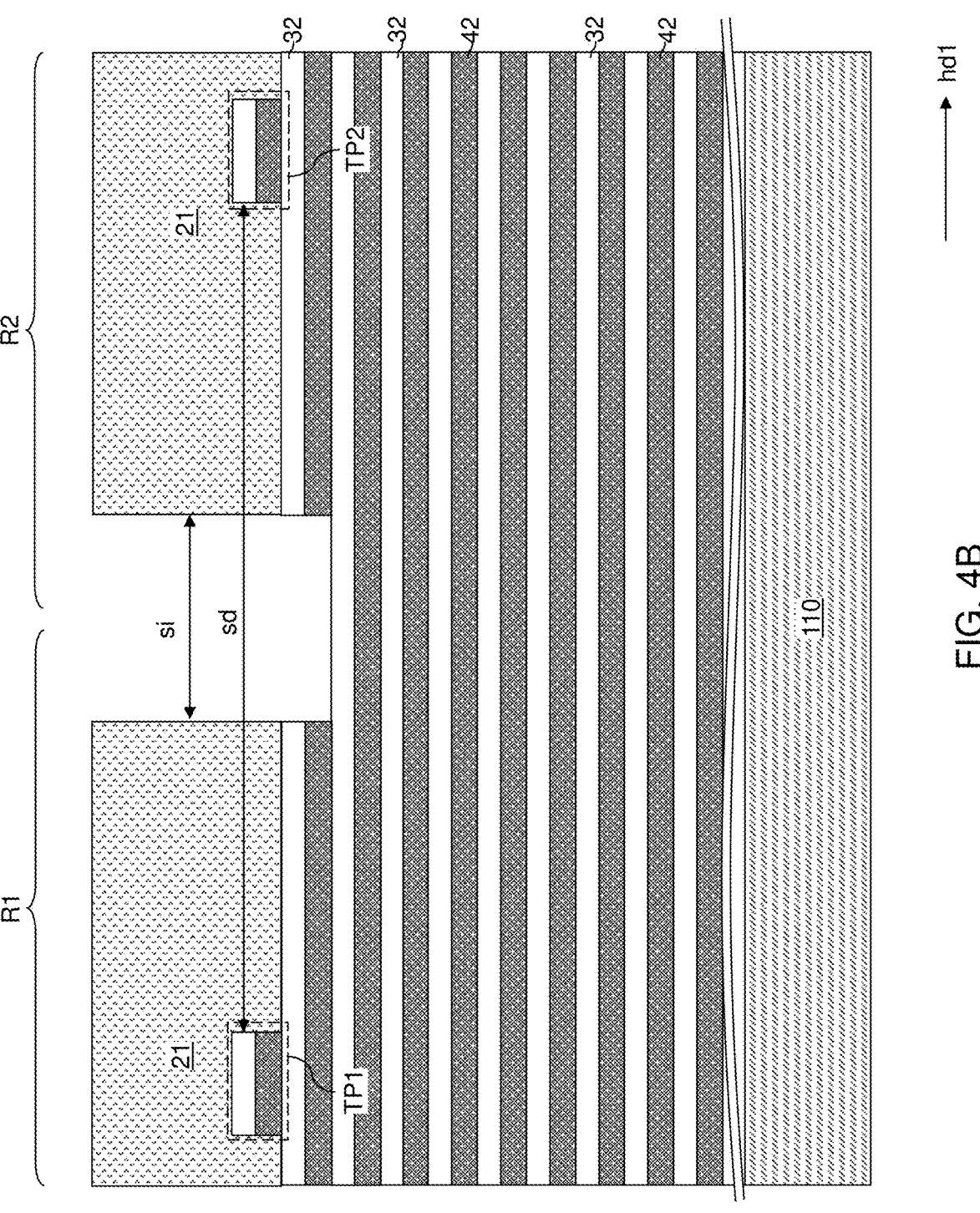

Referring to FIG. 4B, a patterned trimmable etch mask layer can be formed over the alternating stack (32, 42). The patterned trimmable etch mask layer comprises a photoresist material that can be isotropically recessed by slow ashing. The patterned trimmable etch mask layer can be lithographically patterned into trimmable etch mask patterns 21. In one embodiment, the patterned trimmable etch mask layer comprises two trimmable etch mask patterns 21 that are formed over the alternating stack (32, 42) in the first region R1 and in the second region R2. In one embodiment, the two trimmable etch mask patterns 21 comprise planar sidewalls that laterally extend along the second horizontal direction hd2 that is perpendicular to the first horizontal direction hd1, and are laterally spaced from each other along the first horizontal direction hd1 by an initial gap having a uniform spacing, which is herein referred to as an initial spacing si. In one embodiment, the initial spacing si is less than the separation distance sd between the first terrace pattern TP1 and the second terrace pattern TP2.

In one embodiment, each of the two trimmable etch mask patterns 21 of the patterned trimmable etch mask layer covers a respective one of the first terrace pattern TP1 and the second terrace pattern TP2 upon formation of the patterned trimmable etch mask layer. In one embodiment, the difference between the separation distance sd and the initial spacing si can be the same as the product of an even number and a first trimming distance to be subsequently employed during subsequent trimming processes.

Subsequently, additional terrace patterns can be formed in the alternating stack (32, 42) by performing iterations of a set of processing steps multiple times. Each iteration of the set of processing steps comprises a respective anisotropic etch process that etches unmasked portions of the alternating stack (32, 42) and a respective mask trimming process that isotropically trims the two trimmable etch mask patterns 21.

Specifically, a first anisotropic etch process can be performed to transfer the pattern of the openings in the patterned trimmable etch mask layer into the alternating stack (32, 42). The first anisotropic etch process is a processing step within the first iteration of the set of processing steps. The first anisotropic etch process may comprise a sequence of processing steps including an anisotropic etch step for etching an insulating layer 32 selective to an underlying sacrificial material layer 42, and an anisotropic etch step for etching a sacrificial material layer 42 selective to an underlying insulating layer 32.

Figure 4C:
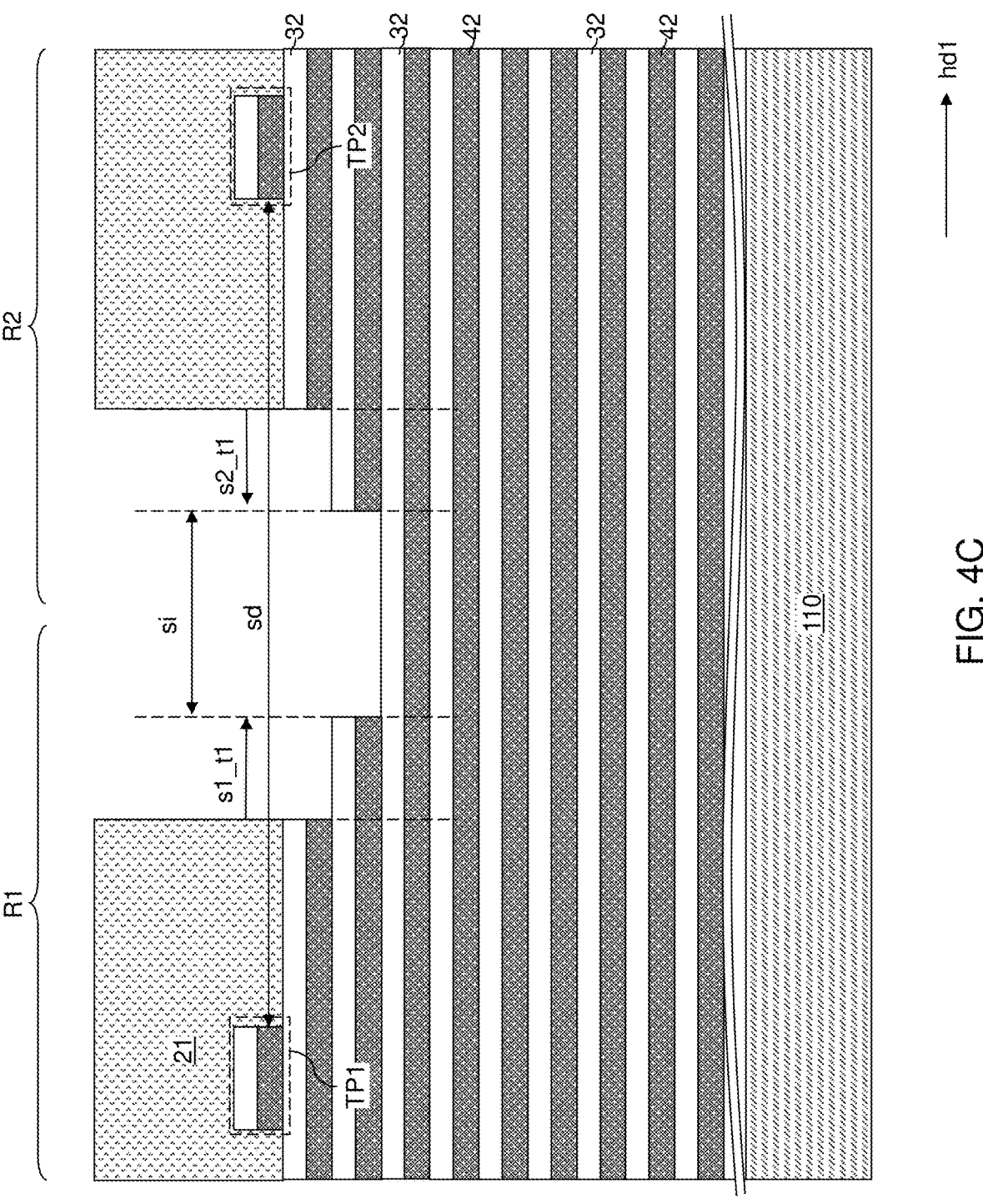

Referring to FIG. 4C, each trimmable etch mask pattern 21 within the patterned trimmable etch mask layer can be isotropically trimmed by performing a first mask trimming process, which is a processing step within the first iteration of the set of processing steps. The lateral trimming distance is herein referred to as a first isotropic trimming distance. In one embodiment, the first isotropic trimming distance may be 1/(2N) times the difference between the separation distance sd and the initial spacing si, in which N is an integer not less than 2. In the illustrated example, N may be 3.

In one embodiment, a dimensional metrology tool may be employed to measure the lateral trimming distance. In one embodiment, the dimensional metrology tool may identify two facing sidewalls of the two trimmable etch mask patterns 21, and two vertical steps of the alternating stack (32, 42) under the lateral gap between the two trimmable etch mask patterns 21. A first-staircase first trimming distance s1_t1 can be measured between the sidewall of the trimmable etch mask pattern 21 in the first region R1 and a vertical step of the alternating stack (32, 42) located in the first region R1 under the lateral gap. A second-staircase first trimming distance s2_t1 can be measured between the sidewall of the trimmable etch mask pattern 21 in the second region R2 and a vertical step of the alternating stack (32, 42) located in the second region R2 under the lateral gap.

In one embodiment, the first-staircase first trimming distance s1_t1 and the second-staircase first trimming distance s2_t1 may be 1/(2N) times the difference between the separation distance sd and the initial spacing si, in which N is an integer not less than 2. In the illustrated example, N may be 3.

If the distances measured by the metrology tool are within the desired distance ranges, then additional terrace patterns can be formed in the alternating stack (32, 42) by performing at least one iteration of a set of processing steps (e.g., anisotropic etching and photoresist trimming). In contrast, if the distances measured by the metrology tool are outside the desired distance ranges, then the two trimmable etch mask patterns 21 are removed, and a new photoresist layer is deposited and patterned into two new trimmable etch mask patterns 21. The above distances are again measured by the metrology tool to determine if they are within the desired distance ranges, and one of the above sets of steps (e.g., etching/trimming or new photoresist deposition/patterning) is performed depending on whether the distances measured by the metrology tool are within the desired distance ranges.

After the distances measured by the metrology tool are within the desired distance ranges, a second anisotropic etch process can be performed to transfer the pattern of the openings in the patterned trimmable etch mask layer into the alternating stack (32, 42). The second anisotropic etch process is a processing step within the second iteration of the set of processing steps. The second anisotropic etch process may comprise a sequence of processing steps including an anisotropic etch step for etching an insulating layer 32 selective to an underlying sacrificial material layer 42, and an anisotropic etch step for etching a sacrificial material layer 42 selective to an underlying insulating layer 32.

Figure 4D:
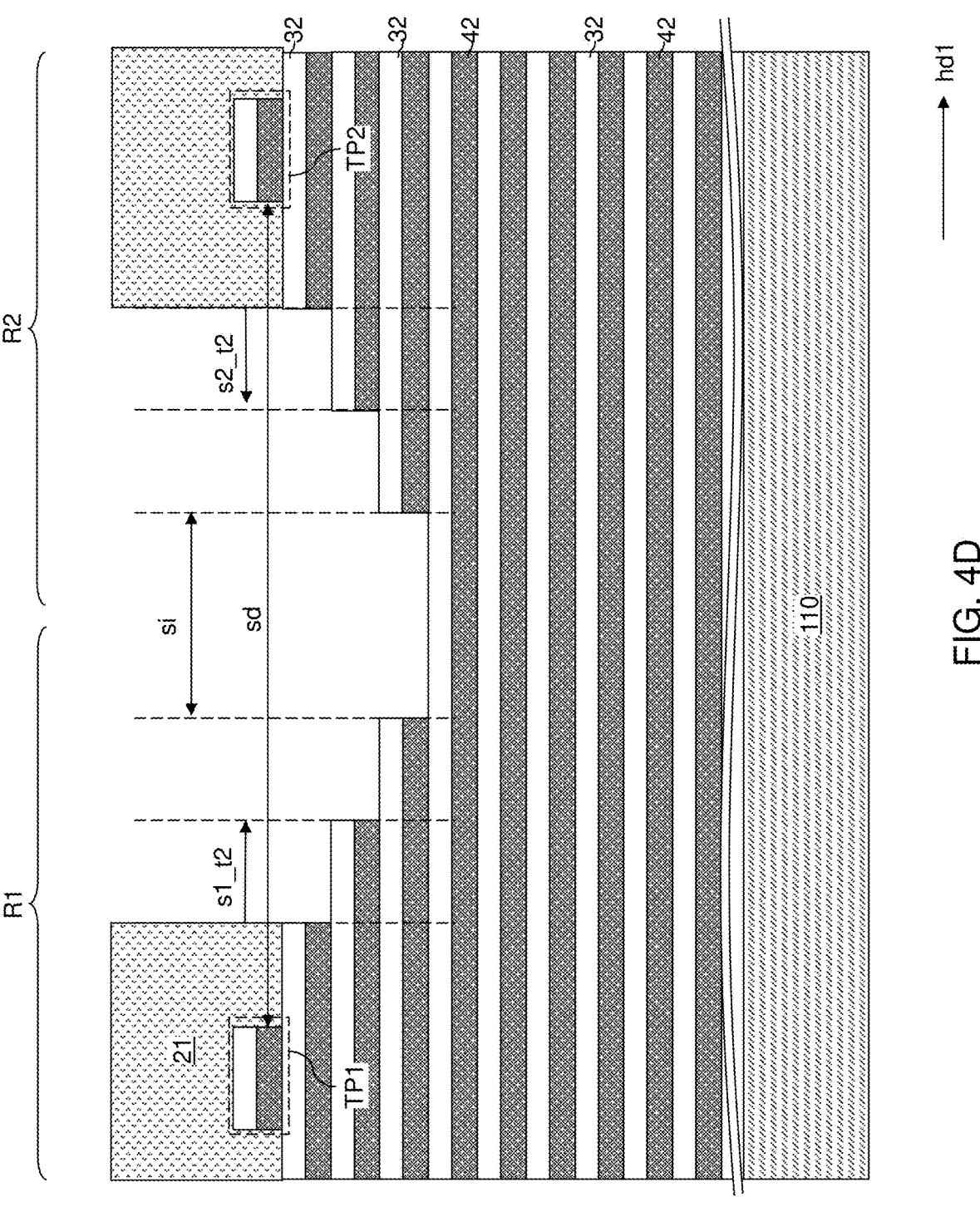

Referring to FIG. 4D, each trimmable etch mask pattern 21 within the patterned trimmable etch mask layer can be isotropically trimmed by performing a second mask trimming process, which is a processing step within the second iteration of the set of processing steps. The lateral trimming distance can be the same as the first isotropic trimming distance. As discussed above, the first isotropic trimming distance may be 1/(2N) times the difference between the separation distance sd and the initial spacing si, in which N is an integer not less than 2. In the illustrated example, N may be 3. The distances can be again measured by the metrology tool to determine if they are within the desired distance ranges.

Additional terrace patterns can be formed in the alternating stack (32, 42) by performing iterations of the set of processing steps multiple times. Each iteration of the set of processing steps comprises a respective anisotropic etch process that etches unmasked portions of the alternating stack (32, 42) and a respective mask trimming process that isotropically trims the two trimmable etch mask patterns 21. Optionally, a dimensional metrology tool may be employed to measure the lateral trimming distance after one or more of the mask trimming processes and/or the anisotropic etch processes. While an embodiment is described in which the set of processing steps is repeated twice, alternative embodiments are expressly contemplated herein in which the total number of iterations of the set of processing steps is 3 or more.

Generally, the two trimmable etch mask patterns 21 may be trimmed by a first isotropic trimming distance during each mask trimming process within a first subset of the iterations of the set of processing steps. The first isotropic trimming distance equals 1/(2N) times a difference between the separation distance sd and the initial spacing si, N being an integer not less than 2. In one embodiment, the first subset of the iterations of the set of processing steps equals the entirety of the iterations of the set of processing steps. Each of the primary terrace patterns (TP1, TP2) is covered by the two trimmable etch mask patterns 21 during each of the iterations of the set of processing steps. In one embodiment, a combination of the primary terrace patterns (TP1, TP2) and the additional terrace patterns has a bottommost horizontal surface within an area of the gap between the two trimmable etch mask patterns 21 during a measurement operation. In one embodiment, each of the primary terrace patterns (TP1, TP2) is covered by the two trimmable etch mask patterns 21 after a final iteration of the set of processing steps among the set of processing steps.

In one embodiment, the two trimmable etch mask patterns 21 are trimmed by a first isotropic trimming distance during each mask trimming process within the iterations of the set of processing steps. In one embodiment, upon performing a final mask trimming process within the iterations of the set of processing steps, a first lateral distance between the first terrace pattern TP1 and a proximal sidewall of a first one of the two trimmable etch mask patterns 21 equals the first isotropic trimming distance, and a second lateral distance between the second terrace pattern TP2 and a proximal sidewall of a first one of the two trimmable etch mask patterns 21 equals the first isotropic trimming distance.

A terminal anisotropic etch process can be performed to transfer the pattern of the openings in the patterned trimmable etch mask layer into the alternating stack (32, 42). The terminal anisotropic etch process may comprise a sequence of processing steps including an anisotropic etch step for etching an insulating layer 32 selective to an underlying sacrificial material layer 42, and an anisotropic etch step for etching a sacrificial material layer 42 selective to an underlying insulating layer 32.

In one embodiment, the two trimmable etch mask patterns 21 within the patterned trimmable etch mask layer may be trimmed by the first isotropic trimming distance during each mask trimming process within each of the iterations of the set of processing steps. In one embodiment, the first isotropic trimming distance equals $1/(2N)$ times a difference between the separation distance sd and the initial spacing si, N being an integer not less than 2.

In one embodiment, a dimensional metrology tool may be employed to measure the lateral trimming distance. In one embodiment, the dimensional metrology tool may identify two facing sidewalls of the two trimmable etch mask patterns 21, and a pair of vertical steps of the alternating stack (32, 42) that are proximal to the two trimmable etch mask patterns 21. A first-staircase second trimming distance $s1\_t2$ can be measured between the sidewall of the trimmable etch mask pattern 21 in the first region R1 and a proximal vertical step of the alternating stack (32, 42) located in the first region R1 under the lateral gap. A second-staircase second trimming distance $s2\_t2$ can be measured between the sidewall of the trimmable etch mask pattern 21 in the second region R2 and a proximal vertical step of the alternating stack (32, 42) located in the second region R2 under the lateral gap.

Figure 4E:
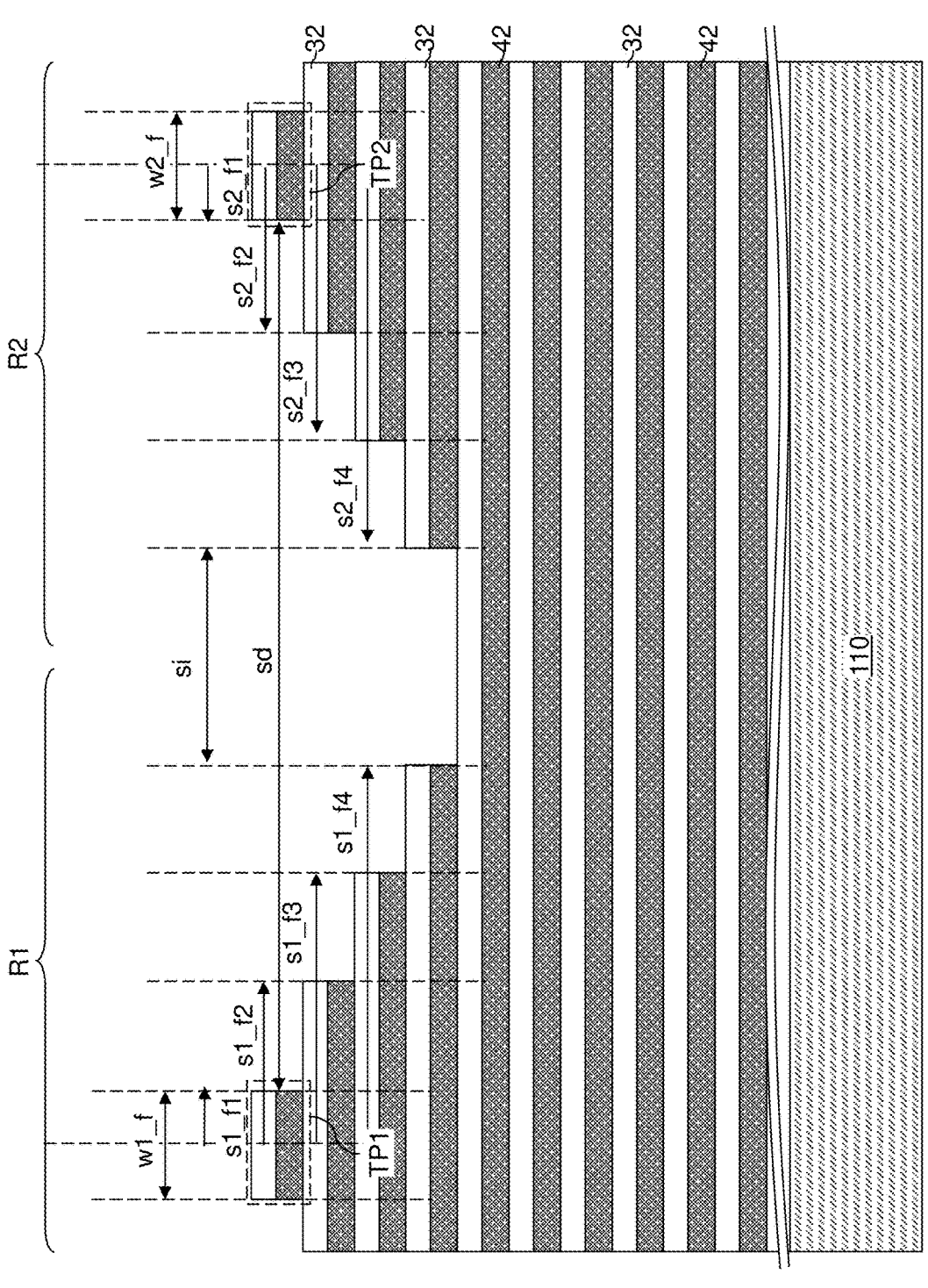

Referring to FIG. 4E, the patterned trimmable etch mask layer including the trimmable etch mask patterns 21 can be removed, for example, by ashing. A measurement operation can be performed, which measures locations of vertical steps of at least one of the additional terrace patterns relative to the primary terrace patterns (TP1, TP2) employing a dimensional metrology tool that identifies one of the primary terrace patterns (TP1, TP2) as a reference structure. In one embodiment, the dimensional metrology tool may measure a lateral distance along the first horizontal direction hd1 between a midpoint of two edges of each of the primary terrace patterns (TP1, TP2) and a selected vertical step among the vertical steps. The primary terrace patterns (TP1, TP2) are embodied as patterned portions of a combination of the topmost insulating layer 32 and the topmost spacer material layer (such as a topmost sacrificial material layer 42) within the alternating stack (32, 42) after removing the patterned trimmable etch mask layer.

The measurement operation may further measure locations of vertical steps of at least one of the additional terrace patterns relative to the primary terrace patterns (TP1, TP2) employing a dimensional metrology tool that identifies one of the primary terrace patterns (TP1, TP2) as a reference structure. In one embodiment, the dimensional metrology tool measures a lateral distance along the first horizontal direction hd1 between a midpoint of two edges for a selected primary terrace patterns (TP1, TP2) and a selected vertical step among the vertical steps within a same staircase structure.

The dimensional metrology tool may measure the lateral distance between the first reference line and an edge of the first terrace pattern TP1 that is proximal to the second terrace pattern TP2, which is the first-staircase first lateral distance $s1\_f1$. The dimensional metrology tool may measure the lateral distance between the first reference line and vertical steps in the first region R1, in the order of proximity to the first terrace pattern TP1, to provide a first-staircase second lateral distance $s1\_f2$, a first-staircase third lateral distance $s1\_f3$, a first-staircase fourth lateral distance $s2\_f4$, etc. Further, the dimensional metrology tool may measure the lateral distance between the second reference line and an edge of the second terrace pattern TP2 that is proximal to the first terrace pattern TP1, which is the second-staircase first lateral distance $s2\_f1$. The dimensional metrology tool may measure the lateral distance between the second reference line and vertical steps in the second region R1, in the order of proximity to the second terrace pattern TP2, to provide a second-staircase second lateral distance $s1\_f2$, a second-staircase third lateral distance $s1\_f3$, a second-staircase fourth lateral distance $s2\_f4$, etc.

A first staircase structure is formed in the first region R1, and a second staircase structure is formed in the second region R2. The first staircase structure comprises all terrace patterns in the first region R1, which comprise the first terrace pattern TP1 and a first subset of the additional terrace patterns that are formed during the processing steps described with reference to FIGS. 4A-4E. The second staircase structure comprises all terrace patterns in the second region R1, which comprise the second terrace pattern TP2 and a second subset of the additional terrace patterns that are formed during the processing steps described with reference to FIGS. 4A-4E.

In one embodiment, each horizontal surface segment located entirely in the first region R1 or located entirely in the second region R2 may have the same lateral extent that equals the first trimming distance. In one embodiment, the first region R1 may comprise K horizontal surface segments of the insulating layers 32 that are located at K different levels that are vertically spaced among one another. Generally, K is an integer greater than 2. In the illustrated example, the integer K is 5. In one embodiment, the horizontal surface segment extending across the first region R1 and the second region R2 may have a length that equals twice the lateral extent of other horizontal surface segments in the first region R1 and in the second region R2. The trimmable etch mask patterns 21 can be subsequently removed, for example, by ashing.

Figure 4F:
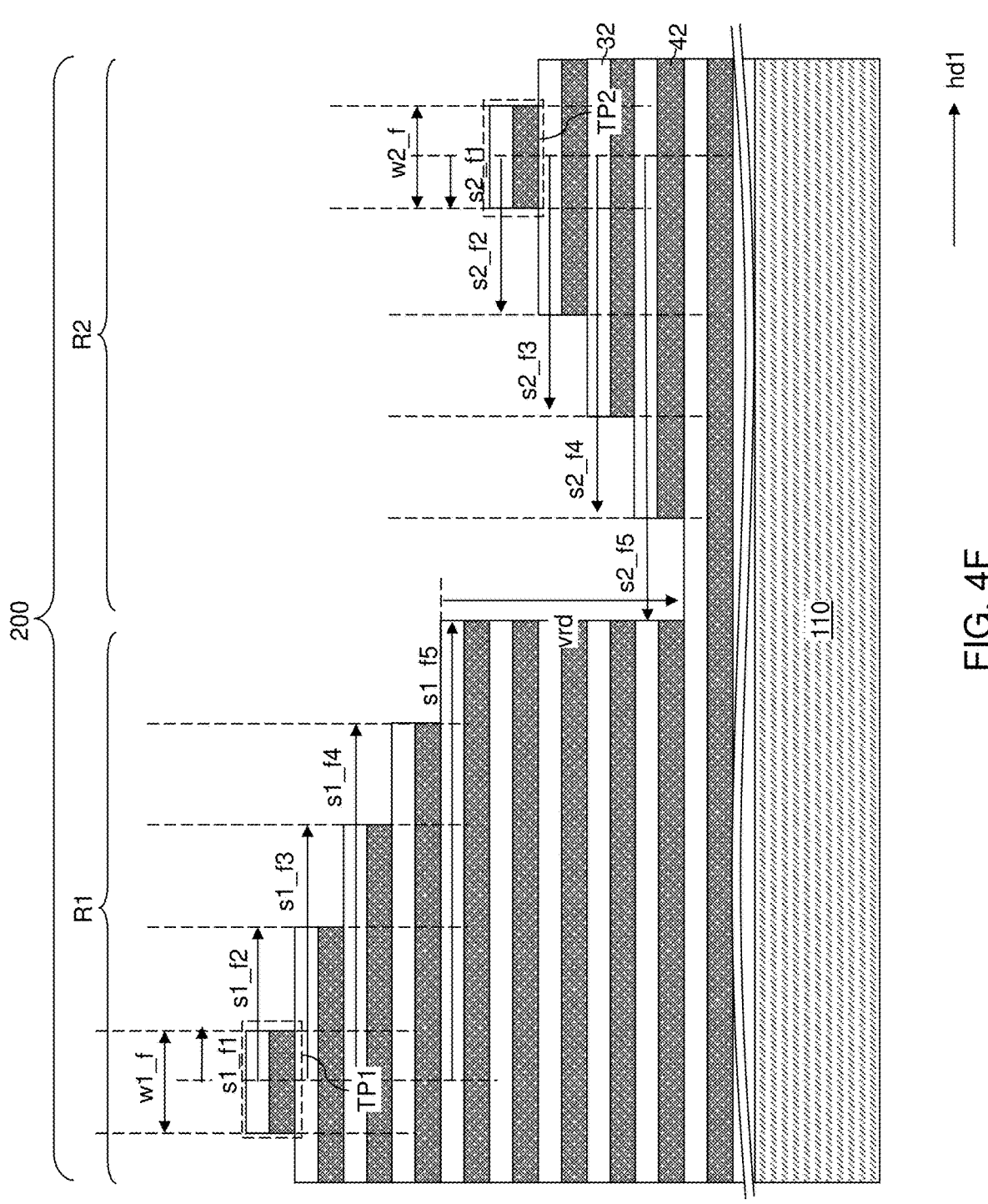

Referring to FIG. 4F, the various regions, such as the first region R1 and the second region R2, within the contact region 200 can be selectively vertically recessed such that staircase structures in the various regions can be vertically spaced from each other. For example, the various staircase structures in the various regions within the contact region 200 can be vertically spaced from each other by integer multiples of K times the sum of a thickness of an insulating layer 32 within the alternating stack (32, 42) and a thickness of a spacer material layer (such as sacrificial material layers 42) within the alternating stack (32, 42).

For example, the first region R1 of the alternating stack (32, 42) that includes the first terrace pattern TP1 and a first subset of the additional terrace patterns can be covered with a photoresist material portion (not shown) without covering the second region R2 of the alternating stack (32, 42) that includes the second terrace pattern TP2 and a second subset of the additional terrace patterns. The second region R2 of the alternating stack (32, 42) can be vertically recessed by a vertical recess distance vrd while the photoresist material portion covers the first region R1. In the illustrated example, the vertical recess distance vrd equals K times the sum of a thickness of an insulating layer 32 within the alternating stack (32, 42) and a thickness of a spacer material layer (such as sacrificial material layers 42) within the alternating stack (32, 42), in which K is the total number of levels of the horizontal surface segments within the first region R1. Generally, the vertical recess distance vrd may be an integer multiple of K times the sum of a thickness of an insulating layer 32 within the alternating stack (32, 42) and a thickness of a spacer material layer (such as sacrificial material layers 42) within the alternating stack (32, 42). A sidewall may be formed between each neighboring pair of staircase structures. Each sidewall may have a respective height that equals a respective vertical recess distance vrd that equals K times the sum of a thickness of an insulating layer 32 within the alternating stack (32, 42) and a thickness of a spacer material layer (such as sacrificial material layers 42) within the alternating stack (32, 42).

Optionally, a measurement operation described with reference to FIG. 3F may be performed in addition to or in lieu of the measurement operation described with reference to FIG. 3F.

Figure 4G:
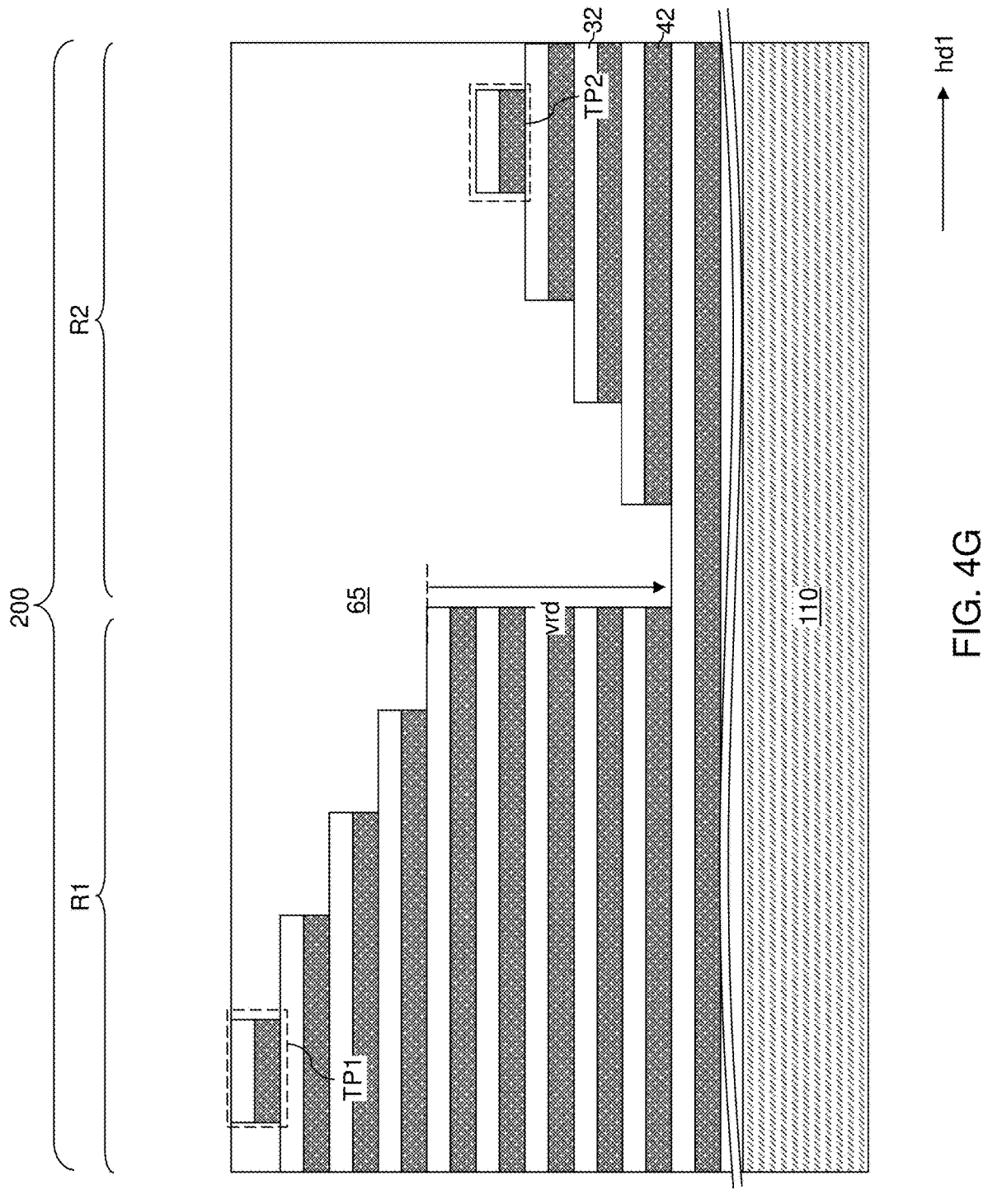

Referring FIG. 4G, a dielectric fill material, such as silicon oxide, can be deposited over the staircase structures. A planarization process such as a chemical mechanical polishing process can be performed to remove excess portions of the dielectric fill material from above a horizontal plane located at, or above, the topmost surface of remaining portions of the alternating stack (32, 42).

FIGS. 5A-5H are sequential vertical cross-sectional views of a third configuration of the exemplary structure during formation of staircase structures and a retro-stepped dielectric material portion 65 according to a third embodiment of the present disclosure. In this embodiment, the primary terrace patterns are formed in the middle of the respective staircase structures.

Figure 5A:
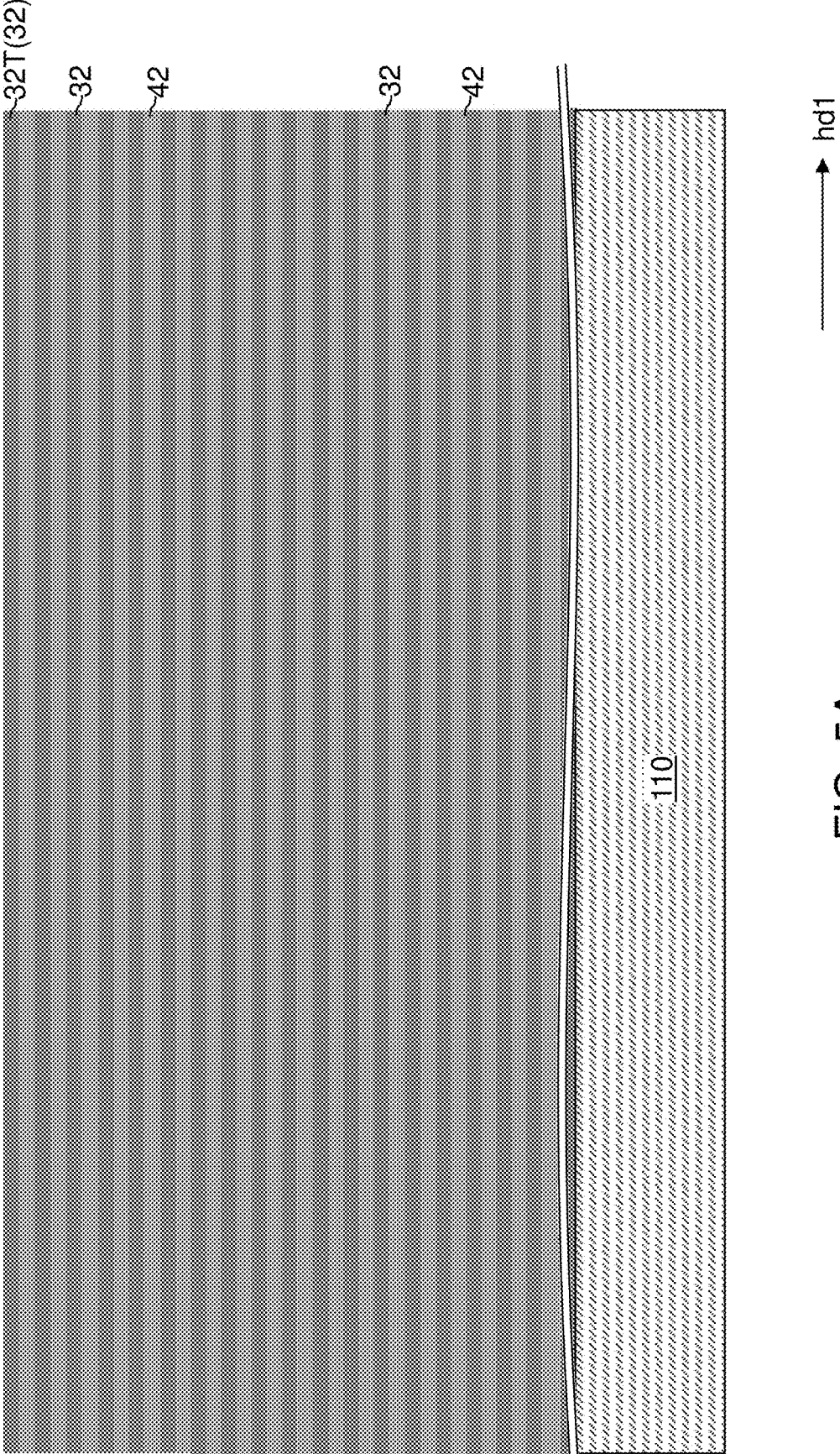
FIGS. 5A-5H are sequential vertical cross-sectional views of a third configuration of the exemplary structure during formation of staircase structures and a retro-stepped dielectric material portion according to a third embodiment of the present disclosure.

Referring to FIG. 5A, the third configuration of the exemplary structure can be the same as the first configuration of the exemplary structure illustrated in FIG. 3A.

Figure 5B:
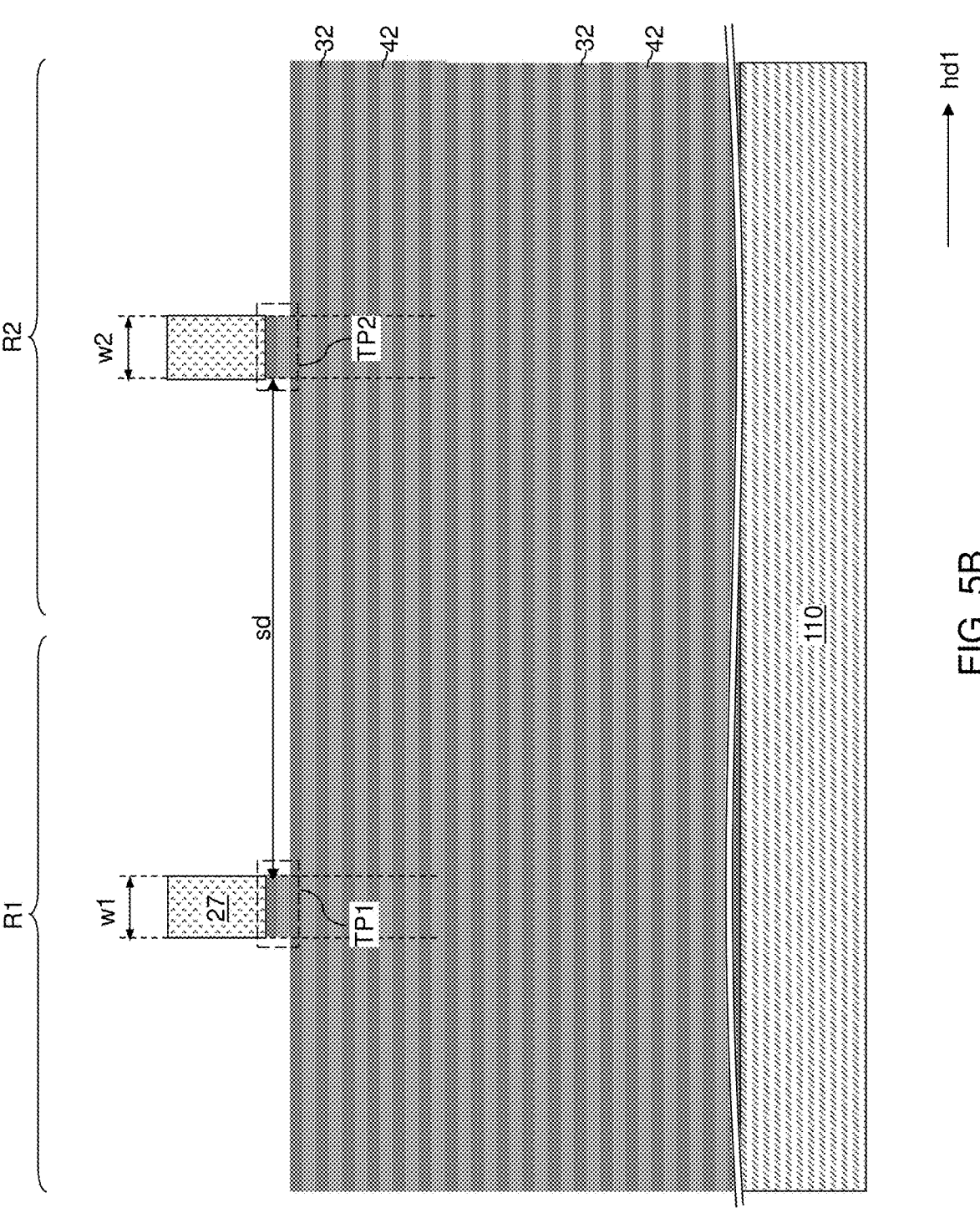

Referring to FIG. 5B, a photoresist layer 27 can be applied over the alternating stack (32, 42), and can be lithographically patterned into patterned photoresist material portions. The patterned photoresist material portions comprise pairs of photoresist material portions that are laterally spaced from each other along the first horizontal direction hd1 and laterally extending along the second horizontal direction hd2 with a uniform width. For example, the patterned photoresist material portions may comprise a first strip-shaped photoresist material portion that is formed in the first region R1 and a second strip-shaped photoresist material portion that is formed in the second region R2. Additional pairs of strip-shaped photoresist material portions (not illustrated) may be formed in additional regions (not illustrated) of the contact region 200.

The third configuration of the exemplary structure may be derived from the first configuration of the exemplary structure illustrated in FIG. 3B by modifying the pattern of the primary terrace patterns (TP1, TP2). Specifically, the primary terrace patterns (TP1, TP2) can be formed around midpoints within the first region R1 and the second region R2. The separation distance sd may be an integer multiple of the length of horizontal surface segments to be subsequently formed. The primary terrace patterns (TP1, TP2) are formed at a top portion of the alternating stack (32, 42). The primary terrace patterns (TP1, TP2) comprise a first terrace pattern TP1 comprising a first top-level terrace and a second terrace pattern TP2 comprising a second top-level terrace. The first top-level terrace and the second top-level terrace are laterally spaced along a first horizontal direction hd1 by the separation distance sd, and are formed by patterning a pair of a topmost insulating layer 32 and a topmost spacer material layer (such as a topmost sacrificial material layer 42) within the alternating stack (32, 42). The photoresist layer 27 can be subsequently removed, for example, by ashing.

Figure 5C:
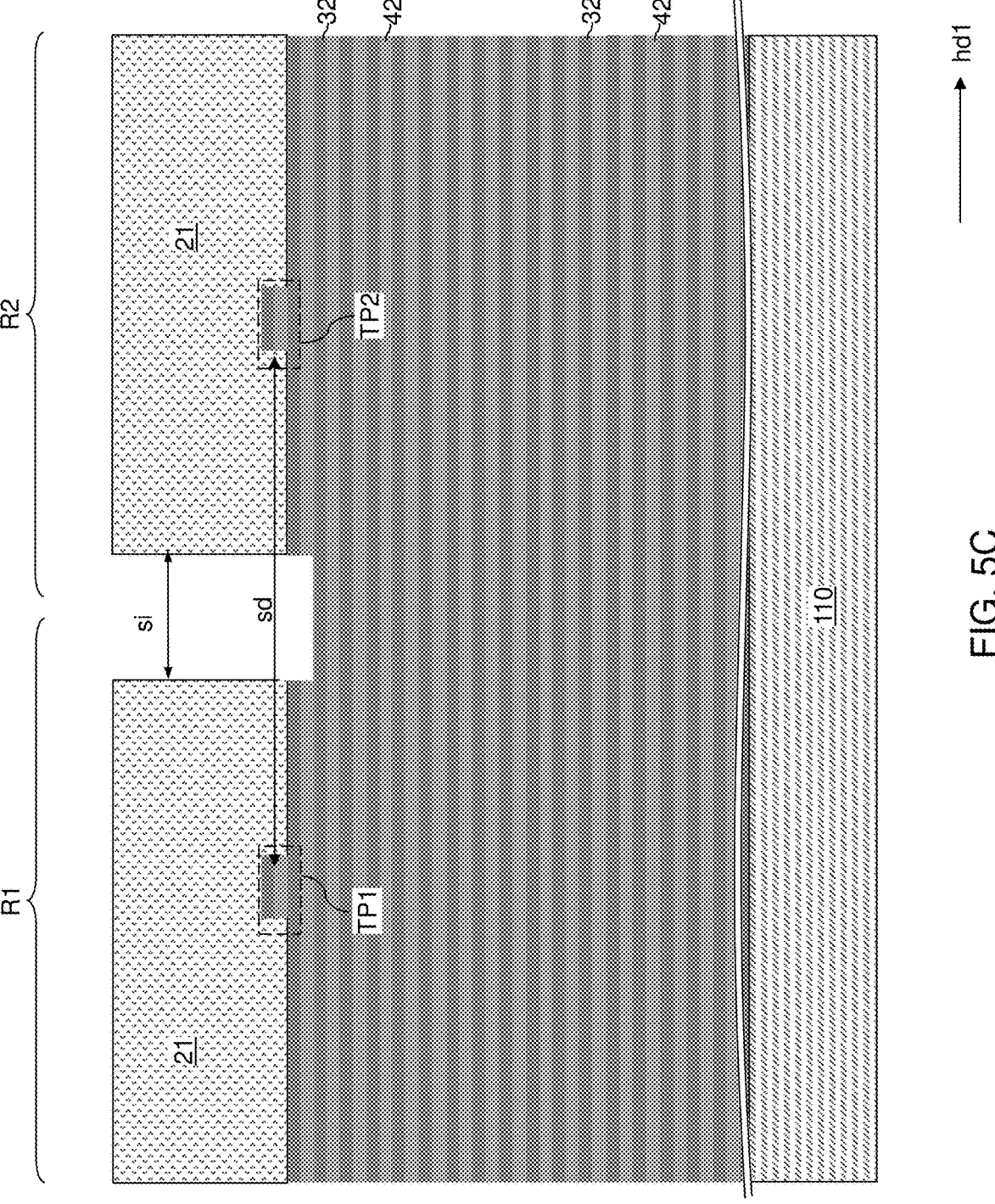

Referring to FIG. 5C, a patterned trimmable etch mask layer can be formed over the alternating stack (32, 42). The patterned trimmable etch mask layer comprises a photoresist material that can be isotropically recessed by slow ashing. The patterned trimmable etch mask layer can be lithographically patterned into trimmable etch mask patterns 21. In one embodiment, the patterned trimmable etch mask layer comprises two trimmable etch mask patterns 21 that are formed over the alternating stack (32, 42) in the first region R1 and in the second region R2. In one embodiment, the two trimmable etch mask patterns 21 comprise planar sidewalls that laterally extend along the second horizontal direction hd2 that is perpendicular to the first horizontal direction hd1, and are laterally spaced from each other along the first horizontal direction hd1 by an initial gap having a uniform spacing, which is herein referred to as an initial spacing si. In one embodiment, the initial spacing si is less than the separation distance sd between the first terrace pattern TP1 and the second terrace pattern TP2.

In one embodiment, each of the two trimmable etch mask patterns 21 of the patterned trimmable etch mask layer covers a respective one of the first terrace pattern TP1 and the second terrace pattern TP2 upon formation of the patterned trimmable etch mask layer. In one embodiment, the difference between the separation distance sd and the initial spacing si can be the same as the product of an even number and a first trimming distance to be subsequently employed during subsequent trimming processes.

Subsequently, additional terrace patterns can be formed in the alternating stack (32, 42) by performing iterations of a set of processing steps multiple times. Each iteration of the set of processing steps comprises a respective anisotropic etch process that etches unmasked portions of the alternating stack (32, 42) and a respective mask trimming process that isotropically trims the two trimmable etch mask patterns 21.

Specifically, a first anisotropic etch process can be performed to transfer the pattern of the openings in the patterned trimmable etch mask layer into the alternating stack (32, 42). The first anisotropic etch process is a processing step within the first iteration of the set of processing steps. The first anisotropic etch process may comprise a sequence of processing steps including an anisotropic etch step for etching an insulating layer 32 selective to an underlying sacrificial material layer 42, and an anisotropic etch step for etching a sacrificial material layer 42 selective to an underlying insulating layer 32.

Figure 5D:
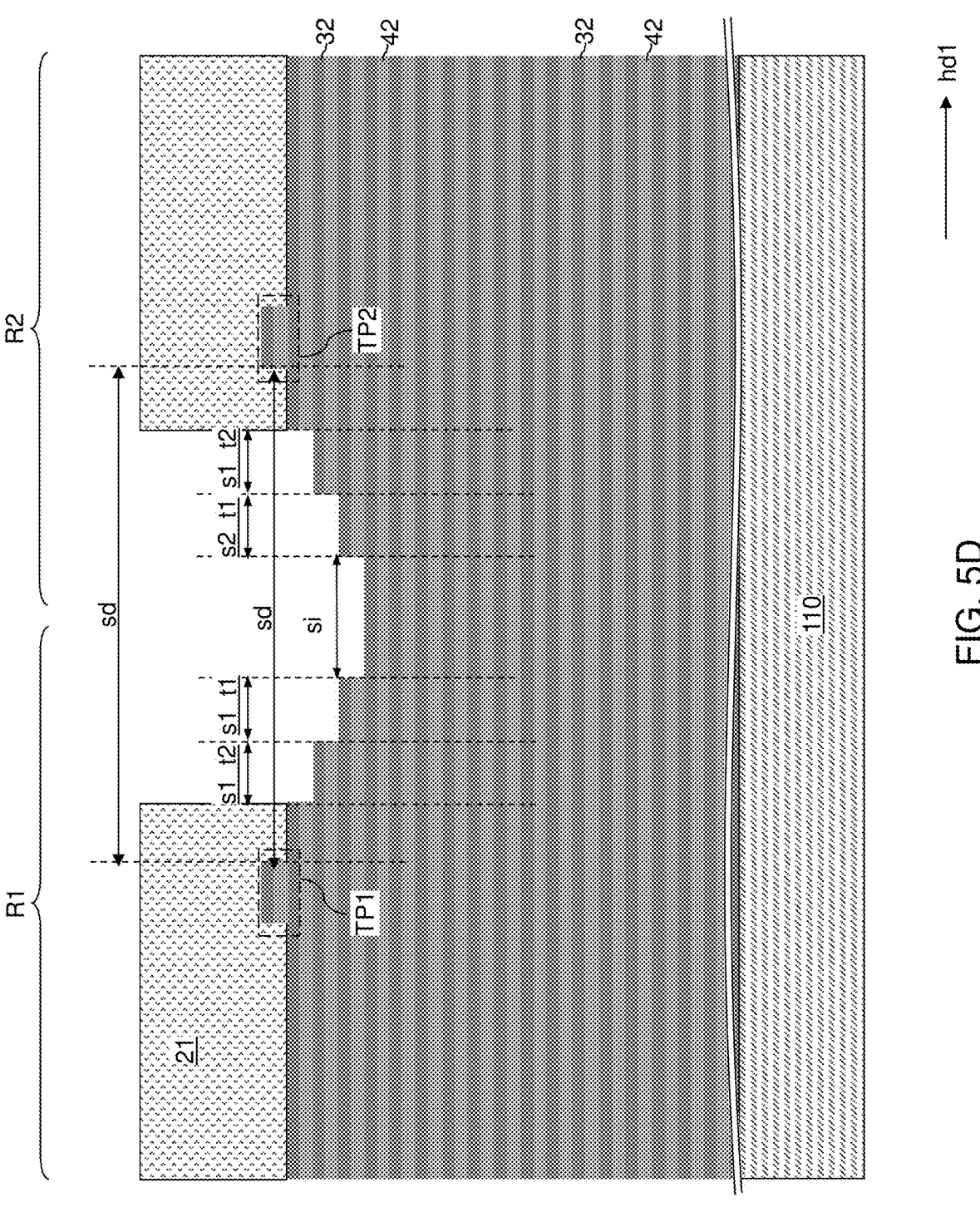

Referring to FIG. 5D, each trimmable etch mask pattern 21 within the patterned trimmable etch mask layer can be isotropically trimmed by performing a first mask trimming process, which is a processing step within the first iteration of the set of processing steps. The lateral trimming distance is herein referred to as a first isotropic trimming distance. In one embodiment, the first isotropic trimming distance may be 1/(2N) times the difference between the separation distance sd and the initial spacing si, in which N is an integer not less than 2. In the illustrated example, N may be 3.

In one embodiment, a dimensional metrology tool may be employed to measure the lateral trimming distance of the trimmable etch mask pattern 21. If the distances measured by the metrology tool are within the desired distance ranges, then additional terrace patterns can be formed in the alternating stack (32, 42) by performing a second anisotropic etch process to transfer the pattern of the openings in the patterned trimmable etch mask layer into the alternating stack (32, 42), followed by a second trimming of the trimmable etch mask patterns 21. The second anisotropic etch process is a processing step within the second iteration of the set of processing steps. The second anisotropic etch process may comprise a sequence of processing steps including an anisotropic etch step for etching an insulating layer 32 selective to an underlying sacrificial material layer 42, and an anisotropic etch step for etching a sacrificial material layer 42 selective to an underlying insulating layer 32.

If the distances measured by the metrology tool are outside the desired distance ranges, then the two trimmable etch mask patterns 21 are removed, and a new photoresist layer is deposited and patterned into two new trimmable etch mask patterns 21. The above distances are again measured by the metrology tool to determine if they are within the desired distance ranges, and one of the above sets of steps (e.g., etching/trimming or new photoresist deposition/patterning.

Each trimmable etch mask pattern 21 within the patterned trimmable etch mask layer can be isotropically trimmed by performing a second mask trimming process, which is a processing step within the second iteration of the set of processing steps. The lateral trimming distance can be the same as the first isotropic trimming distance. As discussed above, the first isotropic trimming distance may be $1/(2N)$ times the difference between the separation distance sd and the initial spacing si, in which N is an integer not less than 2. In the illustrated example, N may be 3.

Additional terrace patterns can be formed in the alternating stack (32, 42) by performing iterations of the set of processing steps multiple times. In one embodiment, the two trimmable etch mask patterns 21 are trimmed by a first isotropic trimming distance during each mask trimming process within a first subset of the iterations of the set of processing steps, and the first isotropic trimming distance equals $1/(2N)$ times a difference between the separation distance sd and the initial spacing si, N being an integer not less than 2. The first subset of the iterations of the set of processing steps may be continued until each trimmable etch mask pattern 21 has a sidewall that is laterally offset from a proximal one of the primary terrace patterns (TP1, TP2) by an offset distance that equals the first isotropic trimming distance. Optionally, a dimensional metrology tool may be employed to measure the lateral trimming distance after one or more of the mask trimming processes and/or the anisotropic etch processes.

In one embodiment, a dimensional metrology tool may be employed to measure the lateral trimming distances. In one embodiment, the dimensional metrology tool may identify two facing sidewalls of the two trimmable etch mask patterns 21, and vertical steps of the alternating stack (32, 42) under the lateral gap between the two trimmable etch mask patterns 21. Various trimming distances can be measured, which may comprise a first-staircase first trimming distance s1_t1 in the first region R1 and a second-staircase first trimming distance s2_t1 in the second region R2, a first-staircase second trimming distance s1_t2 in the first region R1 and a second-staircase second trimming distance s2_t2 in the second region R2, etc. In one embodiment, each trimming distance may be $1/(2N)$ times the difference between the separation distance sd and the initial spacing si, in which N is an integer not less than 2. In the illustrated example, N may be 3.

Figure 5E:
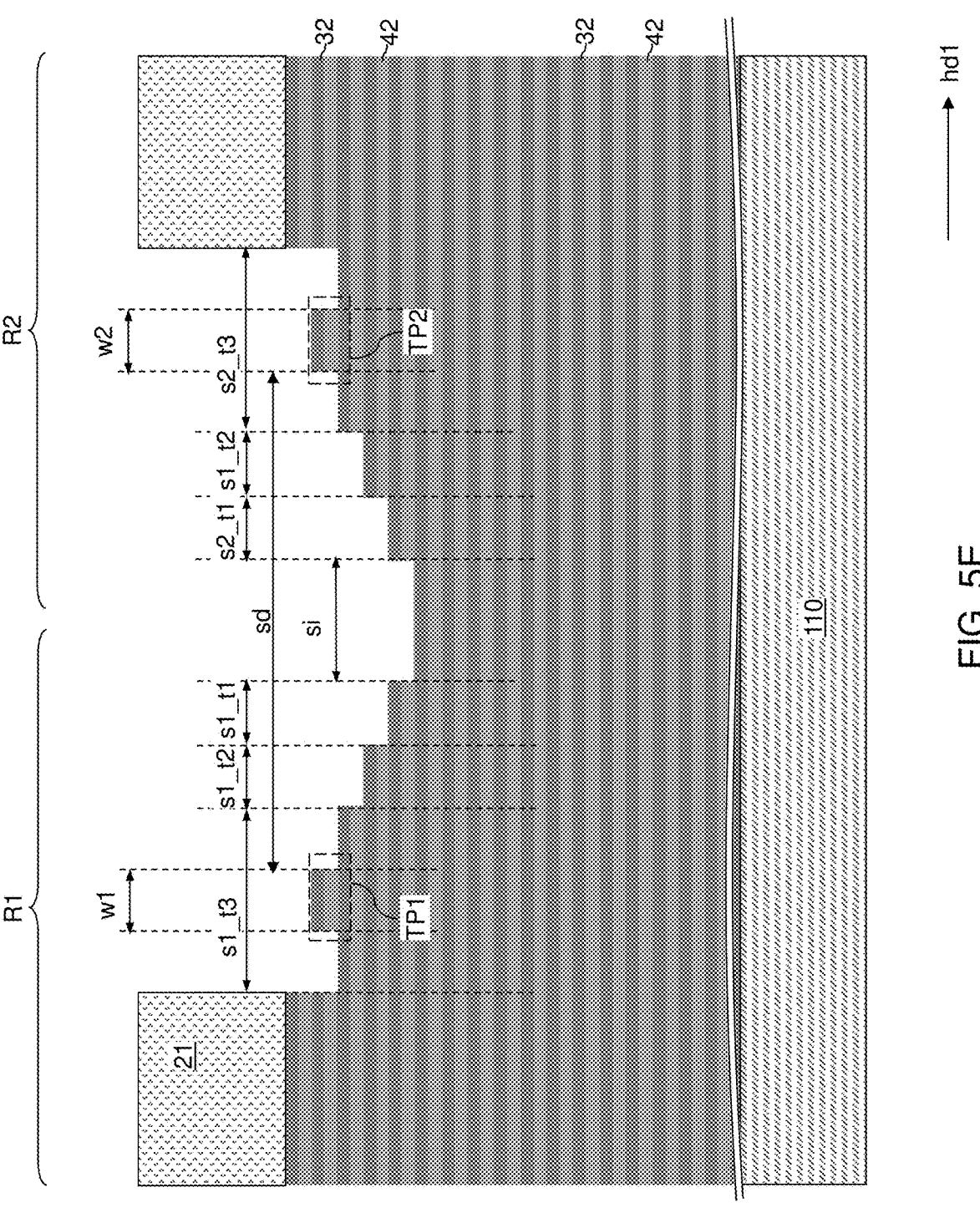

Referring to FIG. 5E, an intermediate iteration of the set of processing steps after performing the first subset of the iterations. The intermediate iteration is the earliest one of the iterations of the set of processing steps that is performed after the first subset of the iterations. During the intermediate iteration, the two trimmable etch mask patterns 21 are trimmed by a second isotropic trimming distance. According to an aspect of the present disclosure, the second isotropic trimming distance equals $3/(2N)$ times the difference between the separation distance sd and the initial spacing si.

In one embodiment, a measurement operation can be performed after the intermediate iteration of the set of processing steps to measure various trimming distances, which may comprise a first-staircase first trimming distance s1_t1 in the first region R1 and a second-staircase first trimming distance s2_t1 in the second region R2, a first-staircase second trimming distance s1_t2 in the first region R1 and a second-staircase second trimming distance s2_t2 in the second region R2, a first-staircase third trimming distance s1_t3 in the first region R1 and a second-staircase third trimming distance s2_t3 in the second region R2, etc. In one embodiment, the first width w1, the second width w2, the first-staircase first trimming distance s1_t1 in the first region R1, the second-staircase first trimming distance s2_t1 in the second region R2, the first-staircase second trimming distance s1_t2 in the first region R1, the second-staircase second trimming distance s2_t2 in the second region R2 may be the same as the first trimming distance; the first-staircase third trimming distance s1_t3 in the first region R1 and the second-staircase third trimming distance s2_t3 in the second region R2 may be three times the first trimming distance, and the initial spacing si may be twice the first trimming distance.

Figure 5F:
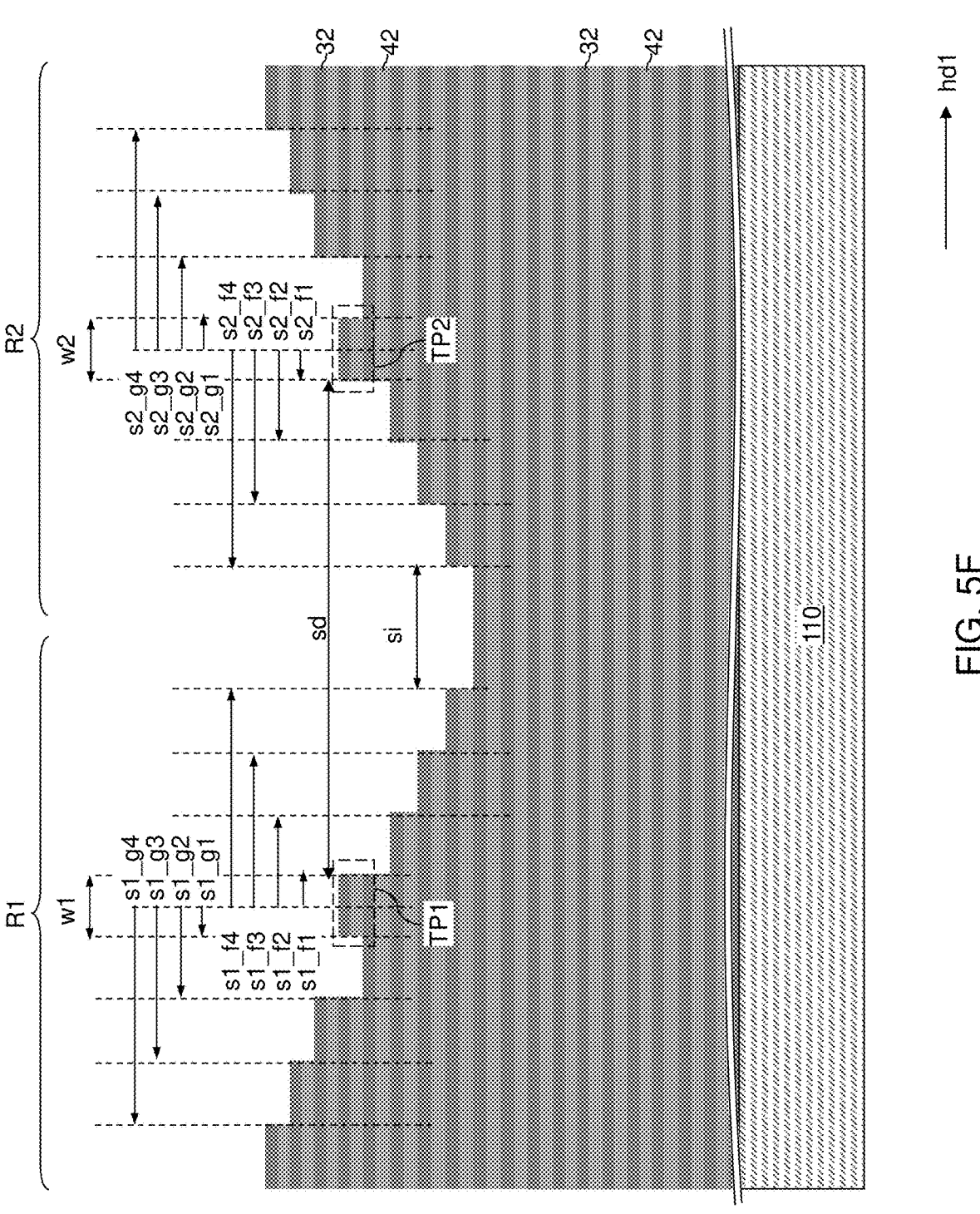

Referring to FIG. 5F, a second subset of the iterations of the set of processing steps can be subsequently performed. The two trimmable etch mask patterns 21 are trimmed by the first isotropic trimming distance during each mask trimming process within a second subset of the iterations of the set of processing steps.

The patterned trimmable etch mask layer including the trimmable etch mask patterns 21 can be removed, for example, by ashing. A measurement operation can be performed, which measures locations of vertical steps of at least one of the additional terrace patterns relative to the primary terrace patterns (TP1, TP2) employing a dimensional metrology tool that identifies one of the primary terrace patterns (TP1, TP2) as a reference structure. In one embodiment, the dimensional metrology tool may measure a lateral distance along the first horizontal direction hd1 between a midpoint of two edges of each of the primary terrace patterns (TP1, TP2) and a selected vertical step among the vertical steps. The primary terrace patterns (TP1, TP2) are embodied as patterned portions of a combination of an insulating layer 32 and a spacer material layer (such as a sacrificial material layer 42) within the alternating stack (32, 42) after removing the patterned trimmable etch mask layer. The primary terrace patterns (TP1, TP2) are formed below the levels of the topmost insulating layer 32 and the topmost spacer material layer.

The measurement operation may further measure locations of vertical steps of at least one of the additional terrace patterns relative to the primary terrace patterns (TP1, TP2) employing a dimensional metrology tool that identifies one of the primary terrace patterns (TP1, TP2) as a reference structure. In one embodiment, the dimensional metrology tool measures a lateral distance along the first horizontal direction hd1 between a midpoint of two edges for a selected primary terrace patterns (TP1, TP2) and a selected vertical step among the vertical steps within a same staircase structure.

The dimensional metrology tool may measure the lateral distance between the first reference line and an edge of the first terrace pattern TP1 that is proximal to the second terrace pattern TP2, which is the first-staircase first lateral distance s1_f1. The dimensional metrology tool may measure the lateral distance between the first reference line and vertical steps in the first region R1, in the order of proximity to the first terrace pattern TP1 and moving toward the second terrace pattern TP2, to provide a first-staircase second lateral distance s1_f2, a first-staircase third lateral distance s1_f3, a first-staircase fourth lateral distance s1_f4, etc. The dimensional metrology tool may additionally measure the lateral distance between the first reference line and vertical steps in the first region R1, in the order of an increasing distance from the second terrace pattern TP2 and moving away the second terrace pattern TP2, to provide a first-staircase receding lateral receding lateral distance s1_g1, a first-staircase second receding lateral distance s1_g2, a first-staircase third receding lateral distance s1_g3, a first-staircase fourth receding lateral distance s1_g4, etc.

Further, the dimensional metrology tool may measure the lateral distance between the second reference line and vertical steps in the second region R2, in the order of proximity to the second terrace pattern TP2 and moving toward the first terrace pattern TP1, to provide a second-staircase second lateral distance s2_f2, a second-staircase third lateral distance s2_f3, a second-staircase fourth lateral distance s2_f4, etc. The dimensional metrology tool may additionally measure the lateral distance between the second reference line and vertical steps in the second region R2, in the order of an increasing distance from the first terrace pattern TP1 and moving away the second terrace pattern TP2, to provide a second-staircase receding lateral receding lateral distance s2_g1, a second-staircase second receding lateral distance s2_g2, a second-staircase third receding lateral distance s2_g3, a second-staircase fourth receding lateral distance s2_g4, etc.

Generally, the measurement operation may be performed after performing the second subset of the iterations. The measurement operation may measure locations of a first subset of the vertical steps that is formed prior to the intermediate iterations of the set of processing steps, and may measure location of a second subset of the vertical steps that is formed after the intermediate iterations of the set of processing steps.

A first staircase structure is formed in the first region R1, and a second staircase structure is formed in the second region R2. The first staircase structure comprises all terrace patterns in the first region R1, which comprise the first terrace pattern TP1 and a first subset of the additional terrace patterns that are formed during the processing steps described with reference to FIGS. 5B-5F. The second staircase structure comprises all terrace patterns in the second region R1, which comprise the second terrace pattern TP2 and a second subset of the additional terrace patterns that are formed during the processing steps described with reference to FIGS. 5B-5F.

In one embodiment, each horizontal surface segment located entirely in the first region R1 or located entirely in the second region R2 may have the same lateral extent that equals the first trimming distance. In one embodiment, the first region R1 may comprise K horizontal surface segments of the insulating layers 32 that are located at K different levels that are vertically spaced among one another. Generally, K is an integer greater than 2. In the illustrated example, the integer K is 9. In one embodiment, the horizontal surface segment extending across the first region R1 and the second region R2 may have a length that equals twice the lateral extent of other horizontal surface segments in the first region R1 and in the second region R2. The trimmable etch mask patterns 21 can be subsequently removed, for example, by ashing.

Figure 5G:
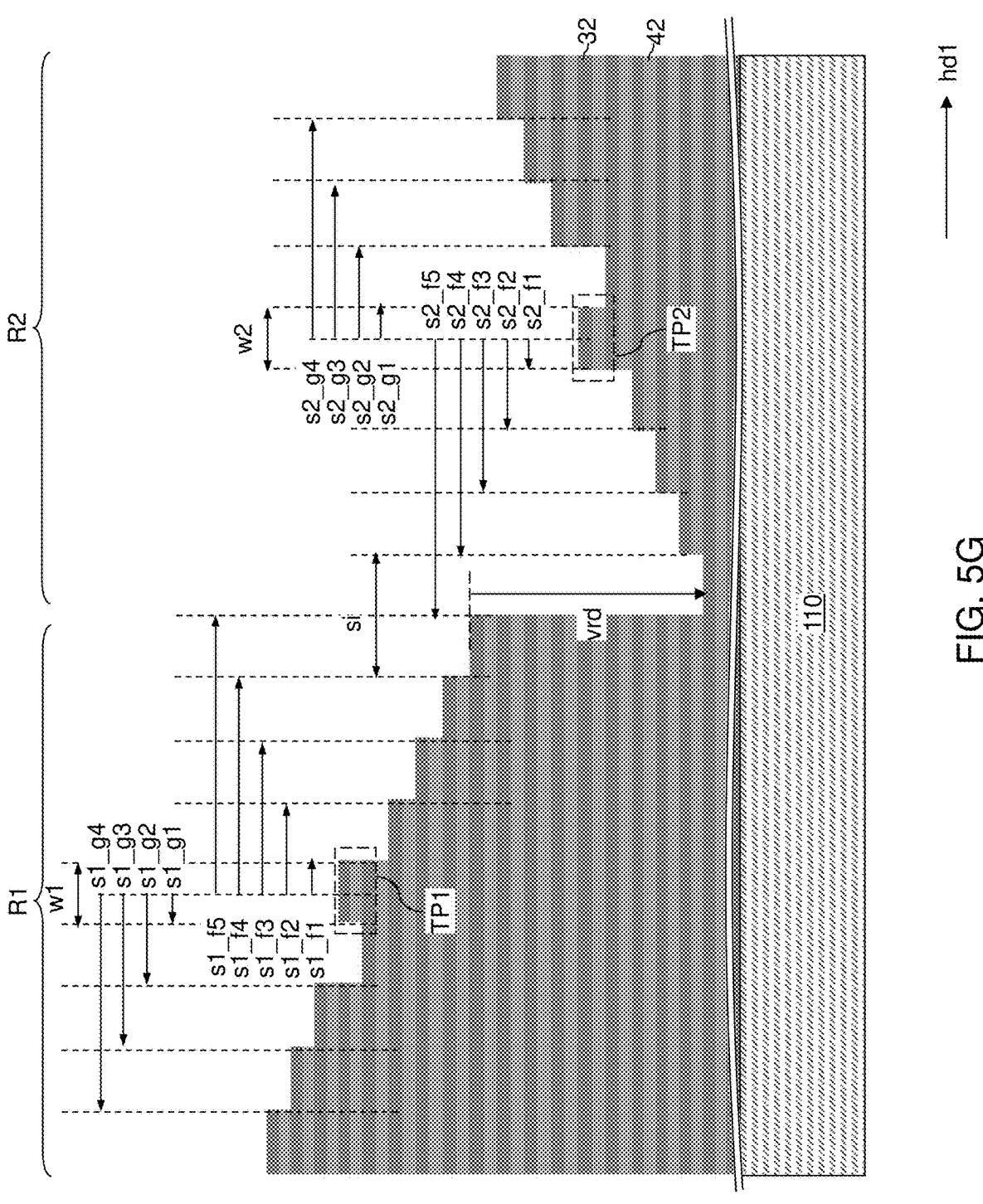

Referring to FIG. 5G, the various regions, such as the first region R1 and the second region R2, within the contact region 200 can be selectively vertically recessed such that staircase structures in the various regions can be vertically spaced among one another. For example, the various staircase structures in the various regions within the contact region 200 can be vertically spaced among one another by integer multiples of K times the sum of a thickness of an insulating layer 32 within the alternating stack (32, 42) and a thickness of a spacer material layer (such as sacrificial material layers 42) within the alternating stack (32, 42).

For example, the first region R1 of the alternating stack (32, 42) that includes the first terrace pattern TP1 and a first subset of the additional terrace patterns can be covered with a photoresist material portion (not shown) without covering the second region R2 of the alternating stack (32, 42) that includes the second terrace pattern TP2 and a second subset of the additional terrace patterns. The second region R2 of the alternating stack (32, 42) can be vertically recessed by a vertical recess distance vrd while the photoresist material portion covers the first region R1. In the illustrated example, the vertical recess distance vrd equals K times the sum of a thickness of an insulating layer 32 within the alternating stack (32, 42) and a thickness of a spacer material layer (such as sacrificial material layers 42) within the alternating stack (32, 42), in which K is the total number of levels of the horizontal surface segments within the first region R1. Generally, the vertical recess distance vrd may be an integer multiple of K times the sum of a thickness of an insulating layer 32 within the alternating stack (32, 42) and a thickness of a spacer material layer (such as sacrificial material layers 42) within the alternating stack (32, 42). A sidewall having a height of a respective vertical recess distance vrd may be formed between each neighboring pair of staircase structures.

Optionally, a measurement operation described with reference to FIG. 3F may be performed in addition to or in lieu of the measurement operation described with reference to FIG. 5F. In this case, a first-staircase fifth lateral distance s1_f4 can be measured from the first region R1, and a second-staircase fifth lateral distance s1_f4 can be measured from the second region R2. In one embodiment, each horizontal surface segment in the first region R1 and in the second region R2 may have a respective length along the first horizontal direction hd2 that equals the first trimming distance.

Figure 5H:
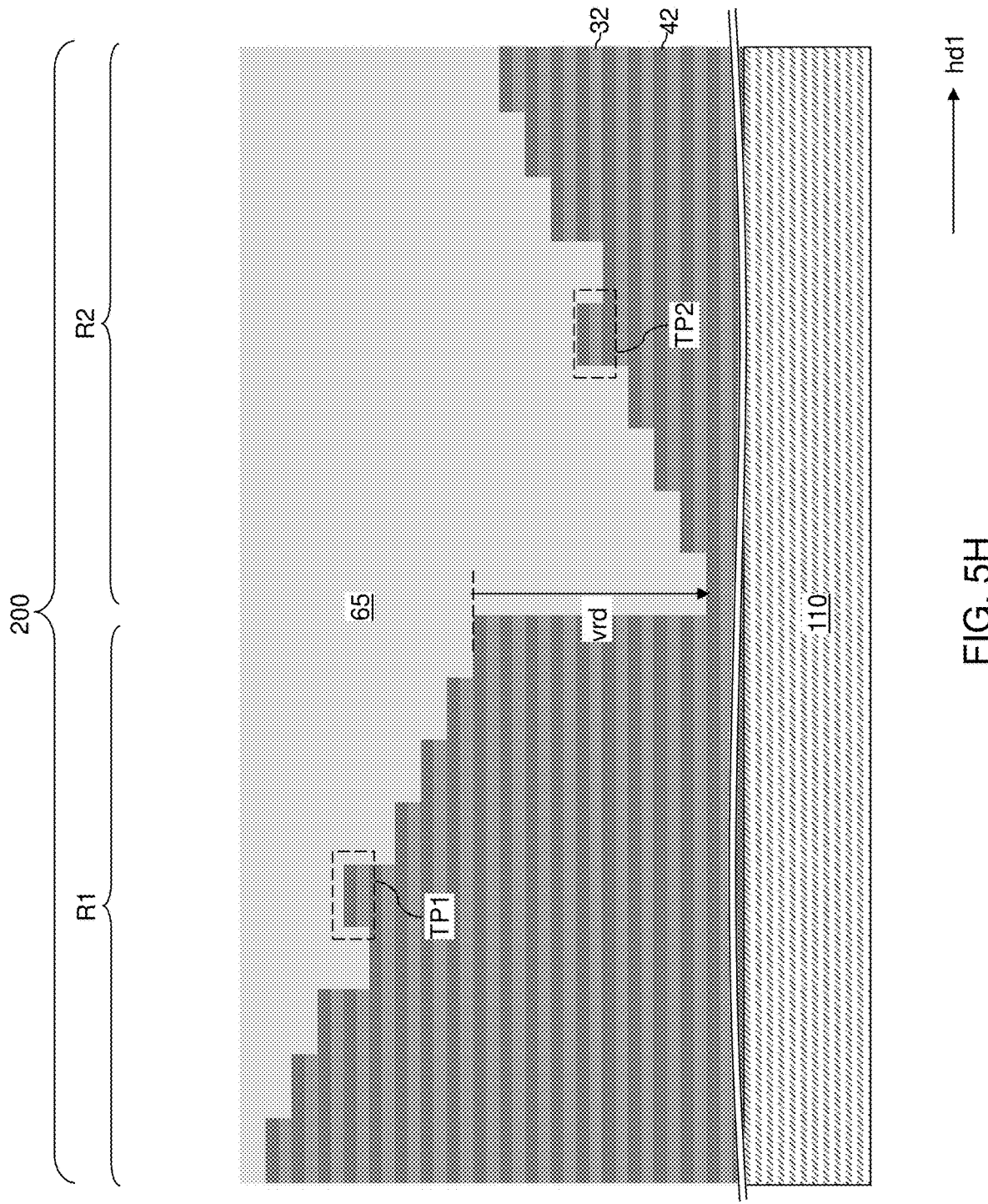

Referring FIG. 5H, a dielectric fill material such as silicon oxide can be deposited over the staircase structures. A planarization process such as a chemical mechanical polishing process can be performed to remove excess portions of the dielectric fill material from above a horizontal plane located at, or above, the topmost surface of remaining portions of the alternating stack (32, 42). It is noted that the topmost insulating layer 32T and the topmost sacrificial material layer 42 as formed at the processing steps of FIG. 2 are completely removed during the processing steps of FIG. 3D, and the topmost surface of remaining portions of the alternating stack (32, 42) can be the topmost surface of a second-from-the-top insulating layer 32 as formed during the processing steps described with reference to FIG. 2.

Figure 6:
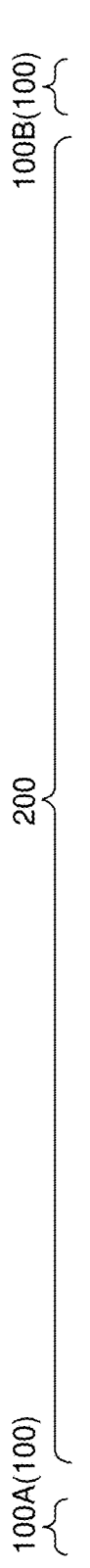
FIG. 6 is a vertical cross-sectional view of an embodiment of the exemplary structure according to an embodiment of the present disclosure.

Referring to FIG. 6, an embodiment of the exemplary structure schematically illustrates a global configuration of a set of staircase structures located within a contact region 200. Multiple vertical recess distances can be employed at the processing steps of FIG. 3G, FIG. 4F, or FIG. 5G to provide more than 2 staircase structures in the exemplary structure as illustrated in FIG. 6. Each vertical recess distance may be a respective integer multiple of K times the sum of a thickness of an insulating layer 32 within the alternating stack (32, 42) and a thickness of a spacer material layer (such as sacrificial material layers 42) within the alternating stack (32, 42). The number K is an integer representing the total number of different levels of horizontal surface segments within each staircase structure. Each neighboring pair of staircase structures can be vertically offset from each other by a respective integer multiple of K times the sum of a thickness of an insulating layer 32 within the alternating stack (32, 42) and a thickness of a spacer material layer (such as sacrificial material layers 42) within the alternating stack (32, 42).

Figure 7A:
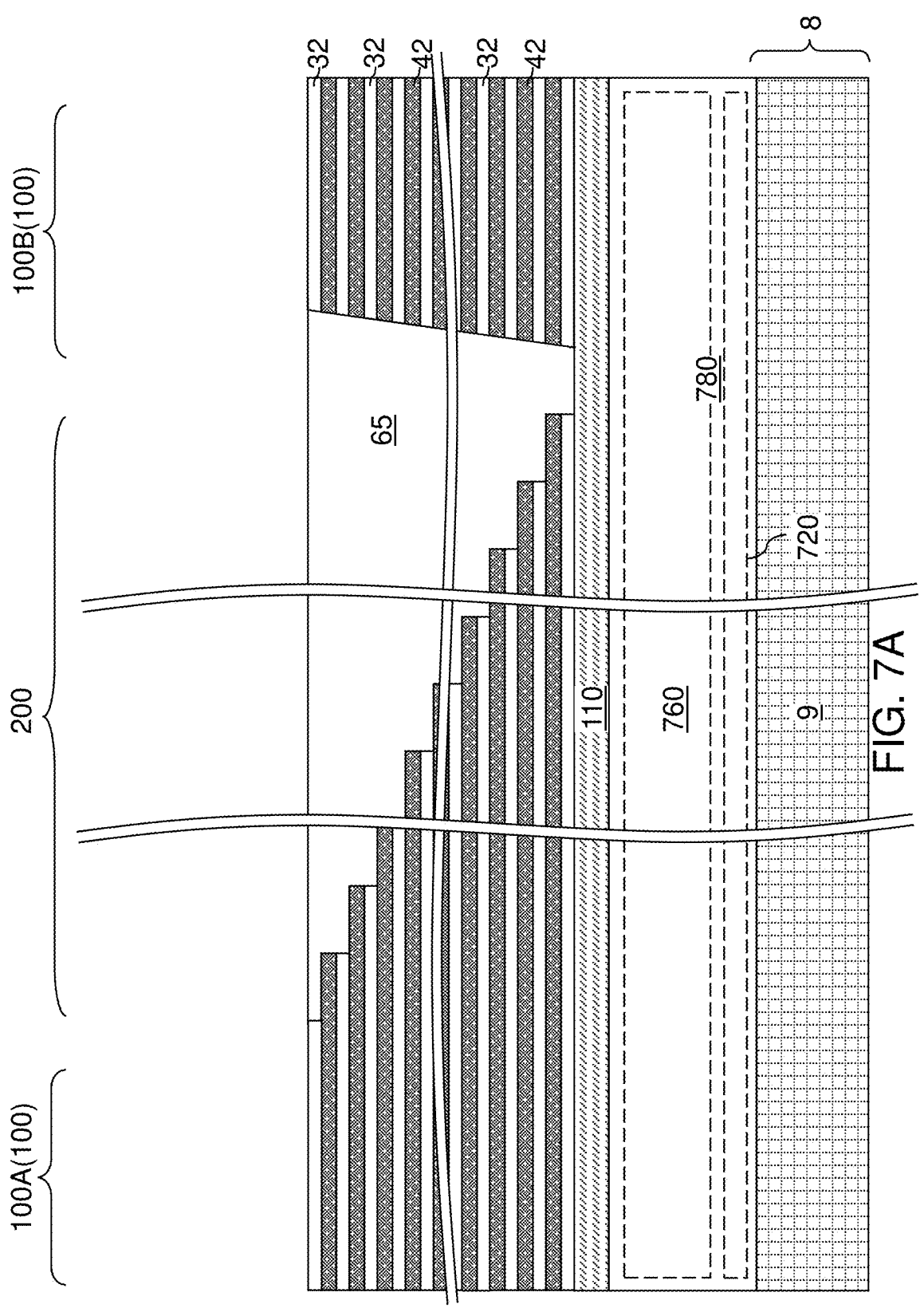
FIG. 7A is a vertical cross-sectional view along a vertical plane of the exemplary structure after formation of retro-stepped dielectric material portions and dielectric moat structures according to an embodiment of the present disclosure.
Figure 7B:
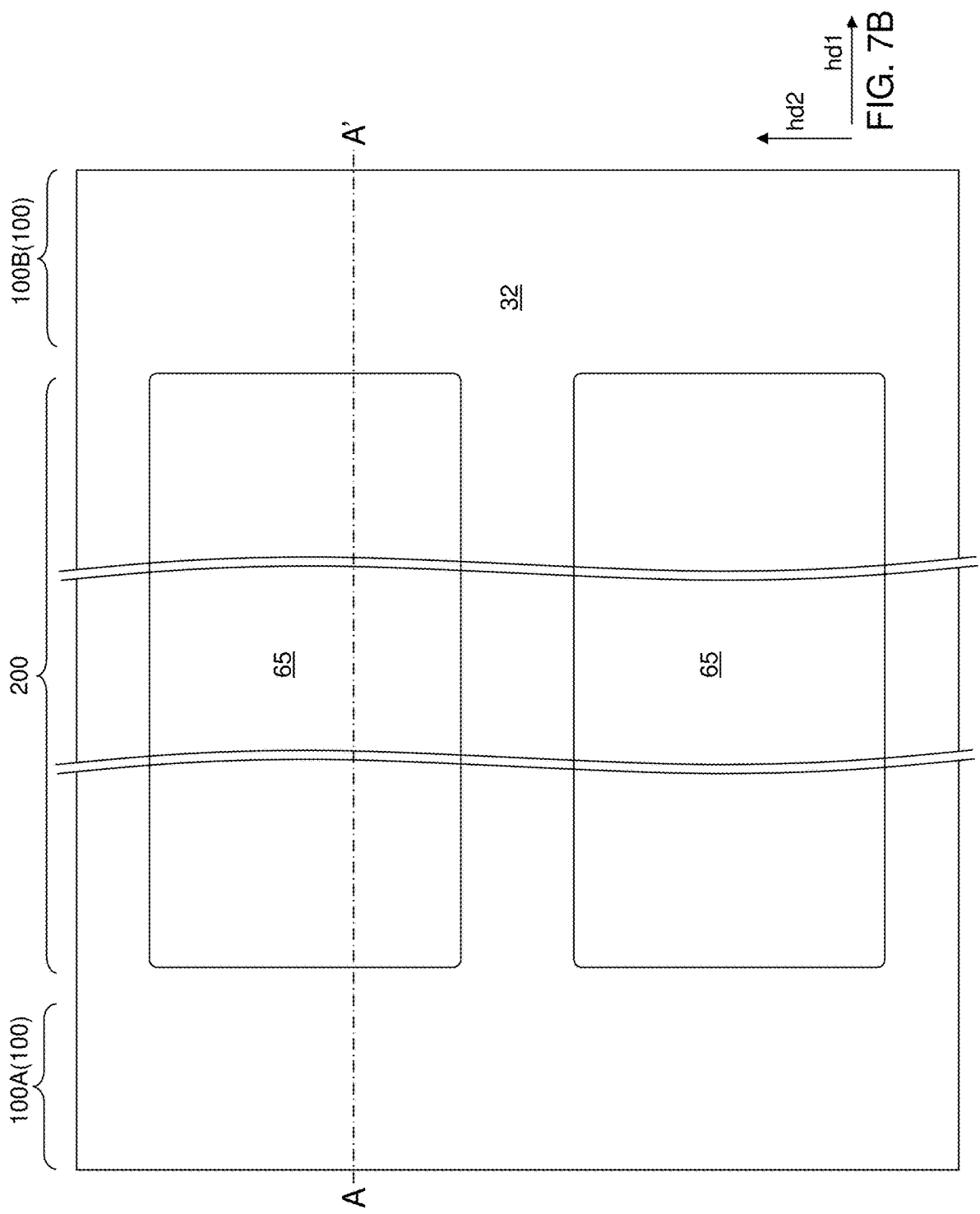
FIG. 7B is a top-down view of the exemplary structure of FIG. 7A. The vertical plane A-A' is the cut plane of the vertical cross-sectional view of FIG. 7A.

Referring to FIGS. 7A and 7B, the exemplary structure is illustrated after formation of the retro-stepped dielectric material portions 65. The exemplary structure illustrated in FIGS. 7A and 7B may have any of the configurations of the exemplary structure as described with reference to FIG. 3H, 4G, 5H or 6.

Figure 8A:
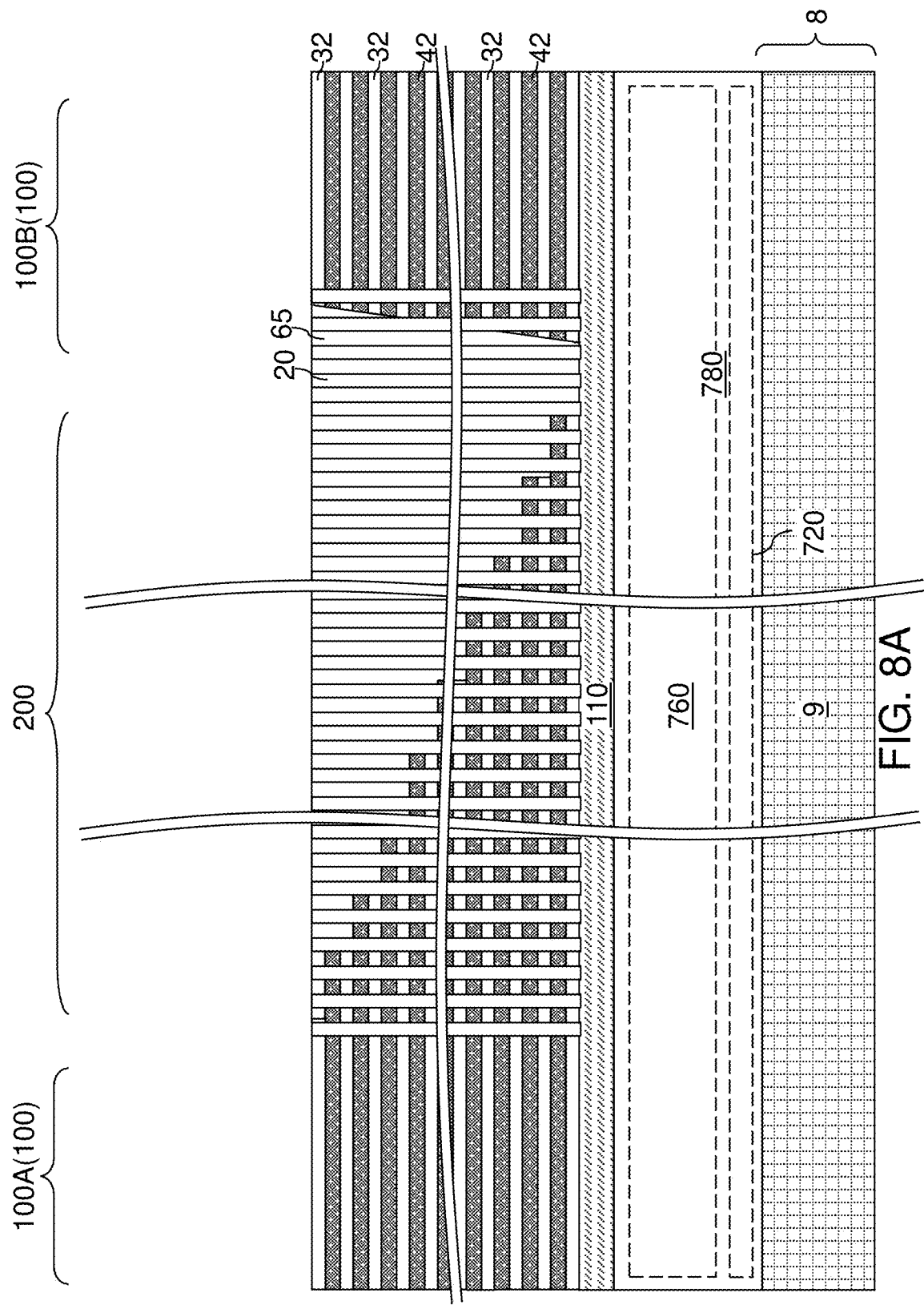
FIG. 8A is a vertical cross-sectional view along a vertical plane of the exemplary structure after formation of support pillar structures according to an embodiment of the present disclosure.
Figure 8B:
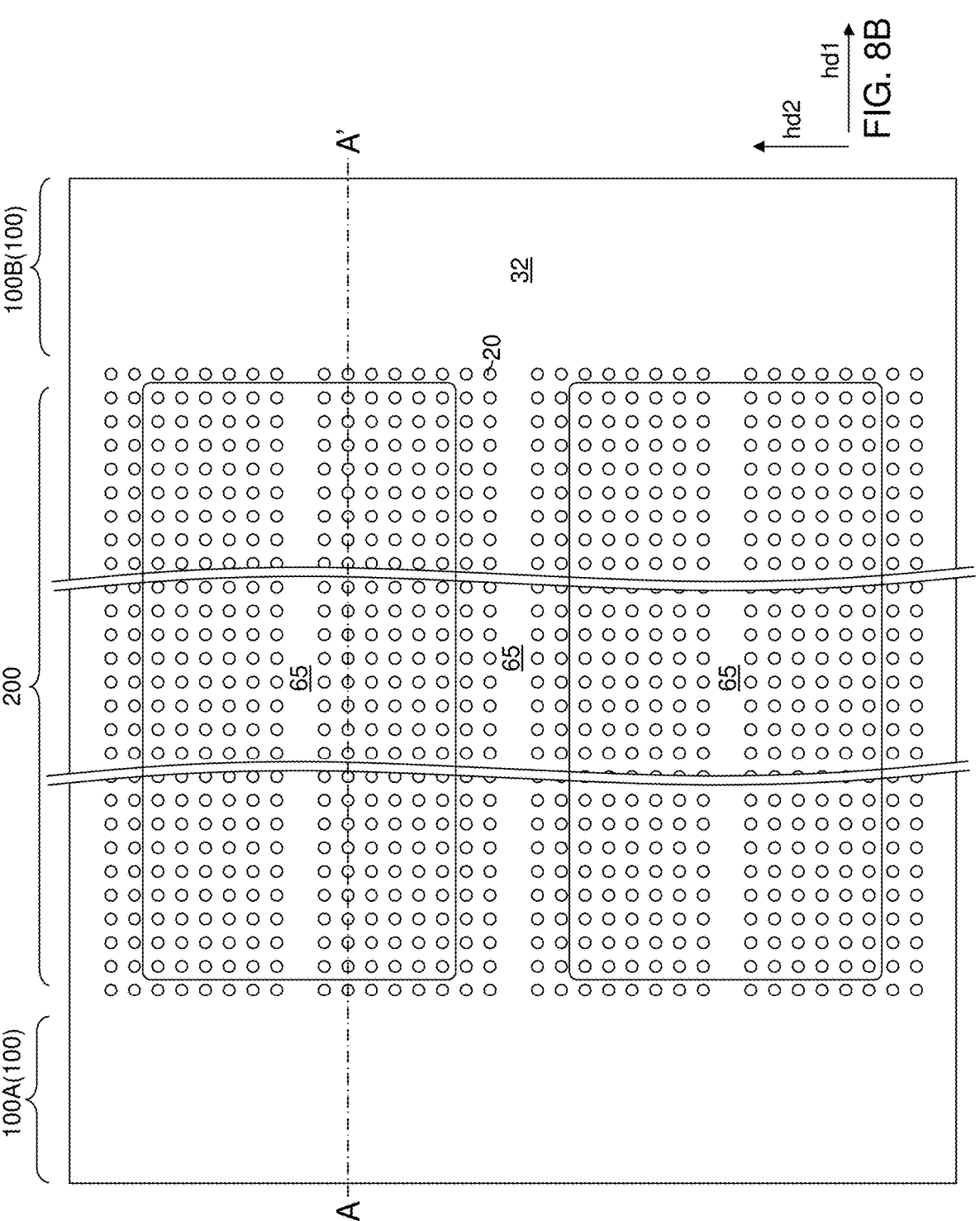
FIG. 8B is a top-down view of the exemplary structure of FIG. 8A. The vertical plane A-A' is the cut plane of the vertical cross-sectional view of FIG. 8A.

Referring to FIGS. 8A and 8B, a photoresist layer (not shown) can be applied over the alternating stack (32, 42) and the retro-stepped dielectric material portions 65, and can be lithographically patterned to form arrays of openings in the contact regions 200. An anisotropic etch process can be performed to transfer the pattern of the opening in the photoresist layer through the retro-stepped dielectric material portions 65 and the alternating stack (32, 42) to form optional support openings in the contact regions 200. Each of the support openings may vertically extend from the horizontal plane including the topmost surface of the alternating stack (32, 42) at least to the horizontal plane including the bottommost surface of the alternating stack (32, 42), and optionally into an upper portion of the semiconductor material layer 110. The photoresist layer can be subsequently removed, for example, by ashing.

At least one dielectric fill material, such as undoped silicate glass (i.e., silicon oxide) and/or a doped silicate glass can optionally be deposited in the support openings. Excess portions of the at least one dielectric fill material can be removed from above the horizontal plane including the top surface of the topmost insulating layer 32 and the retro-stepped dielectric material portions 65 by a planarization process, which may employ a recess etch process. Remaining portions of the at least one dielectric fill material constitutes support pillar structures 20, which are subsequently used to provide structural support during replacement of the sacrificial material layers 42 with electrically conductive layers. Alternatively, the processing steps illustrated with reference to FIGS. 8A and 8B may be omitted, and the support pillar structures may be formed concurrently with subsequent formation of memory opening fill structures described below.

Figure 9A:
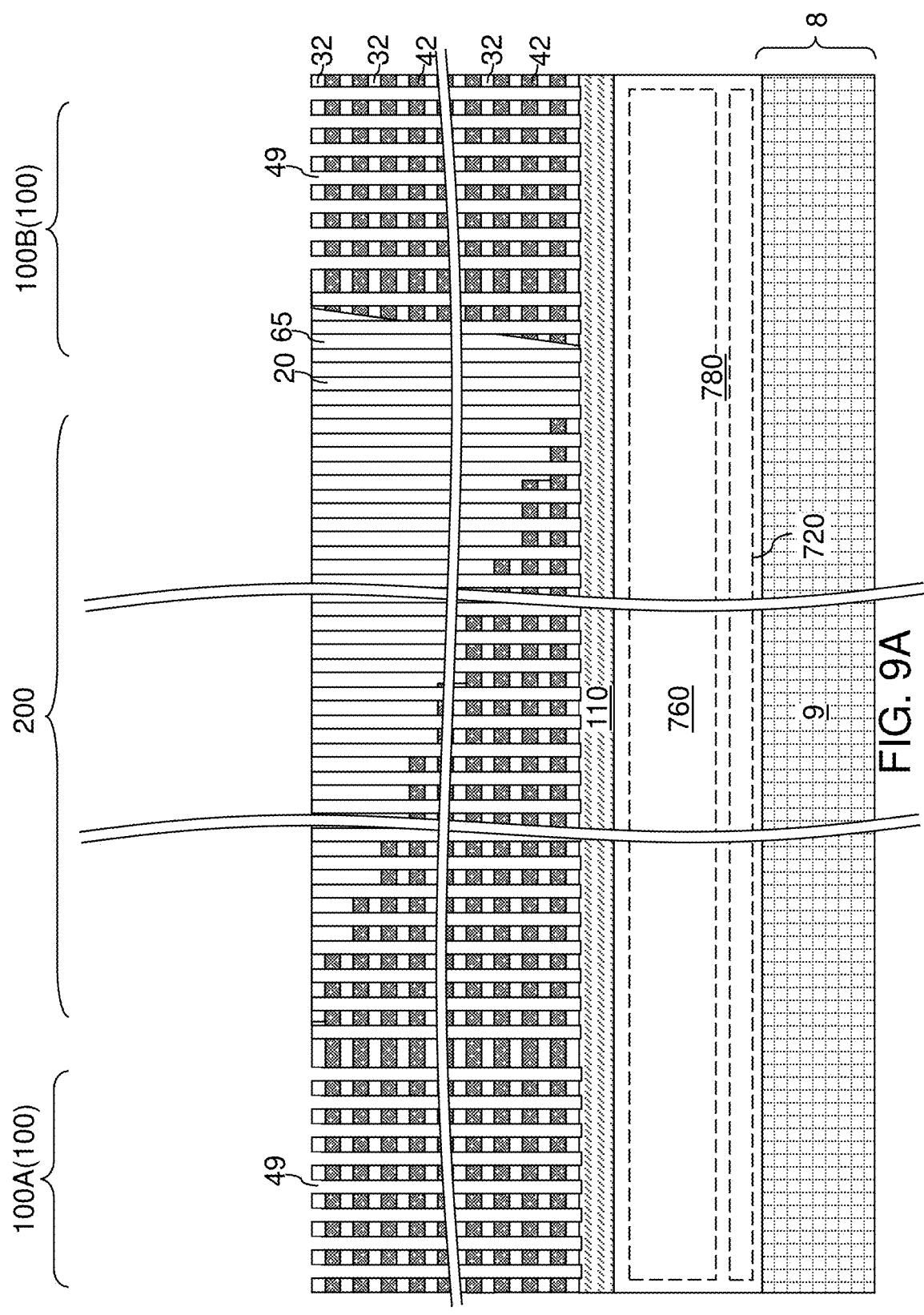
FIG. 9A is a vertical cross-sectional view along a vertical plane of the exemplary structure after formation of memory openings according to an embodiment of the present disclosure.
Figure 9B:
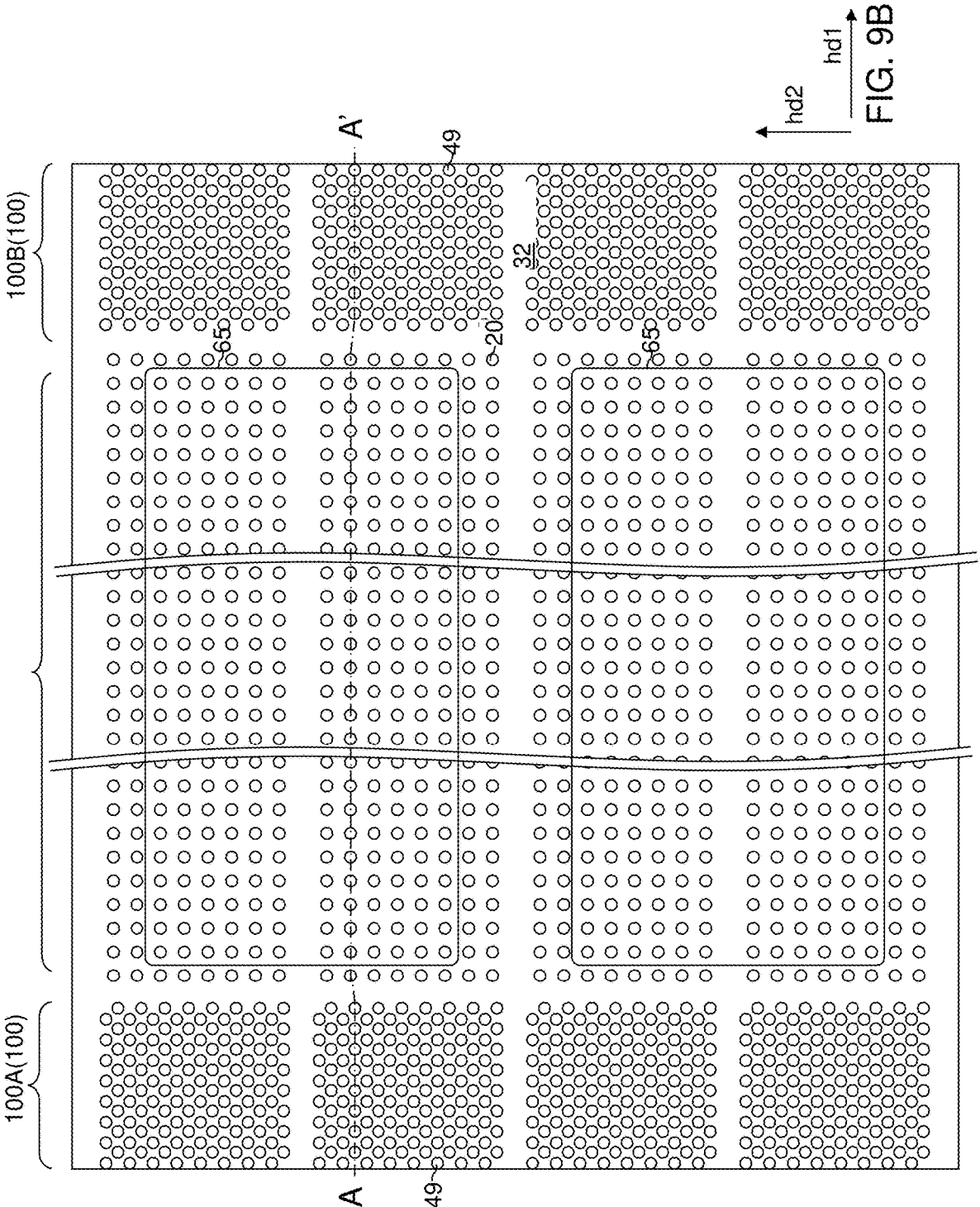
FIG. 9B is a top-down view of the exemplary structure of FIG. 9A. The vertical plane A-A' is the cut plane of the vertical cross-sectional view of FIG. 9A.

Referring to FIGS. 9A and 9B, a photoresist layer (not shown) can be applied over the alternating stack (32, 42), and can be lithographically patterned to form arrays of memory openings 49 in the memory regions 100. An anisotropic etch process can be performed to transfer the pattern of the opening in the photoresist layer through the alternating stack (32, 42) to form memory openings 49. Each of the memory openings 49 may vertically extend from the horizontal plane including the topmost surface of the alternating stack (32, 42) at least to the horizontal plane including the bottommost surface of the alternating stack (32, 42), and optionally into an upper portion of the semiconductor material layer 110. The photoresist layer can be subsequently removed, for example, by ashing. In the alternative embodiment, the above-described support openings may be formed in the contact regions 200 concurrently with formation of the memory openings 49 in the memory regions 100.

FIGS. 10A-10F are sequential vertical cross-sectional views of a memory opening 49 during formation of a memory opening fill structure 58 according to an embodiment of the present disclosure.

Figures 10A, 10B:
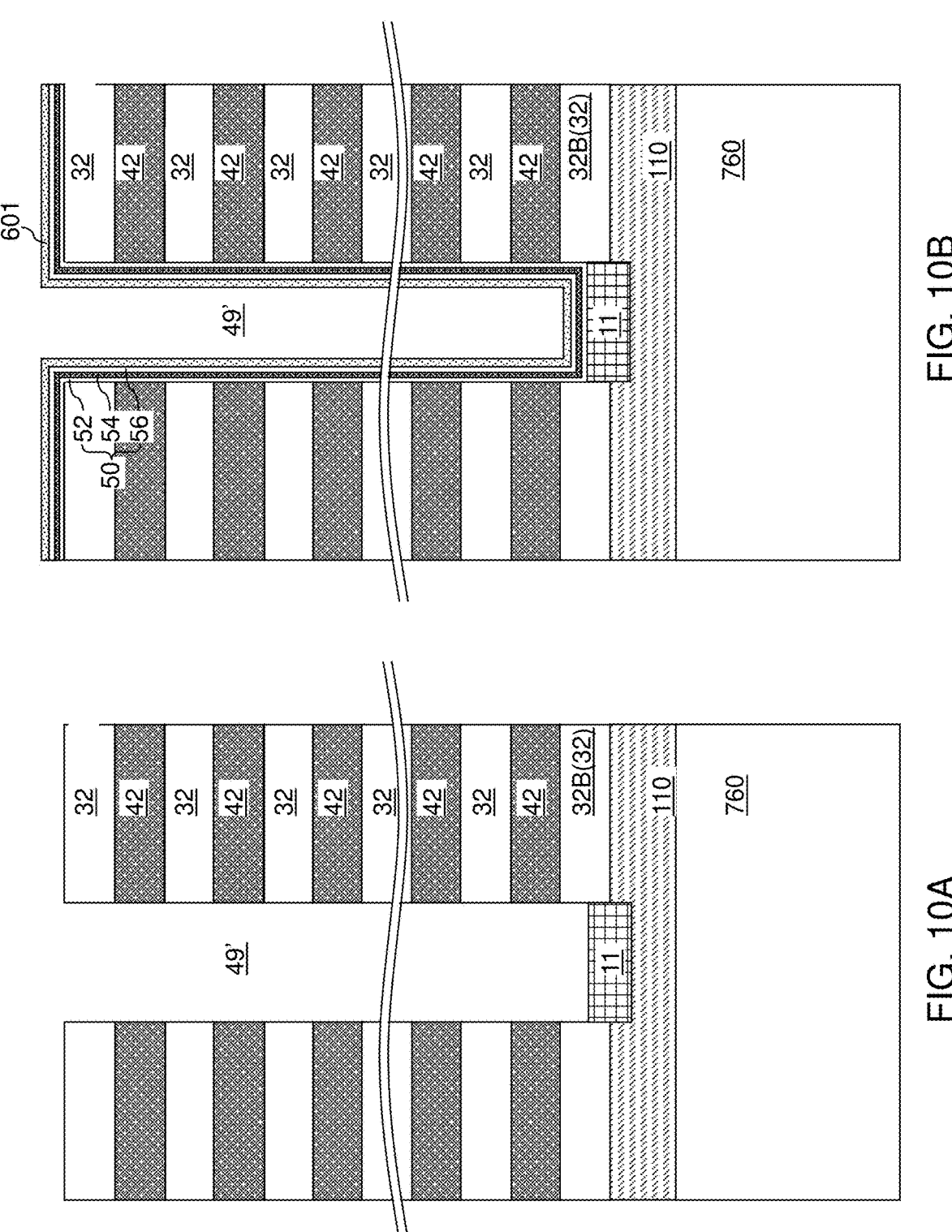
FIGS. 10A-10F are sequential vertical cross-sectional views of a memory opening during formation of a memory opening fill structure according to an embodiment of the present disclosure.

Referring to FIG. 10A, a memory opening 49 in the exemplary device structure of FIGS. 9A and 9B is illustrated. The memory opening 49 extends through the alternating stack (32, 42), and optionally into an upper portion of the semiconductor material layer 110. The recess depth of the bottom surface of each memory opening 49 with respect to the top surface of the semiconductor material layer 110 can be in a range from 0 nm to 30 nm, although greater recess depths can also be employed. Optionally, the sacrificial material layers 42 can be laterally recessed partially to form laterally-extending cavities (not shown), for example, by an isotropic etch.

An optional pedestal channel portion 11 (which may be a silicon pedestal) can be formed at the bottom portion of each memory opening 49, for example, by a selective semiconductor deposition process. In one embodiment, the pedestal channel portion 11 can be doped with electrical dopants of the same conductivity type as the semiconductor material layer 110, which is a first conductivity type. In one embodiment, the top surface of each pedestal channel portion 11 can be formed below a horizontal plane including the top surface of the bottommost insulating layer 32B. The pedestal channel portion 11 can be a portion of a transistor channel that extends between a source region to be subsequently formed in the semiconductor material layer 110 and a drain region to be subsequently formed in an upper portion of the memory opening 49. A memory cavity 49' is present in the unfilled portion of the memory opening 49 above the pedestal channel portion 11.

Referring to FIG. 10B, a stack of layers including a blocking dielectric layer 52, a memory material layer 54, and an optional dielectric liner 56 can be deposited in each memory opening 49. The stack of layers is herein referred to as a memory film 50.

The blocking dielectric layer 52 can include a single dielectric material layer or a stack of a plurality of dielectric material layers. In one embodiment, the blocking dielectric layer 52 can include a dielectric metal oxide layer consisting essentially of a dielectric metal oxide. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within laterally-extending cavities into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. Generally, the memory material layer 54 may comprise a vertical stack of memory elements that are located at levels of the sacrificial material layers 42. For example, the vertical stack of memory elements may be embodied as annular portions of the memory material layer 54 located at levels of the sacrificial material layers 42.

The optional dielectric liner 56, if present, comprises a dielectric liner material. In one embodiment, the dielectric liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed. Optionally, a sacrificial cover material layer 601 may be formed over the memory film 50.

Figures 10C, 10D:
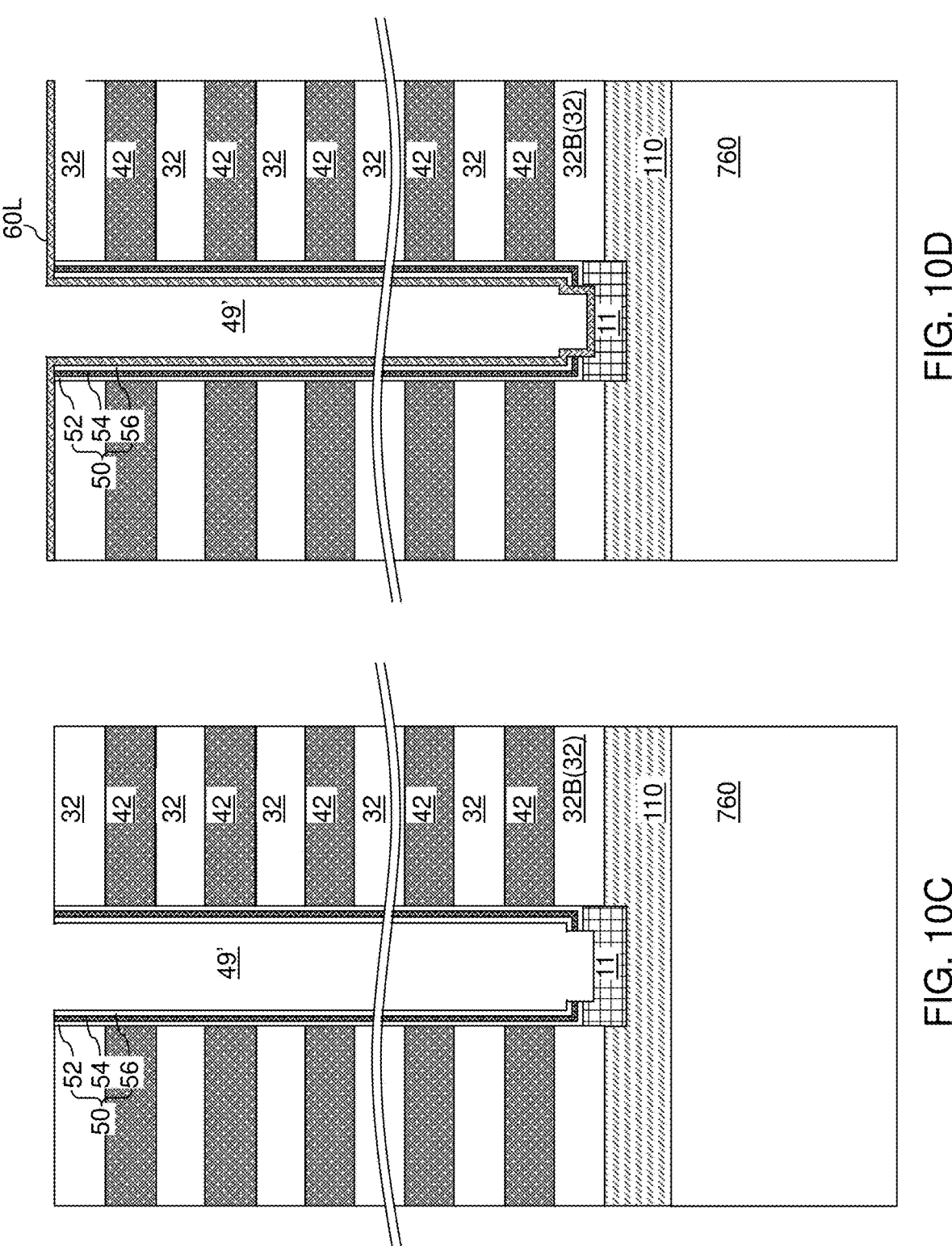

Referring to FIG. 10C, the optional sacrificial cover material layer 601, the dielectric liner 56, the memory material layer 54, the blocking dielectric layer 52 are sequentially anisotropically etched employing at least one anisotropic etch process. The portions of the sacrificial cover material layer 601, the dielectric liner 56, the memory material layer 54, and the blocking dielectric layer 52 located above the top surface of the topmost insulating layer 32 can be removed by the at least one anisotropic etch process. Further, the horizontal portions of the sacrificial cover material layer 601, the dielectric liner 56, the memory material layer 54, and the blocking dielectric layer 52 at a bottom of each memory cavity 49' can be removed to form openings in remaining portions thereof. Each of the sacrificial cover material layer, the dielectric liner 56, the memory material layer 54, and the blocking dielectric layer 52 can be etched by a respective anisotropic etch process employing a respective etch chemistry, which may or may not be the same for the various material layers.

Each remaining portion of the sacrificial cover material layer 601, if employed, can have a tubular configuration. A surface of the pedestal channel portion 11 (or a surface of the semiconductor material layer 110 in case a pedestal channel portions 11 is not employed) can be physically exposed underneath the opening through the sacrificial cover material layer, the dielectric liner 56, the memory material layer 54, and the dielectric metal oxide blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 110 in case pedestal channel portions 11 are not employed) by a recess distance. In one embodiment, the sacrificial cover material layer 601, the dielectric liner 56, the memory material layer 54, and the blocking dielectric layer 52 can have vertically coincident sidewalls. The sacrificial cover material layer 601 can be subsequently removed selective to the material of the dielectric liner 56. In case the sacrificial cover material layer 601 includes amorphous silicon, a wet etch process employing hot trimethyl-2 hydroxyethyl ammonium hydroxide ("hot TMY") or tetramethyl ammonium hydroxide (TMAH) can be performed to remove the sacrificial cover material layer. Alternatively, the sacrificial cover material layer 601 may be retained in the final device if it comprises a silicon material.

Referring to FIG. 10D, a semiconductor channel layer 60L can be deposited directly on the semiconductor surface of the pedestal channel portion 11 or the semiconductor material layer 110 if the pedestal channel portion 11 is omitted, and directly on the memory film 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 110 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figures 10E, 10F:
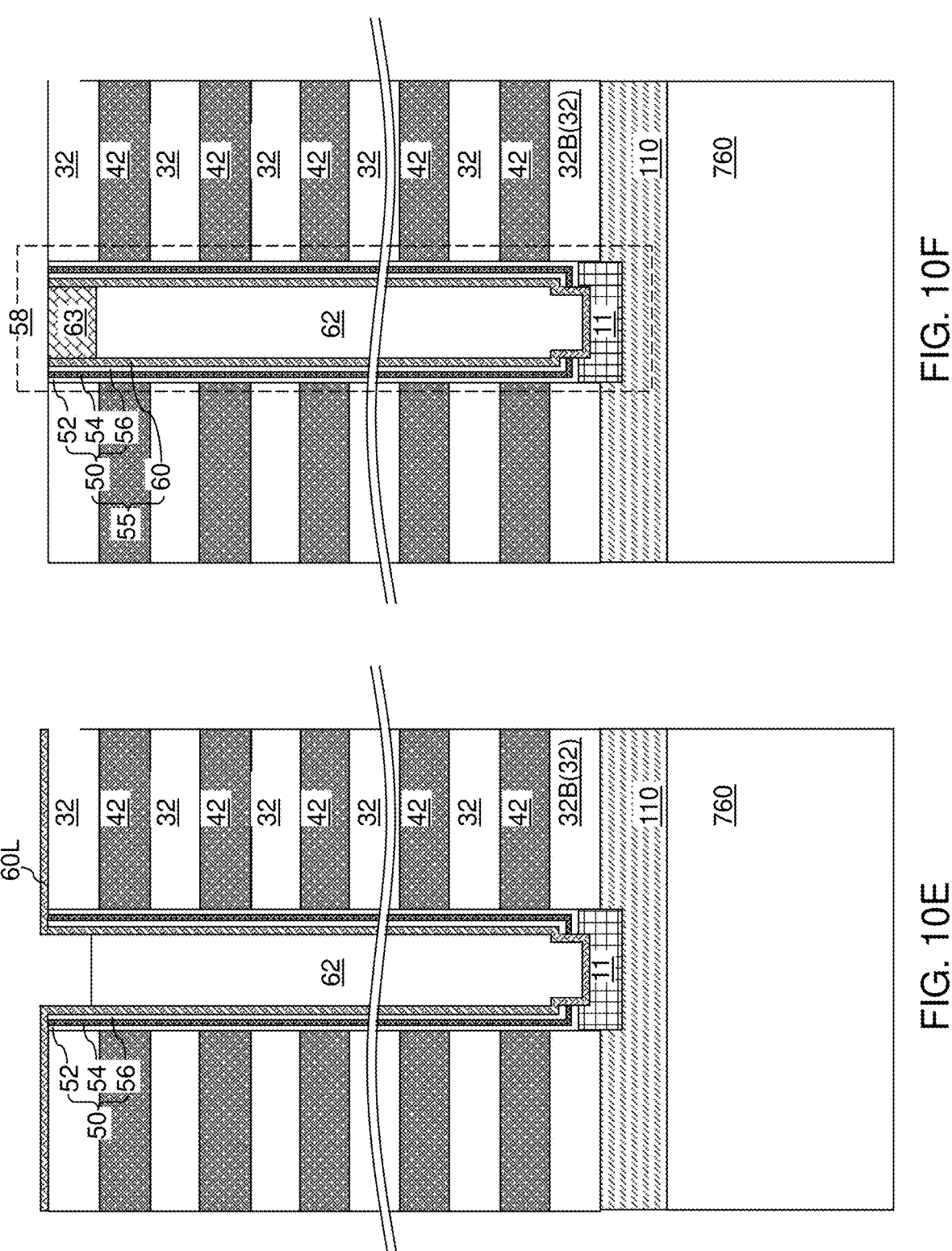

Referring to FIG. 10E, a dielectric core layer can be deposited to fill any remaining portion of the memory cavity 49' within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch process such that each remaining portions of the dielectric core layer is located within a respective memory opening 49 and has a respective top surface below the horizontal plane including the top surface of the topmost insulating layer 32. Each remaining portion of the dielectric core layer constitutes a dielectric core 62.

Referring to FIG. 10F, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/\text{cm}^3$ to $2.0 \times 10^{21}/\text{cm}^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. The memory stack structure 55 is a combination of a vertical semiconductor channel 60, an optional dielectric liner 56, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

In the alternative embodiment in which the support openings are formed at the same time as the memory openings 49, the support pillar structures 20 may be formed in the support openings at the same time as the memory opening fill structures 58. In this alternative embodiment, the support pillar structures 20 have the same composition as the memory opening fill structures 58, but are not electrically connected to the subsequently formed bit lines.

Figure 11A:
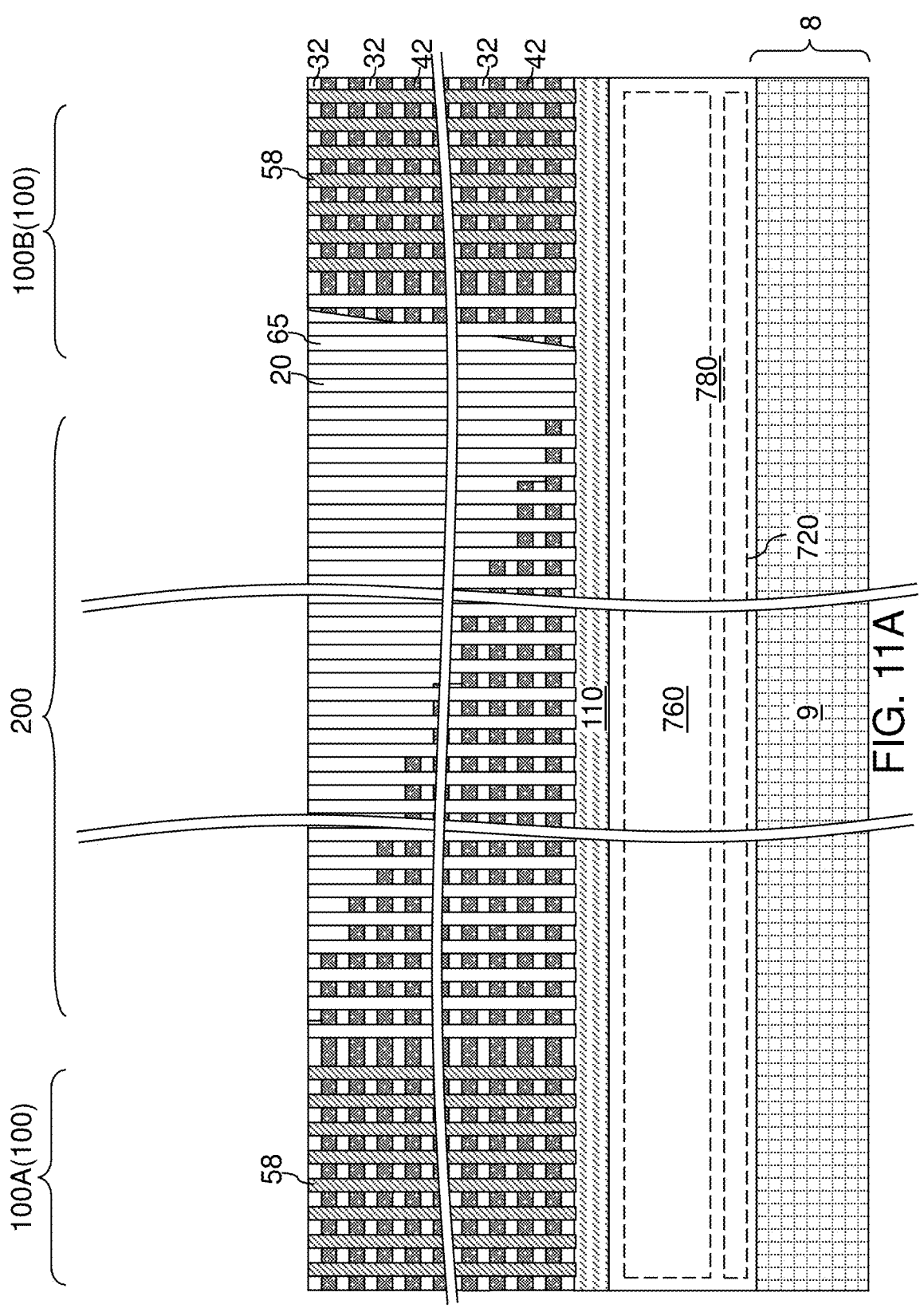
FIG. 11A is a vertical cross-sectional view of the exemplary structure after formation of memory opening fill structures according to an embodiment of the present disclosure.
Figure 11B:
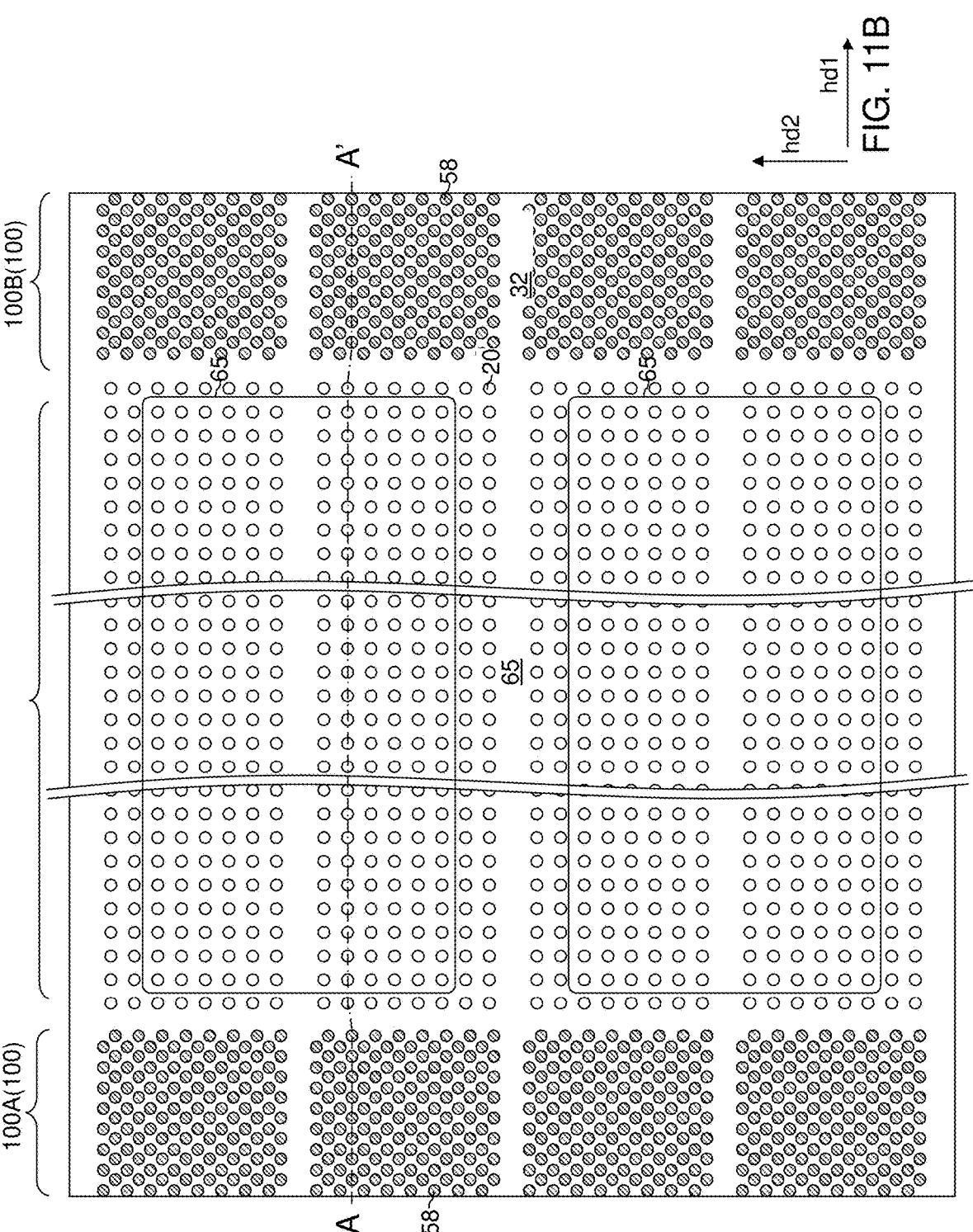
FIG. 11B is a top-down view of the exemplary structure of FIG. 11A. The vertical plane A-A' is the cut plane of the vertical cross-sectional view of FIG. 11A.

Referring to FIGS. 11A and 11B, the exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening. Other memory stack structures including different layer stacks or structures for the memory film 50 and/or for the vertical semiconductor channel 60 may also be used.

In summary, each memory opening fill structure 58 can be formed in a respective one of the memory openings 49. Each of the memory opening fill structures 58 comprises a respective vertical stack of memory elements (e.g., portions of the memory film 50) and a vertical semiconductor channel 60. Within each plane, a first subset of the memory opening fill structures 58 is located in a first memory array region 100A, and a second subset of the memory opening fill structures 58 is located in a second memory array region 100B that is laterally offset from the first memory array region 100A along the first horizontal direction hd1.

Figure 12A:
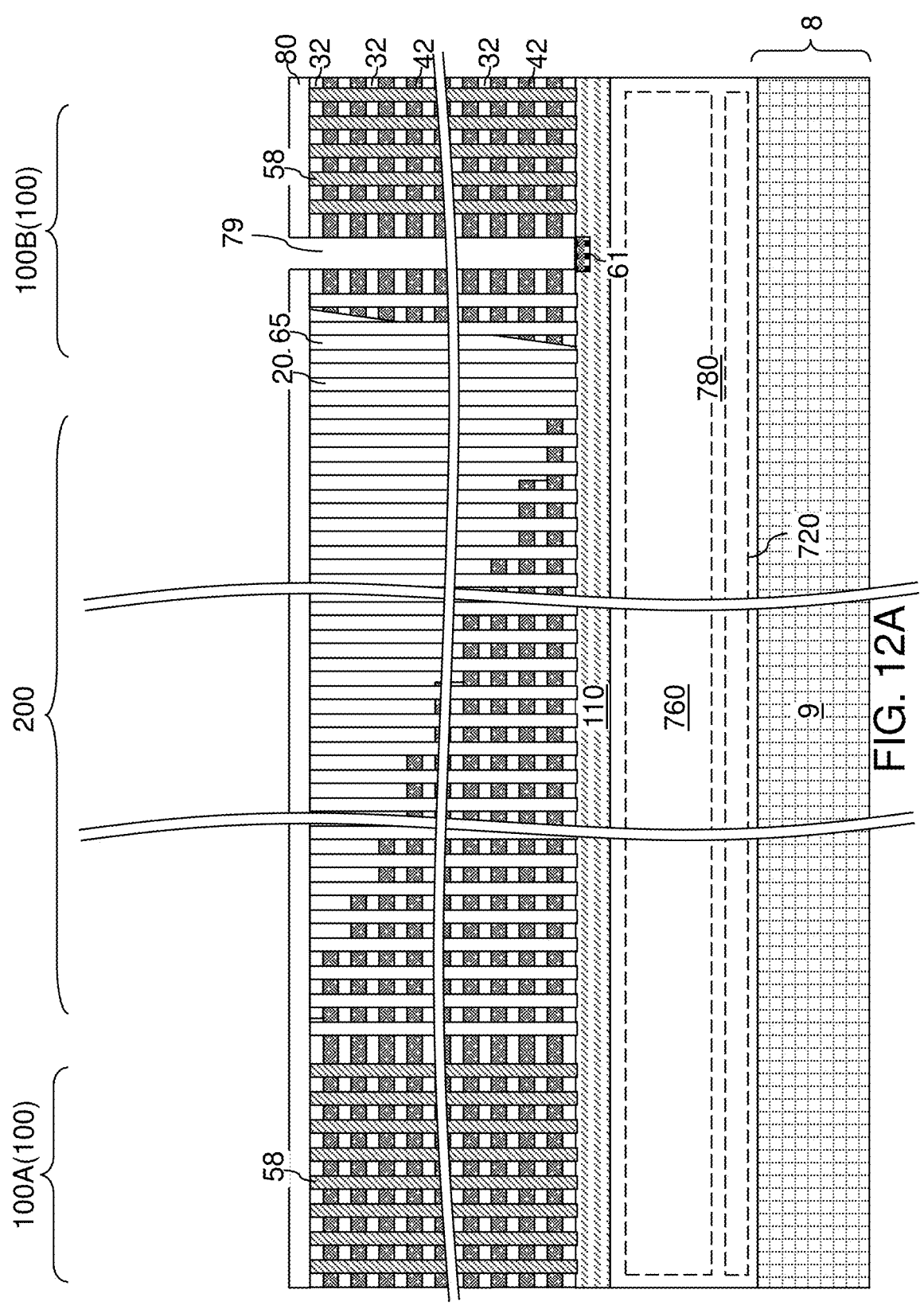
FIG. 12A is a first vertical cross-sectional view along a first vertical plane of the exemplary structure after formation of a contact-level dielectric layer and lateral isolation trenches according to an embodiment of the present disclosure.
Figure 12B:
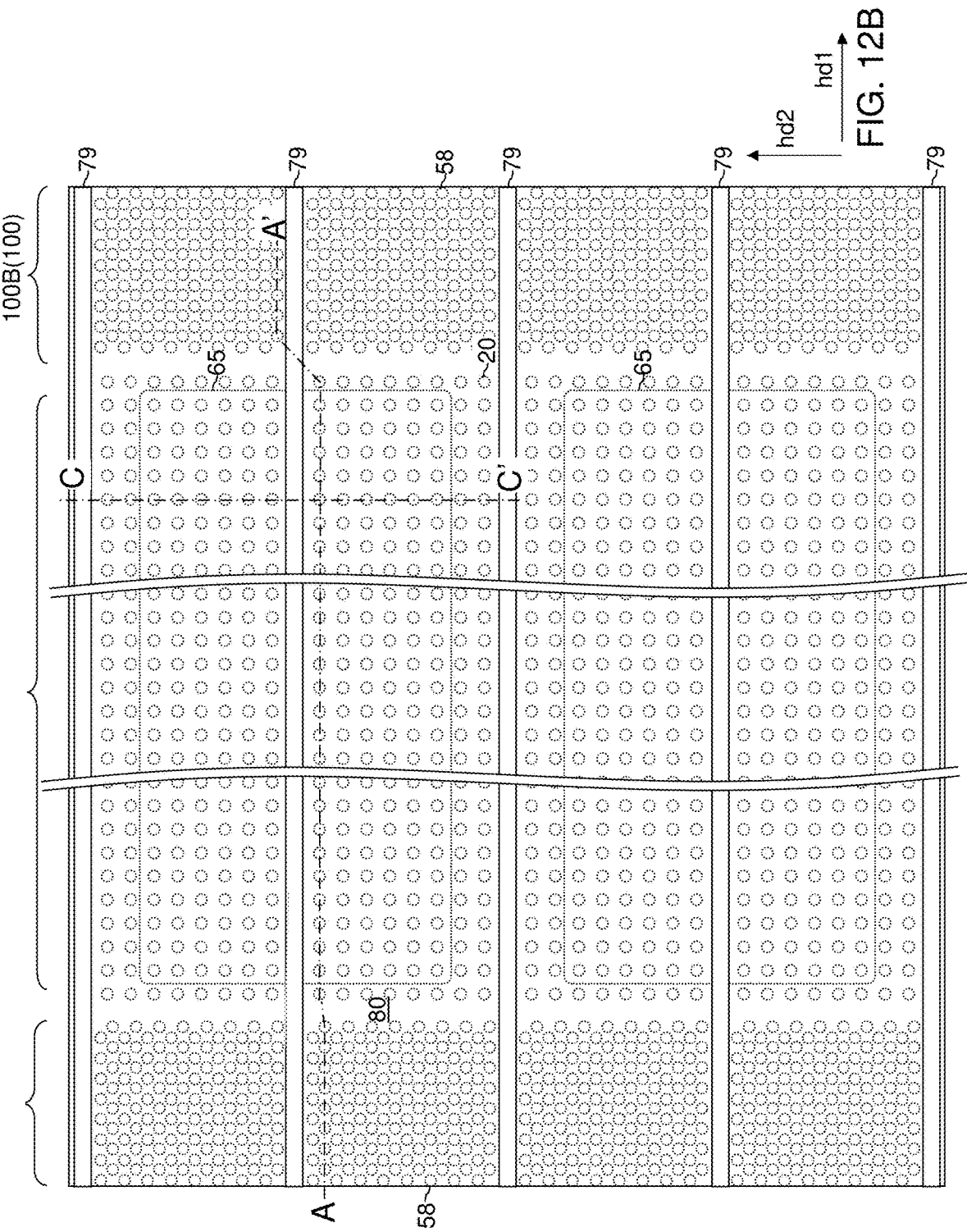
FIG. 12B is a top-down view of the exemplary structure of FIG. 12A. The vertical plane A-A' is the cut plane of the vertical cross-sectional view of FIG. 12A.
Figure 12C:
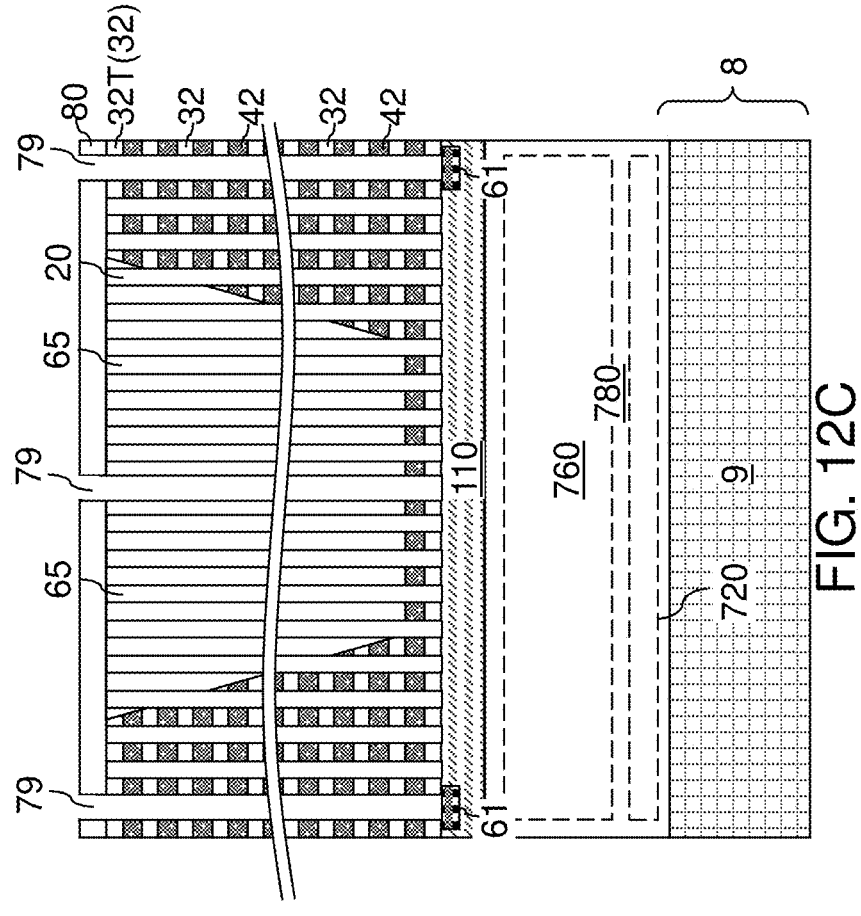
FIG. 12C is a vertical cross-sectional view of the exemplary structure along the vertical plane C-C' of FIG. 12B.

Referring to FIGS. 12A-12C, a photoresist layer (not shown) can be applied over the alternating stack (32, 42), the memory opening fill structures 58, and the retro-stepped dielectric material portions 65, and can be lithographically patterned to form elongated openings in areas between clusters of memory opening fill structures 58. The pattern in the photoresist layer can be transferred through the alternating stack (32, 42) and the retro-stepped dielectric material portions 65 employing an anisotropic etch to form lateral isolation trenches 79, which vertically extend from the topmost surface of the alternating stack (32, 42) at least to the top surface of semiconductor material layer 110, and laterally extend along the first horizontal direction hd1 through a respective contact region 200 and a pair of memory array regions (100A, 100B).

In one embodiment, the lateral isolation trenches 79 can laterally extend along a first horizontal direction hd1 (which is a word line direction), and can be laterally spaced apart among one another along a second horizontal direction hd2 (which is a bit line direction) that is perpendicular to the first horizontal direction hd1. The memory opening fill structures 58 can be arranged in rows that extend along the first horizontal direction hd1. Each lateral isolation trench 79 can have a uniform width that is invariant along the lengthwise direction (i.e., along the first horizontal direction hd1). Multiple rows of memory opening fill structures can be located between a neighboring pair of lateral isolation trenches 79. In one embodiment, the lateral isolation trenches 79 can include source contact openings in which source contact via structures can be subsequently formed. The photoresist layer can be removed, for example, by ashing.

Dopants of the second conductivity type may be implanted into surface portions of the semiconductor material layer 110 that underlie the lateral isolation trenches to form source regions 61. The width of the lateral isolation trenches 79 along the second horizontal direction hd2 can be greater than the thickness of each sacrificial material layer 42. The alternating stack (32, 42) is divided into multiple alternating stacks (32, 42) that are laterally spaced apart along the second horizontal direction hd2 by the lateral isolation trenches 79.

Figure 13A:
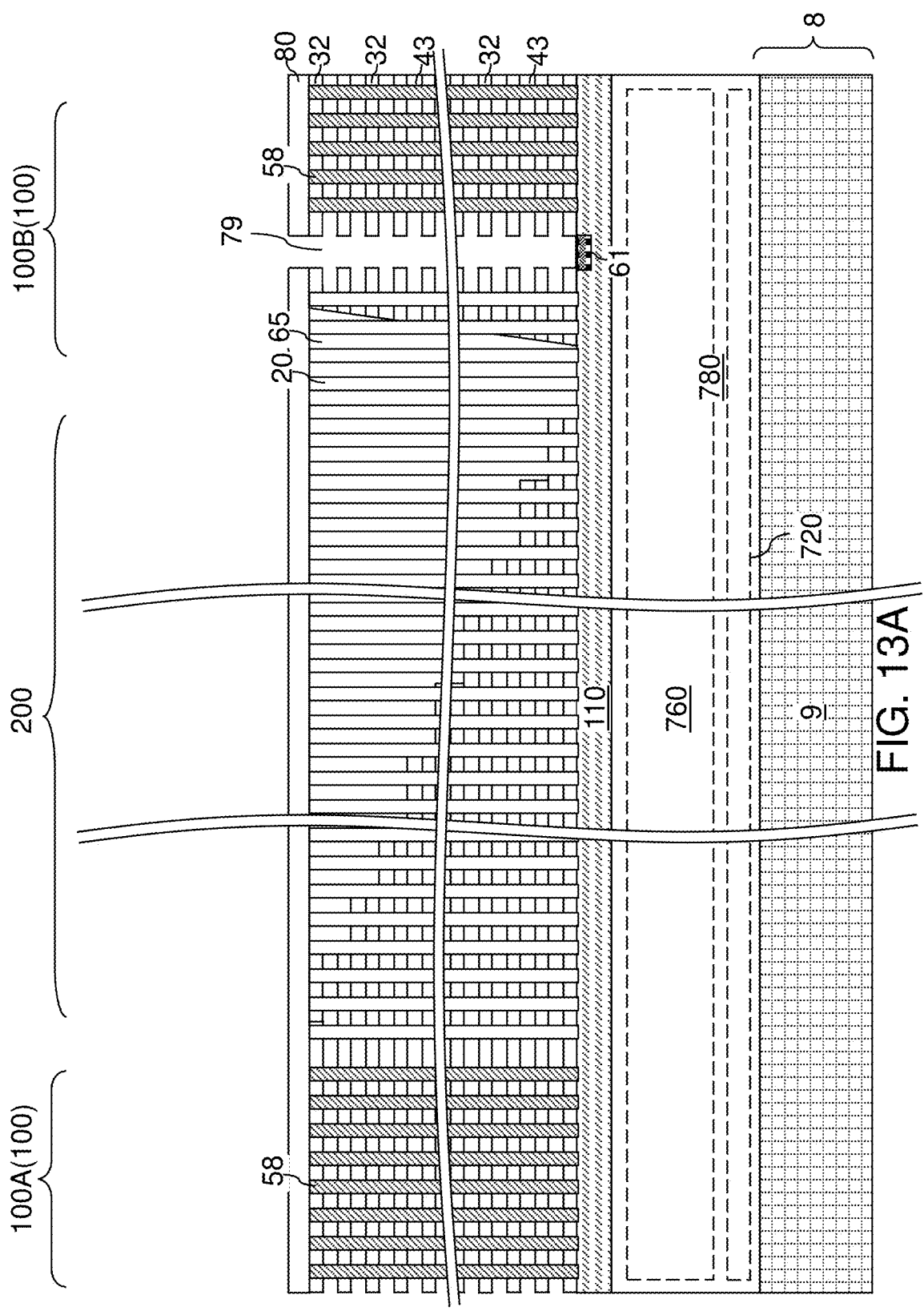
FIG. 13A is a first vertical cross-sectional view along a first vertical plane of the exemplary structure after formation of lateral recesses according to an embodiment of the present disclosure.
Figure 13B:
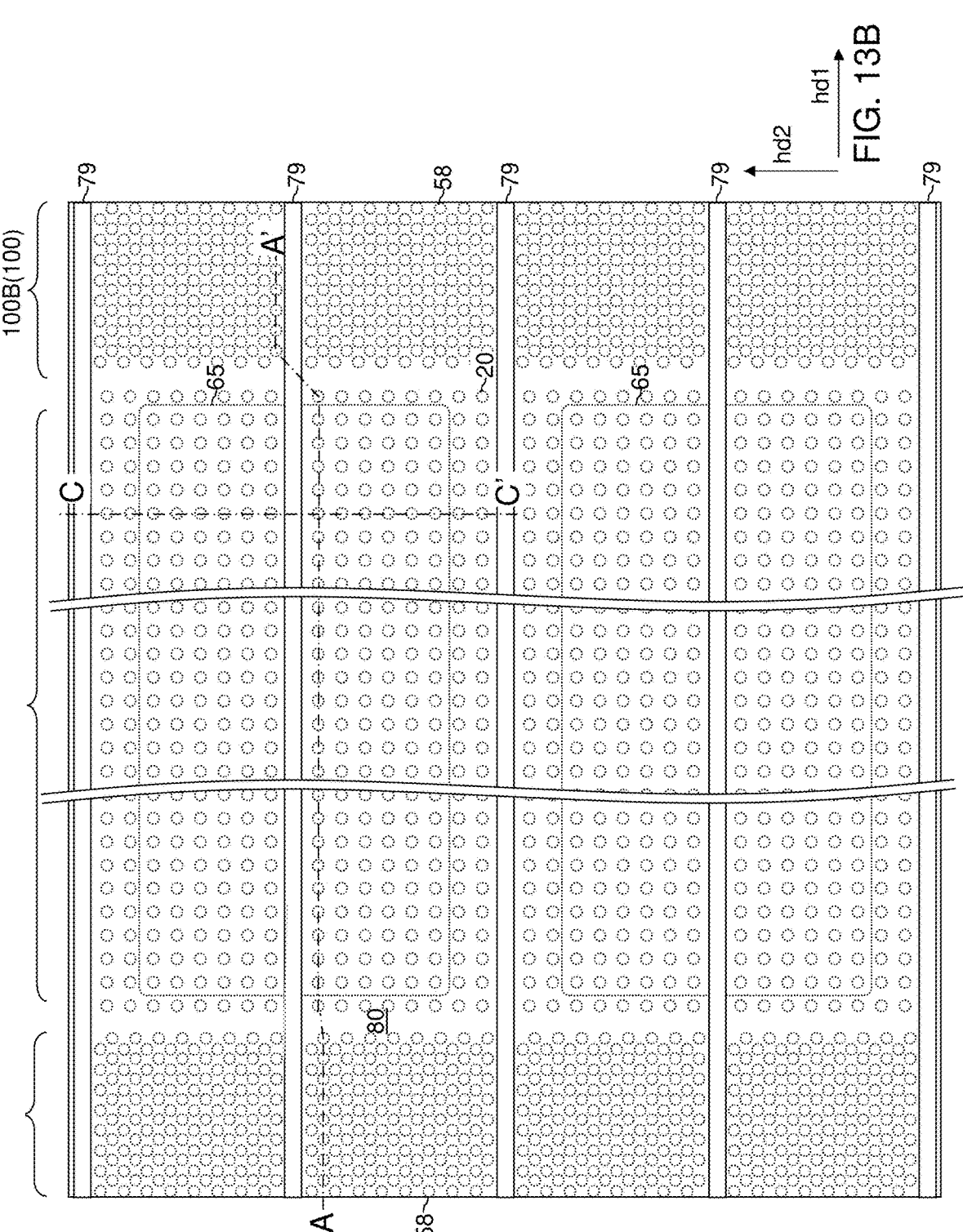
FIG. 13B is a top-down view of the exemplary structure of FIG. 13A. The vertical plane A-A' is the cut plane of the vertical cross-sectional view of FIG. 13A.
Figure 13C:
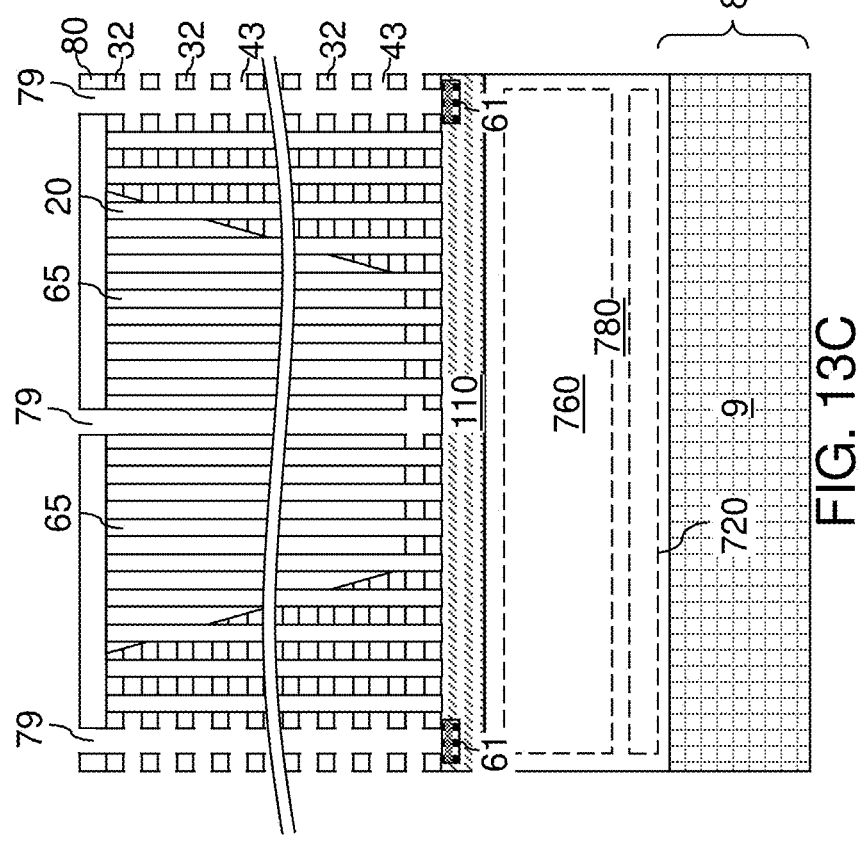
FIG. 13C is a vertical cross-sectional view of the exemplary structure along the vertical plane C-C' of FIG. 13B.

Referring to FIGS. 13A-13C, an isotropic etch process can be performed to introduce an isotropic etchant that etches a material of the sacrificial material layers 42 into the lateral isolation trenches 79. For example, if the sacrificial material layers 42 comprise silicon nitride, the isotropic etch process may comprise a wet etch process employing hot phosphoric acid. Laterally-extending cavities 43 are formed in volumes from which portions of the sacrificial material layers 42 are removed by the isotropic etch process. According to an aspect of the present disclosure, the isotropic etch process has a sufficient etch distance to remove all portions of the sacrificial material layers 42 in the memory array regions (100A, 100B) and the contact regions 200. Laterally-extending cavities 43 can be formed in the volumes from which the sacrificial material layers 42 are removed.

Figure 14A:
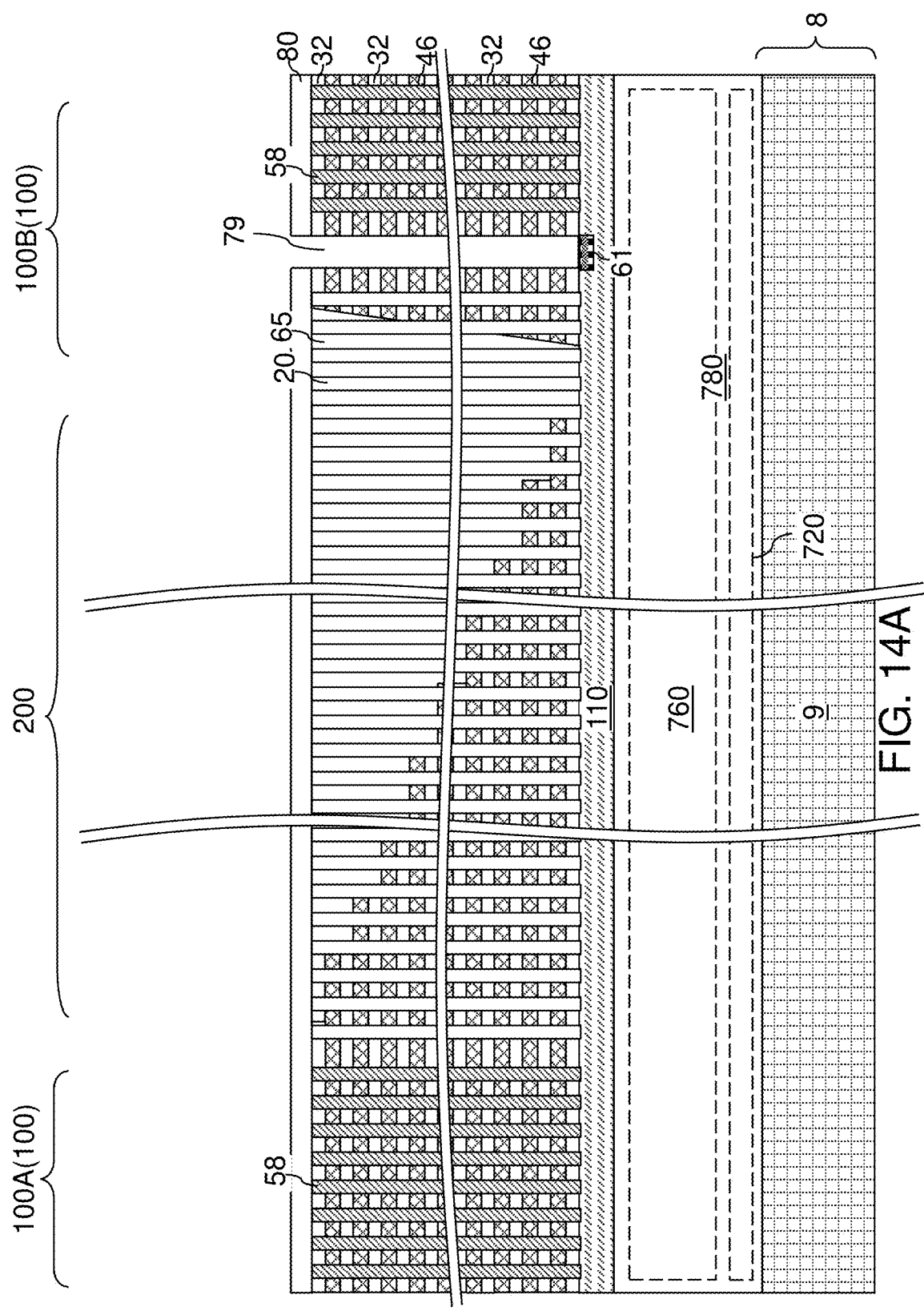
FIG. 14A is a first vertical cross-sectional view along a first vertical plane of the exemplary structure after formation of electrically conductive layers in the lateral recesses according to an embodiment of the present disclosure.
Figure 14B:
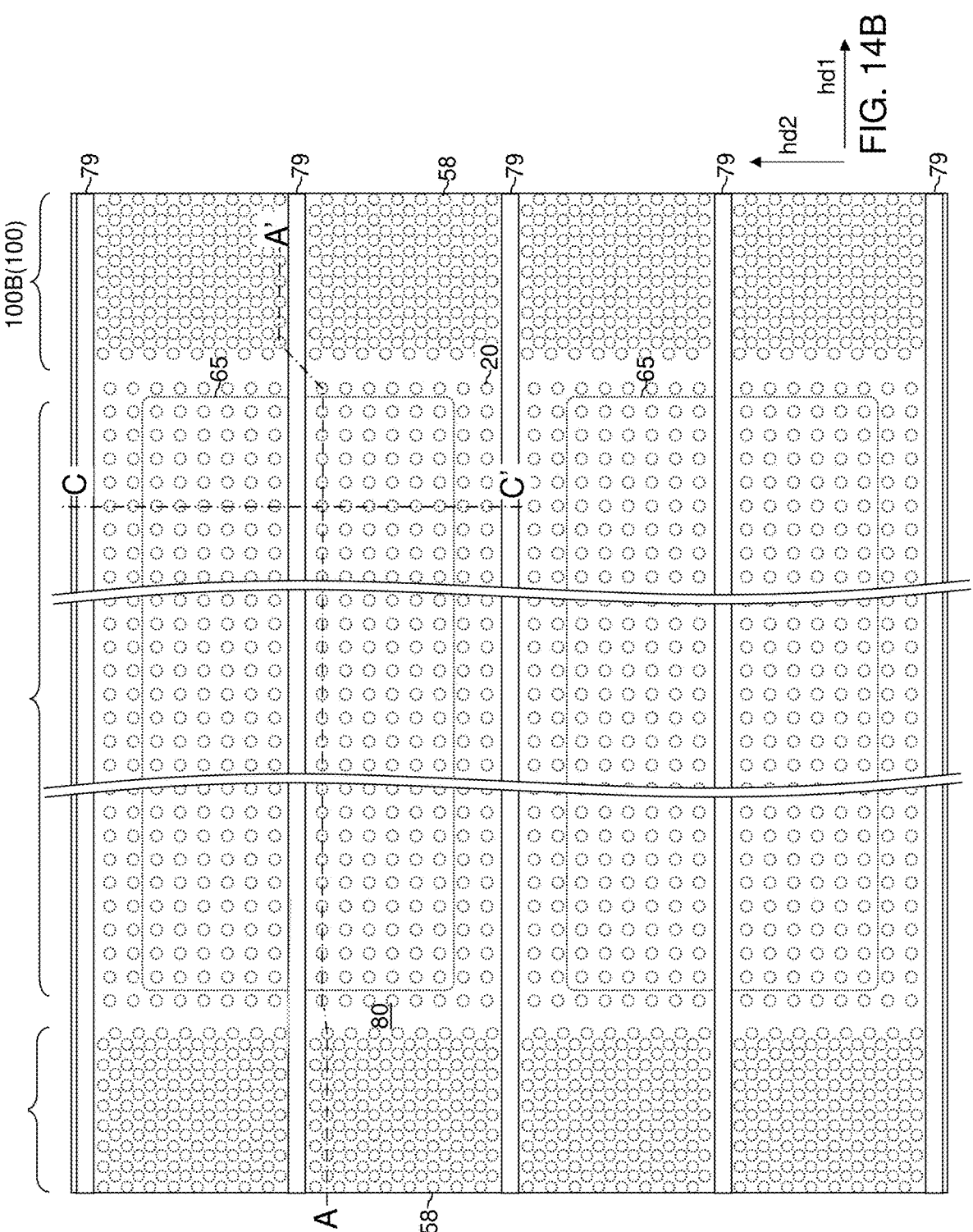
FIG. 14B is a top-down view of the exemplary structure of FIG. 14A. The vertical plane A-A' is the cut plane of the vertical cross-sectional view of FIG. 14A.
Figure 14C:
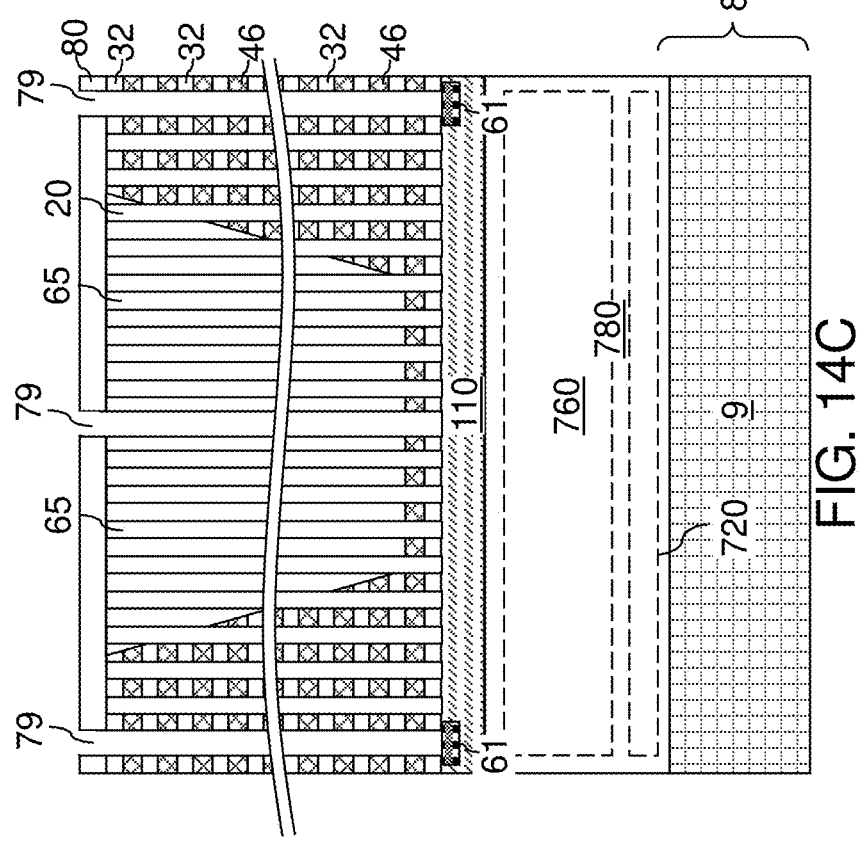
FIG. 14C is a vertical cross-sectional view of the exemplary structure along the vertical plane C-C' of FIG. 14B.

Referring to FIGS. 14A-14C, backside blocking dielectric layer (not shown) may be optionally deposited in the laterally-extending cavities 43 on the physically exposed surfaces of the retro-stepped dielectric material portions 65, the memory opening fill structures 58, and the insulating layers 32 by a conformal deposition process. At least one conductive material can be deposited in unfilled volumes of the laterally-extending cavities 43 by providing at least one reactant gas into the laterally-extending cavities 43 through the lateral isolation trenches. For example, the at least one conductive material may comprise a metallic barrier layer and a metallic fill material.

The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited over the metallic barrier layer to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas, such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which is a metallic barrier layer that blocks diffusion of fluorine atoms therethrough.

A plurality of electrically conductive layers 46 can be formed in the plurality of laterally-extending cavities 43, and a continuous metallic material layer can be formed on the sidewalls of each lateral isolation trench 79 and over the topmost insulating layer 32. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the contact-level dielectric layer 80.

The deposited metallic material of the continuous electrically conductive material layer is etched back from the sidewalls of each lateral isolation trench 79 and from above the topmost insulating layer 32 by performing an etch process that etches the at least one conductive material of the continuous electrically conductive material layer. Each remaining portion of the deposited metallic material in the laterally-extending cavities constitutes an electrically conductive layer 46. Each electrically conductive layer 46 can be a conductive line structure. Thus, the sacrificial material layers 42 are replaced with the electrically conductive layers 46.

The middle electrically conductive layers 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, the electrically conductive layer 46 can be a word line that functions as a common control gate electrode for the plurality of vertical memory devices. At least one upper most electrically conductive layer 46 may comprise a drain side select gate electrode. At least one lower most electrically conductive layer 46 may comprise a source side select gate electrode.

Figure 15A:
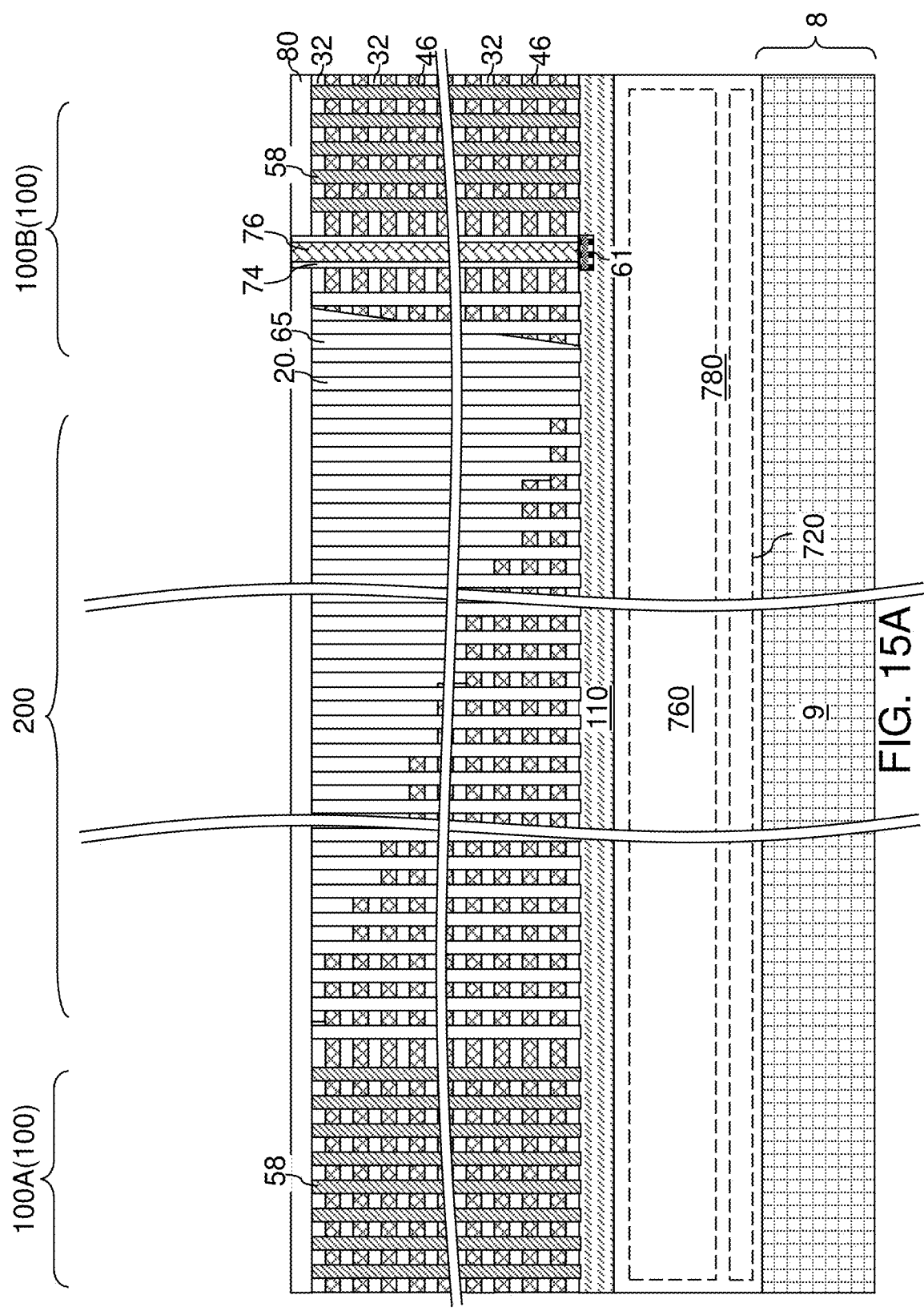
FIG. 15A is a first vertical cross-sectional view along a first vertical plane of the exemplary structure after formation of isolation trench fill structures according to an embodiment of the present disclosure.
Figure 15B:
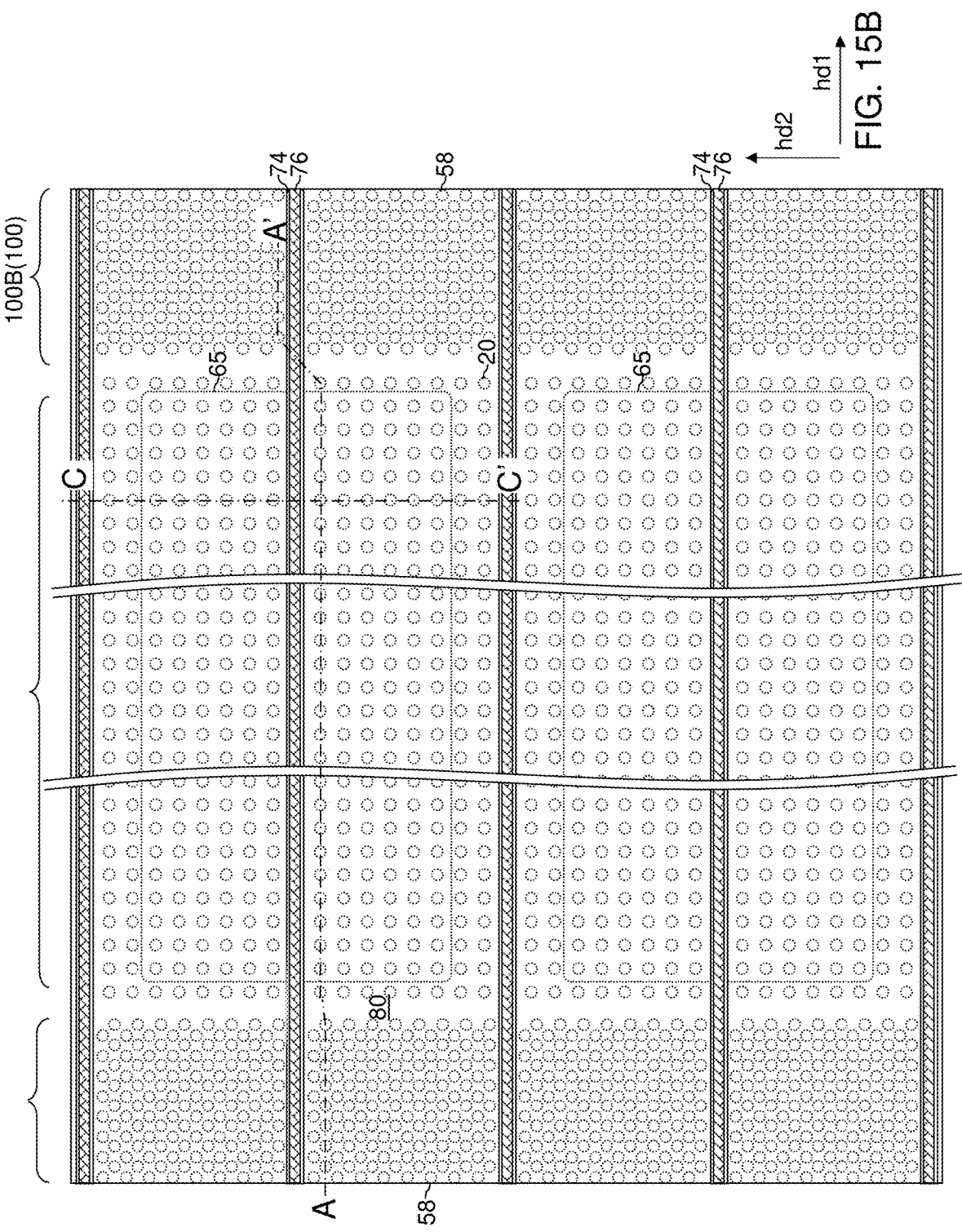
FIG. 15B is a top-down view of the exemplary structure of FIG. 15A. The vertical plane A-A' is the cut plane of the vertical cross-sectional view of FIG. 15A.
Figure 15C:
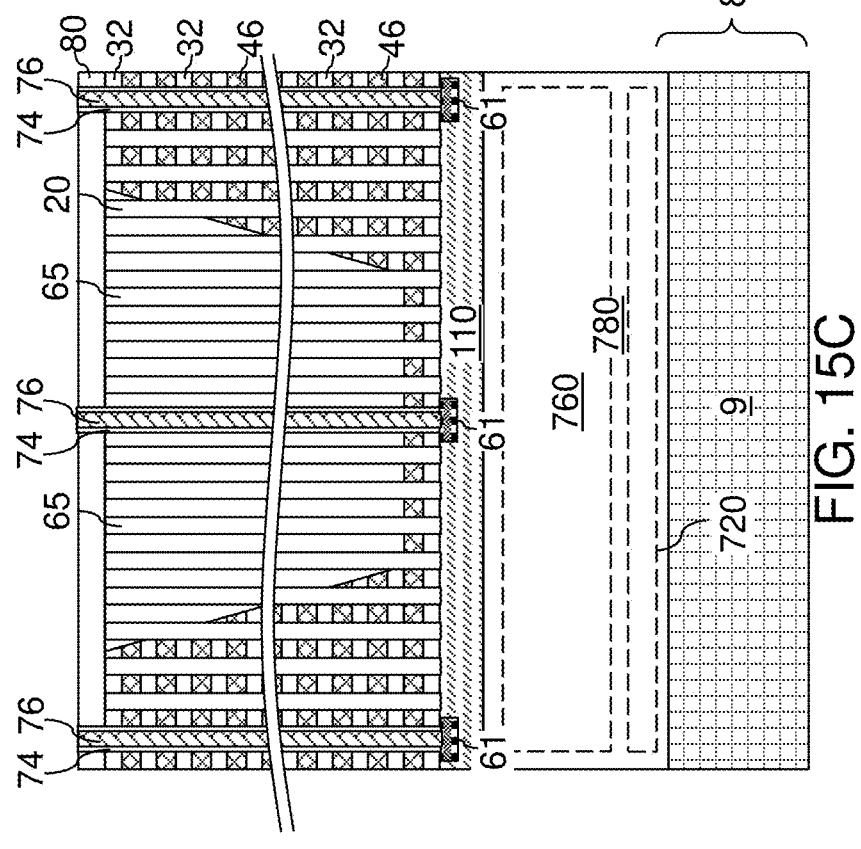
FIG. 15C is a vertical cross-sectional view of the exemplary structure along the vertical plane C-C' of FIG. 15B.

Referring to FIGS. 15A-15C, an insulating material layer can be conformally deposited in peripheral regions of the lateral isolation trenches 79. An optional anisotropic etch process can be performed to remove horizontally-extending portions of the insulating material layer. Each remaining portion of the insulating material layer in the lateral isolation trenches 79 constitute insulating spacers 74.

At least one conductive material, such as at least one metallic material, can optionally be deposited in remaining volumes of the lateral isolation trenches 79. Excess portions of the at least one conductive material can be removed from above the horizontal plane including the top surface of the contact-level dielectric layer 80 by performing a planarization process, such as a chemical mechanical polishing process. Each remaining portion of the at least one conductive material in a respective one of the lateral isolation trenches 79 constitute a source contact wall structure 76. Each contiguous combination of an insulating spacer 74 and a source contact wall structure 76 constitutes an isolation trench fill structure (74, 76).

Figure 16A:
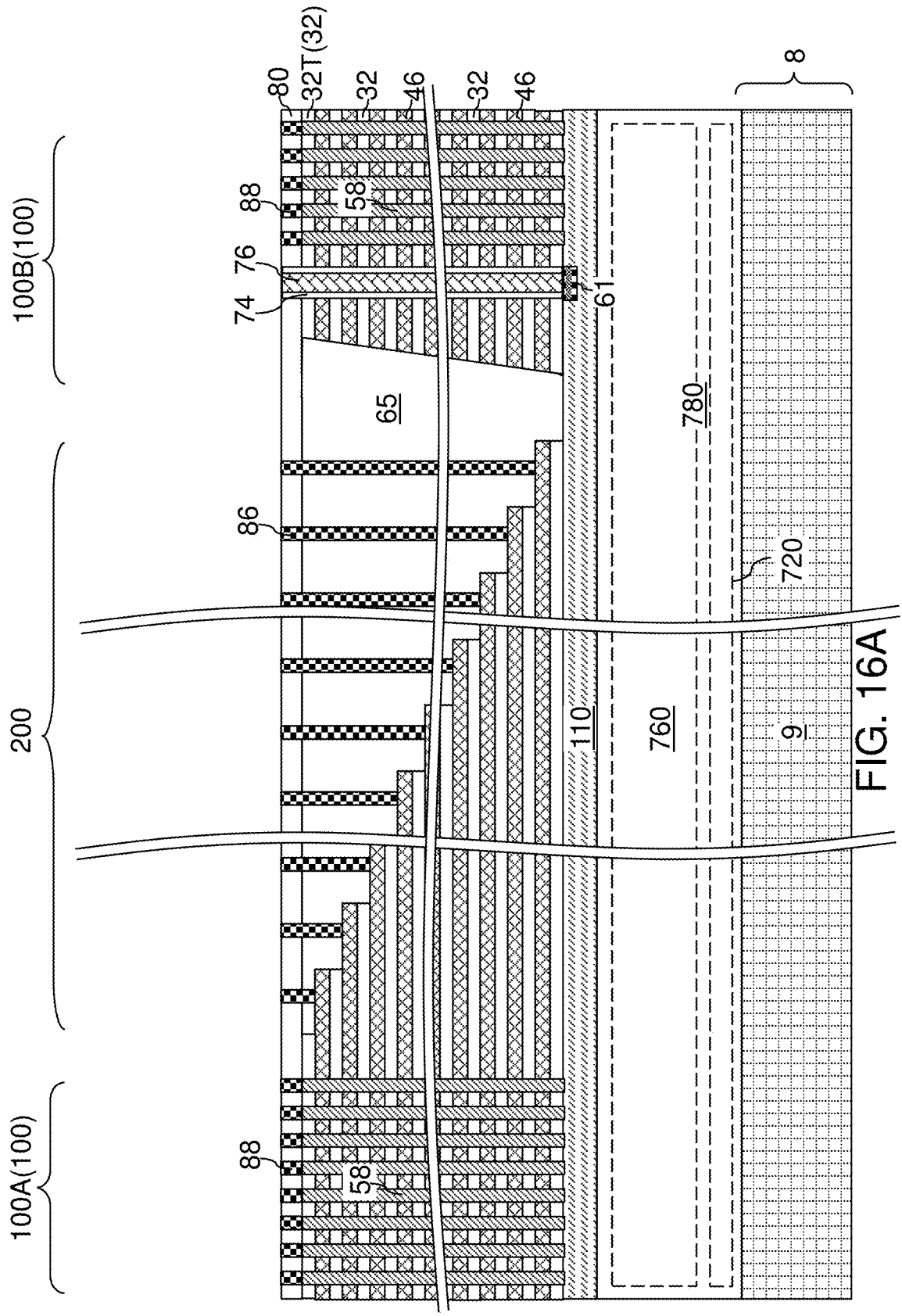
FIG. 16A is a first vertical cross-sectional view along a first vertical plane of the exemplary structure after formation of various contact via structures according to an embodiment of the present disclosure.
Figure 16B:
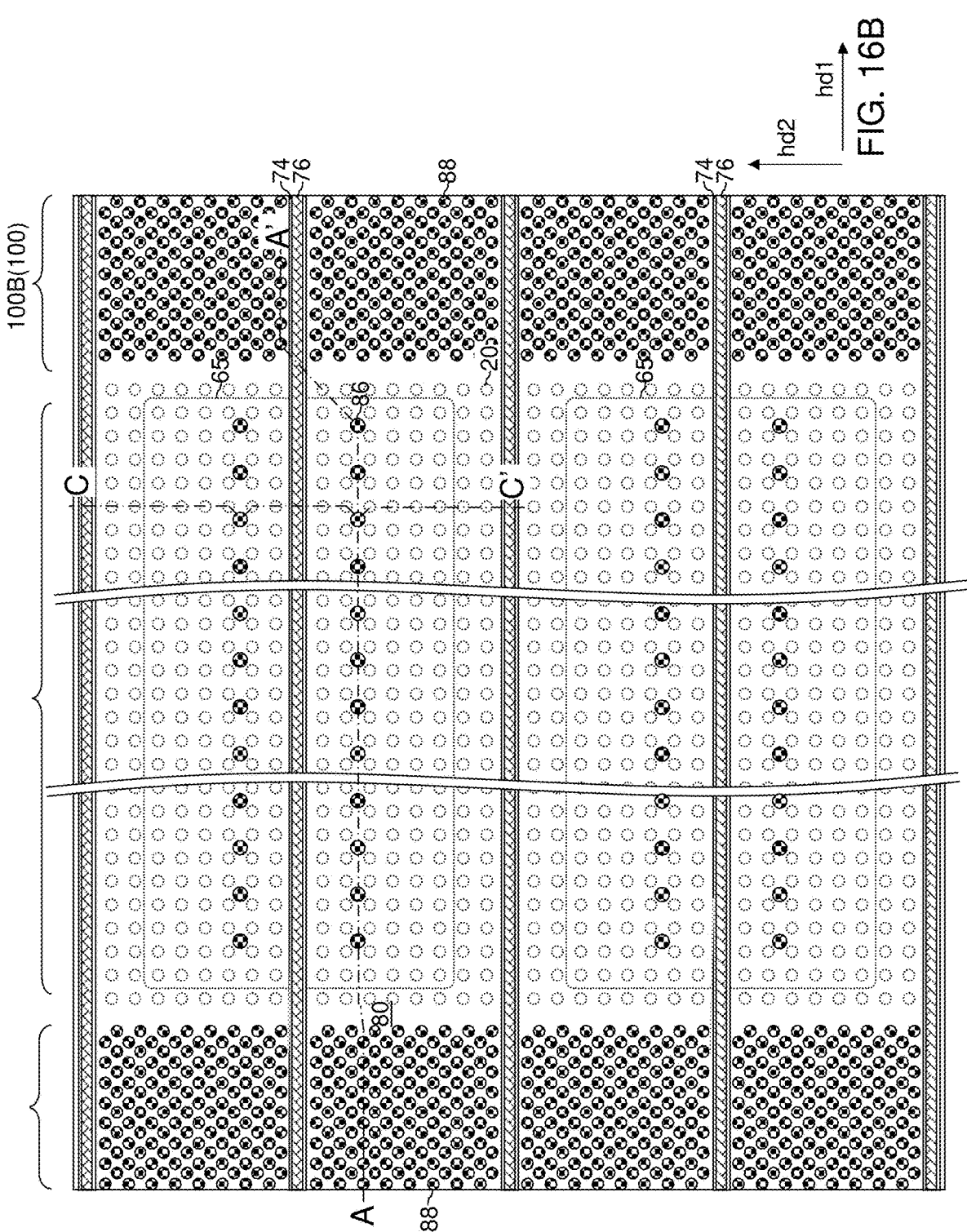
FIG. 16B is a top-down view of the exemplary structure of FIG. 16A. The vertical plane A-A' is the cut plane of the vertical cross-sectional view of FIG. 16A.
Figure 16C:
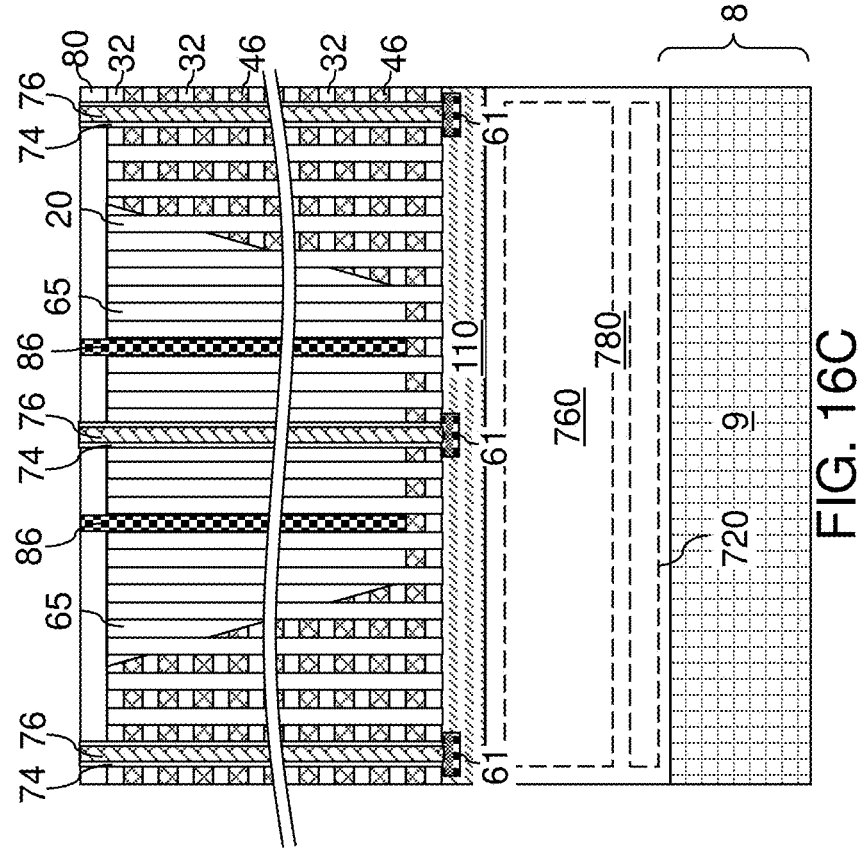
FIG. 16C is a vertical cross-sectional view of the exemplary structure along the vertical plane C-C' of FIG. 16B.

Referring to FIGS. 16A-16C, a photoresist layer (not shown) can be applied over the contact-level dielectric layer 80, and can be lithographically patterned to form openings over areas of the memory opening fill structures 58 and horizontally-extending portions of the electrically conductive layers 46 that underlie the stepped bottom surfaces of the retro-stepped dielectric material portions 65. An anisotropic etch process can be performed to form drain contact via cavities (not shown) over the drain regions 63 of the memory opening fill structures 58, and to form layer contact via structure cavities (not shown) over the horizontally-extending surfaces of the electrically conductive layers 46 underlying the retro-stepped dielectric material portions 65. At least one conductive material can be deposited in the drain contact via cavities to form drain contact via structures 88, and can be deposited in the layer contact via structure cavities to form layer contact via structures 86. Each layer contact via structure 86 contacts a top surface segment of a respective electrically conductive layer 46. Each electrically conductive layer 46 can be contacted by at least one layer contact via structure 86. Additional metal interconnect structures (not shown) may be formed above the contact-level dielectric layer 80 as needed.

Each layer contact via structure 86 vertically extends through a respective horizontal surface segment within a respective staircase structure including K horizontal surface segments located at different levels, and contacts a top surface of a respective one of the electrically conductive layers 46. The staircase structures may be formed in any configuration illustrated in FIGS. 3G, 4F, and 5G in a magnified view. As discussed with reference to FIG. 6, multiple vertical recess distances can be employed at the processing steps of FIG. 3G, FIG. 4F, or FIG. 5G to provide more than 2 staircase structures. Each vertical recess distance may be a respective integer multiple of K times the vertical distance between top surfaces of a vertically neighboring pair of insulating layers 32 within an alternating stack (32, 46) of insulating layers 32 and electrically conductive layers 46. The number K is an integer representing the total number of different levels of horizontal surface segments within each staircase structure. Each neighboring pair of staircase structures can be vertically offset from each other by a respective integer multiple of K times the vertical distance between top surfaces of a vertically neighboring pair of insulating layers 32 within an alternating stack (32, 46).

FIGS. 17A-17D are vertical cross-sectional views of various configurations of the exemplary structures of FIGS. 16A-16C. The exemplary structures comprise a three-dimensional memory device including an alternating stack (32, 46) of insulating layers 32 and electrically conductive layers 46 located over a semiconductor material layer 110; and a two-dimensional array of memory stack structures 55 (comprising portions of memory opening fill structures 58) located in a memory array region 100 and vertically extending through the alternating stack (32, 46). Each of the memory stack structures 55 comprises a respective vertical stack of memory elements (e.g., portions of the memory film 50) and a vertical semiconductor channel 60. The alternating stack (32, 46) comprises a staircase structure located in a contact region 200, Referring to FIG. 17A, a first configuration of a three-dimensional memory device is illustrated. In the first embodiment, the staircase structure comprises, in order from one side to another along a first horizontal direction hd1: a first horizontal surface segment hss1; a first upward vertical step uvs1 having a first height that equals a unit height, the unit height being equal to a vertical distance between top surfaces of a vertically neighboring pair of insulating layers 32 within the alternating stack (32, 46); a second horizontal surface segment hss2 through which a first layer contact via structure 861 extends which contacts a first electrically conductive layer 46 of the electrically conductive layer s46, the second horizontal surface segment hss2 having a first edge that coincides with a top edge of the first upward vertical step uvs1; a downward vertical step dvs having a height that equals the unit height and having a top edge that coincides with a second edge of the second horizontal surface segment hss2; a third horizontal surface segment hss3 through which a second layer contact via structure 862 extends which contacts a second electrically conductive layer 46 of the electrically conductive layers 46, the third horizontal surface segment hss3 having a first edge that coincides with a bottom edge of the downward vertical step dvs; a second upward vertical step uvs2 having a second height that equals double the unit height and having a bottom edge that coincides with a second edge of the third horizontal surface segment hss3; a fourth horizontal surface segment hss4 through which a third layer contact via structure 863 extends which contacts a third electrically conductive layer 46 of the electrically conductive layers 46, the fourth horizontal surface segment hss4 having a first edge that coincides with a top edge of the second upward vertical step uvs2; a third upward vertical step uvs3 having a third height that equals the unit height and having a bottom edge that coincides with a second edge of the fourth horizontal surface segment hss4; and a fifth horizontal surface segment hss5 through which a fourth layer contact via structure 864 extends which contacts a fourth electrically conductive layer 46 of the electrically conductive layers 46, the fifth horizontal surface segment hss5 having a first edge that coincides with a top edge of the third upward vertical step uvs3. In one embodiment, each horizontal surface segment through which a layer contact via structure 86 vertically extends may have the same lateral extent along the first horizontal direction hd1, which can be the first trimming distance.

Figure 17A:
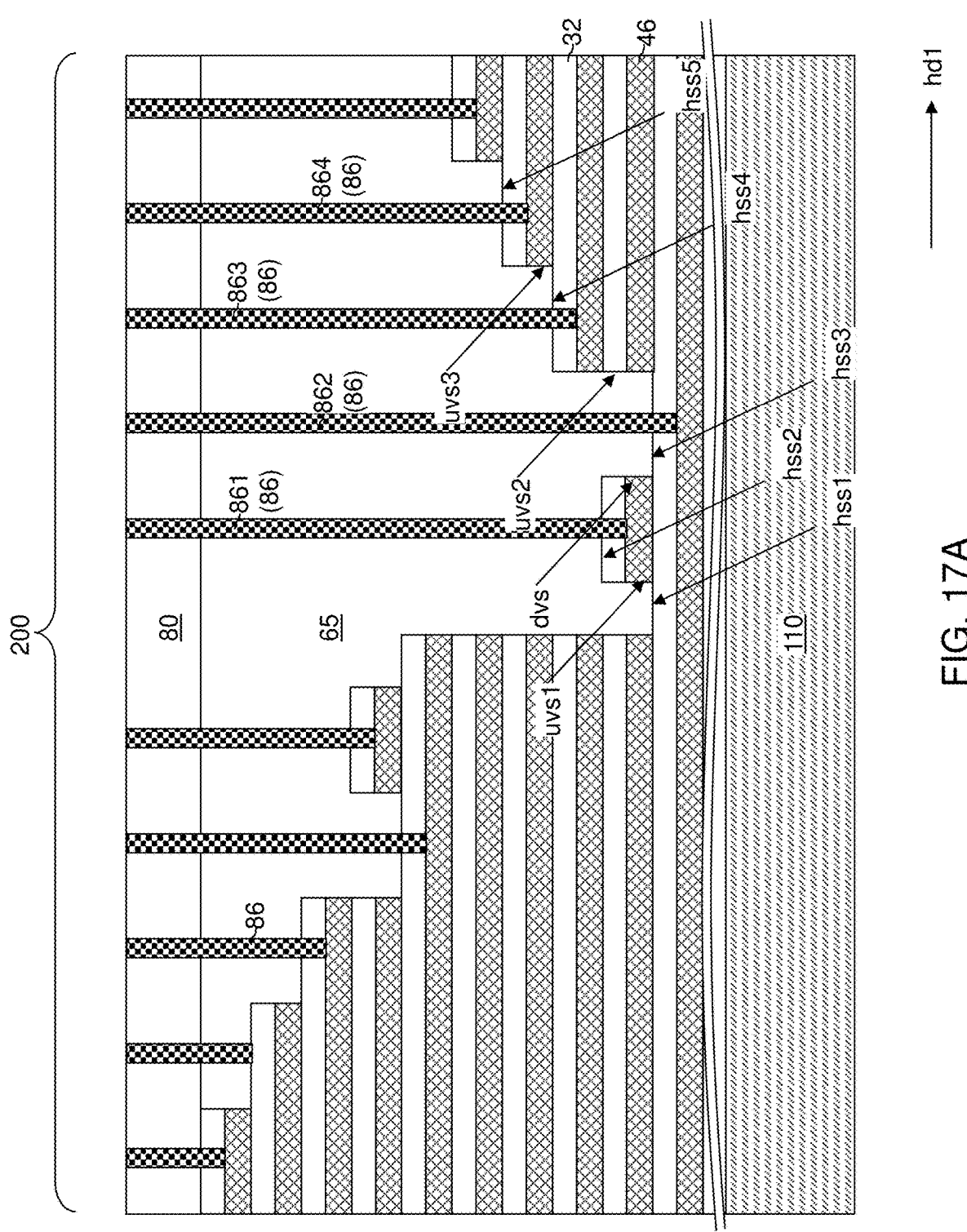
FIGS. 17A-17D are vertical cross-sectional views of various configurations of the exemplary structure of FIGS. 16A-16C.
Figure 17B:
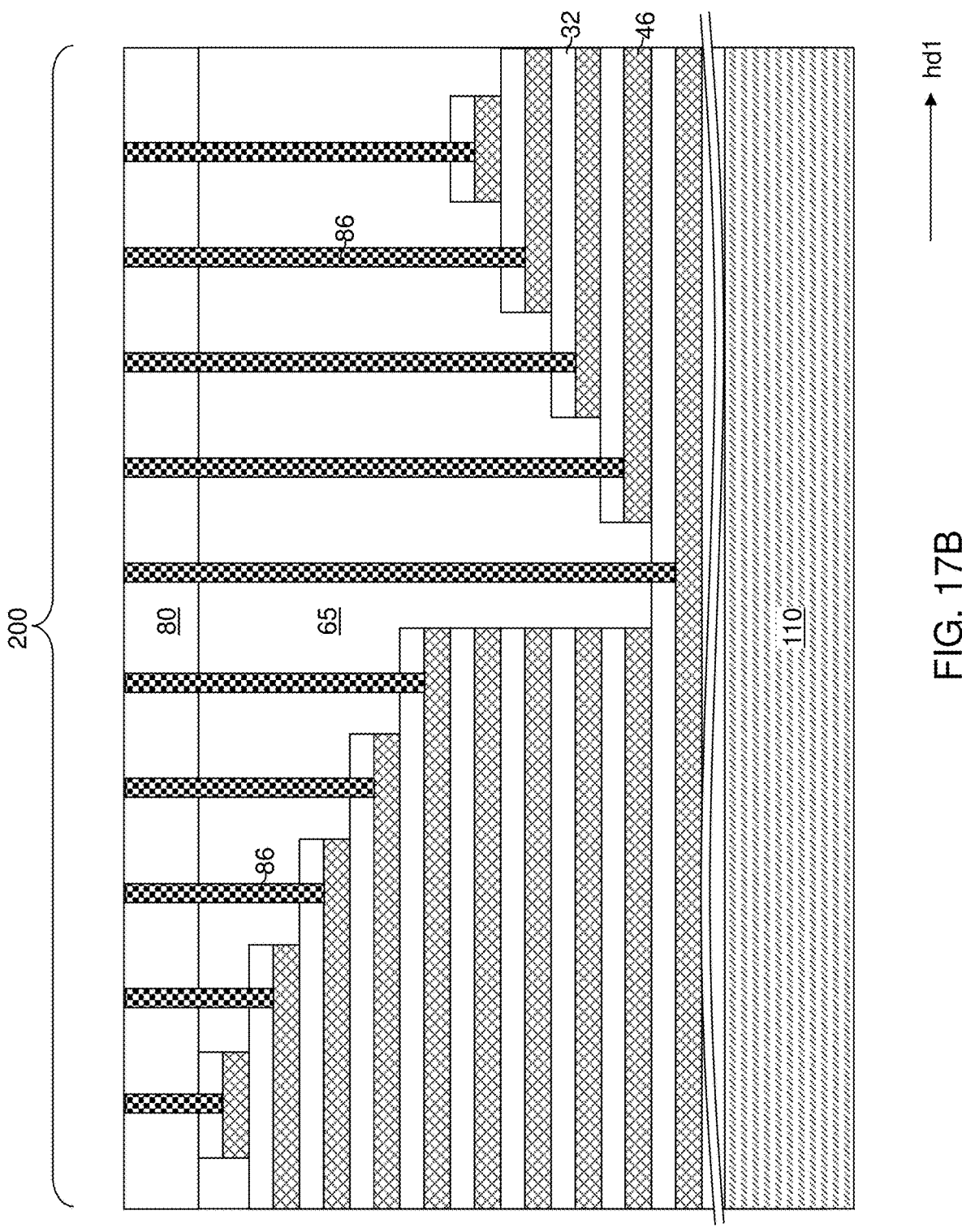

Referring to FIG. 17B, a second configuration of a three-dimensional memory device is illustrated. In the second embodiment, the contact region 200 may comprise multiple staircase structures each including exactly K horizontal surface segments located at K different levels and vertically spaced apart from each other by sidewalls having a height that equals integer multiples of K times the vertical distance between top surfaces of a vertically neighboring pair of insulating layers 32 within an alternating stack (32, 46). For each horizontal surface segment in a staircase structure, there exists a layer contact via structure that vertically extends through the horizontal surface segment and contacts a respective underlying electrically conductive layer 46.

Figure 17C:
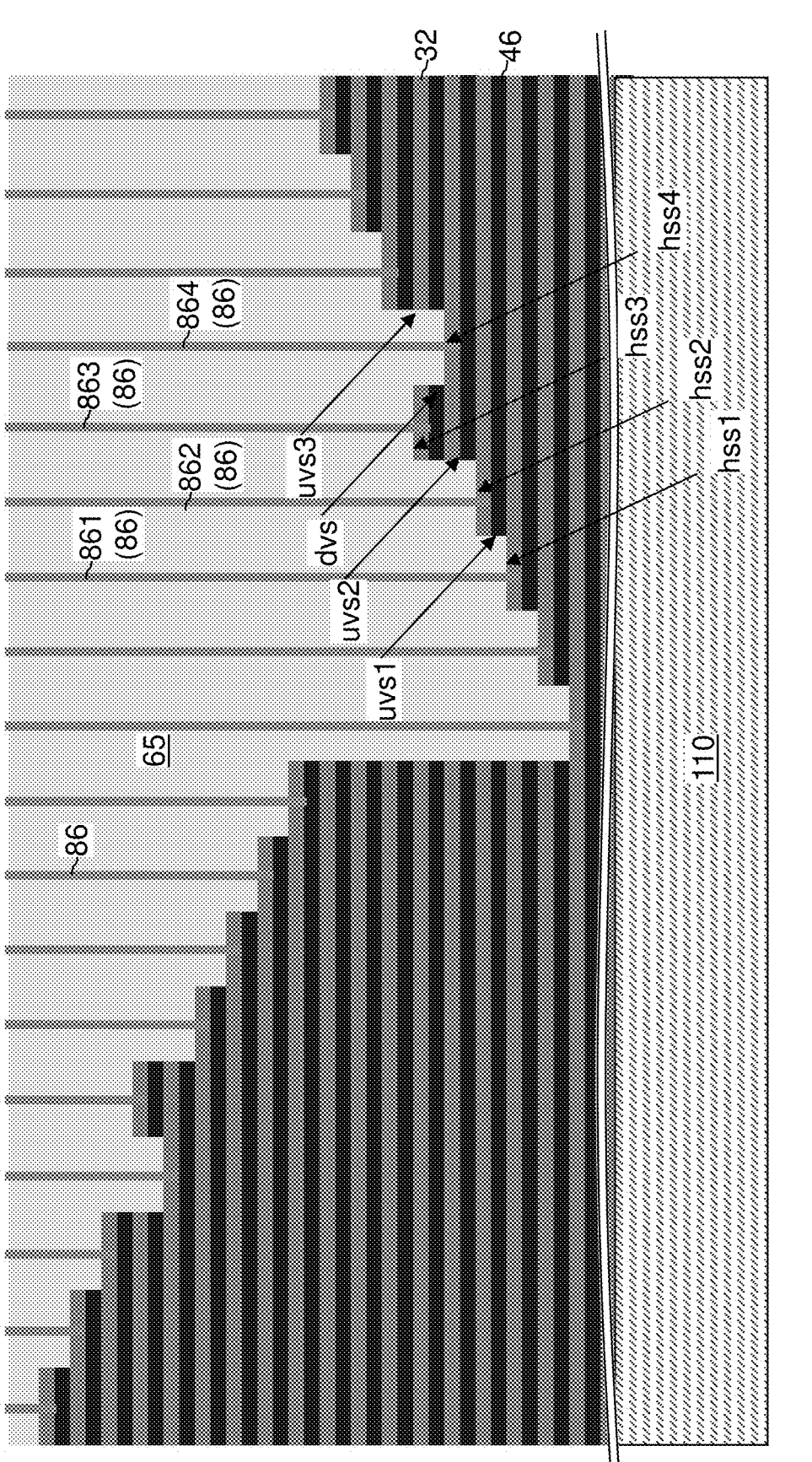
Figure 17D:
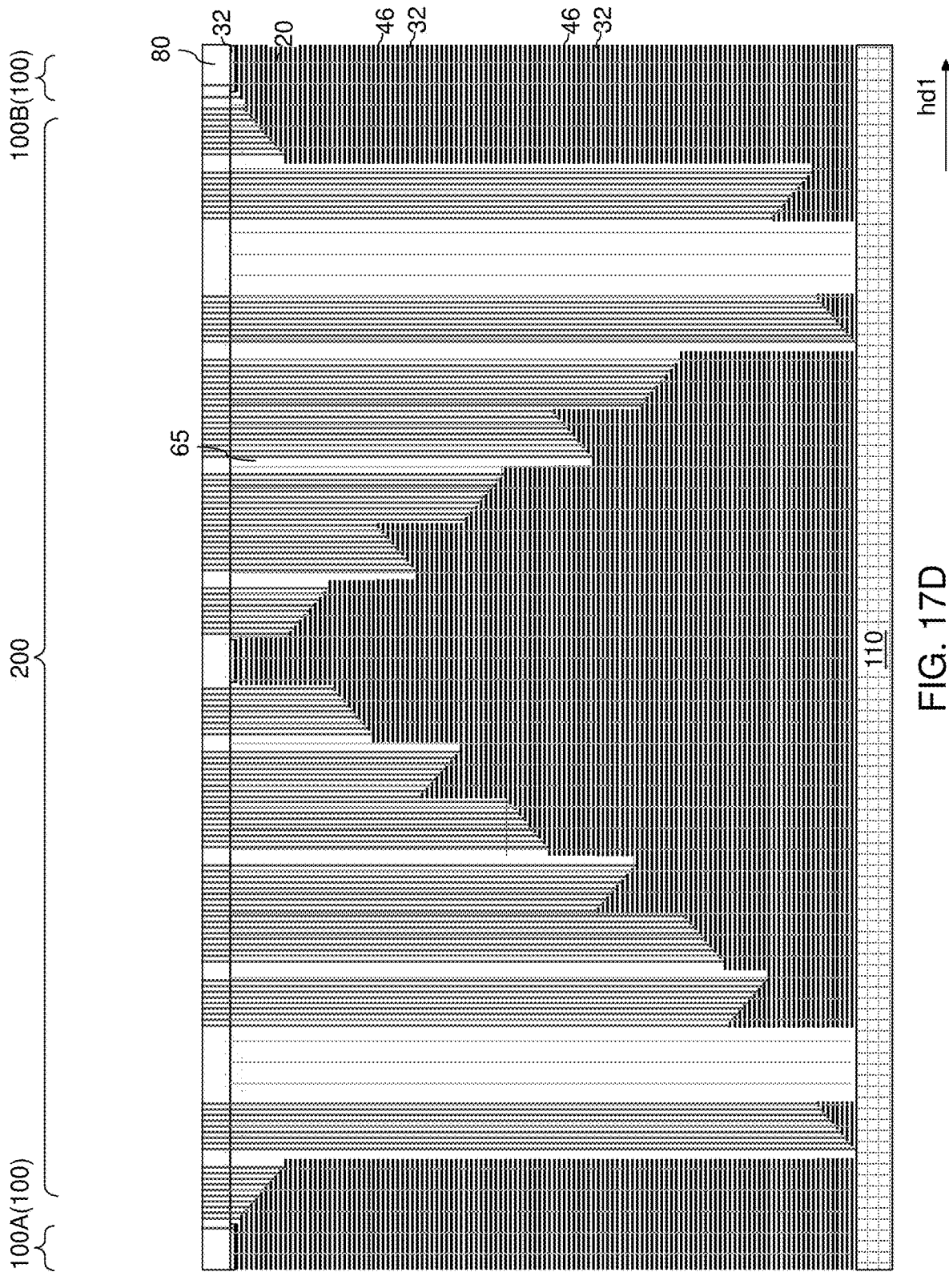

Referring to FIG. 17C, a third configuration of a three-dimensional memory device is illustrated. In the third embodiment, the staircase structure comprises, in order from one side to another along a first horizontal direction hd1: a first horizontal surface segment hss1 through which a first layer contact via structure 861 extends which contacts a first electrically conductive layer 46 of the electrically conductive layer 46; a first upward vertical step uvs1 having a first height that equals a unit height, the unit height being equal to a vertical distance between top surfaces of a vertically neighboring pair of insulating layers 32 within the alternating stack (32, 46); a second horizontal surface segment hss2 through which a second layer contact via structure 862 extends which contacts a second electrically conductive layer 46 of the electrically conductive layers 46; a second upward vertical step uvs2 having a second height that equals double the unit height and having a bottom edge that coincides with an edge of the second horizontal surface segment hss2; a third horizontal surface segment hss3 through which a third layer contact via structure 863 extends which contacts a third electrically conductive layer 46 of the electrically conductive layers 46, the third horizontal surface segment hss3 having a first edge that coincides with a top edge of the second upward vertical step uvs2; a downward vertical step dvs having a height that equals the unit height and having a top edge that coincides with a second edge of the third horizontal surface segment hss3; a fourth horizontal surface segment hss4 through which a fourth layer contact via structure 864 extends which contacts a fourth electrically conductive layer 46 of the electrically conductive layers 46, the fourth horizontal surface segment hss4 having a first edge that coincides with a bottom edge of the downward vertical step dvs; and a third upward vertical step uvs3 having a third height that equals double the unit height and having a bottom edge that coincides with a second edge of the fourth horizontal surface segment hss4.

The various embodiments of the present disclosure may be employed to provide staircase structures that are free of scales that are used as dedicated alignment mark structures rather than terraces contacted by the contact via structures, which provides a three-dimensional memory device requiring a smaller contact area or more dense contacts per unit area.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not mutually exclusive alternatives. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art.

What is claimed is:

1. A method of forming a semiconductor structure, comprising:

forming an alternating stack of insulating layers and spacer material layers over a substrate, wherein the spacer material layers are formed as or are subsequently replaced with electrically conductive layers;

forming primary terrace patterns at a top portion of the alternating stack, wherein the primary terrace patterns comprise a first terrace pattern comprising a first top-level terrace and a second terrace pattern comprising a second top-level terrace, wherein the first top-level terrace and the second top-level terrace are laterally spaced along a first horizontal direction, and are formed by patterning a pair of a topmost insulating layer and a topmost spacer material layer within the alternating stack;

forming a patterned trimmable etch mask layer comprising two trimmable etch mask patterns over the alternating stack, wherein the two trimmable etch mask patterns comprise planar sidewalls that laterally extend along a second horizontal direction that is perpendicular to the first horizontal direction, and are laterally spaced from each other along the first horizontal direction;

forming additional terrace patterns in the alternating stack by performing iterations of a set of processing steps multiple times, wherein each iteration of the set of processing steps comprises a respective anisotropic etch process that etches unmasked portions of the alternating stack and a respective mask trimming process that isotropically trims the two trimmable etch mask patterns;

determining if the respective mask trimming process trimmed the two trimmable etch mask patterns within desired distance ranges using the primary terrace patterns as alignment marks; and forming layer contact via structures which contact the electrically conductive layers in the primary terrace patterns and the additional terrace patterns.

2. The method of claim 1, wherein the step of determining if the respective mask trimming process trimmed the two trimmable etch mask patterns within the desired distance ranges using the primary terrace patterns as alignment marks comprises performing a measurement operation which measures locations of vertical steps of at least one of the additional terrace patterns or the planar sidewalls of two trimmable etch mask patterns relative to the primary terrace patterns employing a dimensional metrology tool that identifies one of the primary terrace patterns as a reference structure.

3. The method of claim 2, further comprising:

covering a first region of the alternating stack that includes the first terrace pattern and a first subset of the additional terrace patterns with a photoresist material portion; and vertically recessing a second region of the alternating stack that includes the second terrace pattern and a second subset of the additional terrace patterns by a vertical recess distance while the photoresist material portion covers the first region.

4. The method of claim 3, wherein:

the first region comprises horizontal surfaces of the insulating layers that contact the photoresist material portion at K horizontal planes that are vertically spaced from each other, wherein K is an integer greater than 2; and the vertical recess distance equals an integer multiple of K times a sum of a thickness of an insulating layer within the alternating stack and a thickness of a spacer material layer within the alternating stack.

5. The method of claim 2, wherein:

each of the two trimmable etch mask patterns of the patterned trimmable etch mask layer covers a respective one of the first terrace pattern and the second terrace pattern upon formation of the patterned trimmable etch mask layer; and the two trimmable etch mask patterns of the patterned trimmable etch mask layer are laterally spaced from each other along the first horizontal direction by a lateral gap having an initial spacing that is less than a separation distance between the first terrace pattern and the second terrace pattern.

6. The method of claim 5, wherein:

the two trimmable etch mask patterns are trimmed by a first isotropic trimming distance during each mask trimming process within a first subset of the iterations of the set of processing steps; and the first isotropic trimming distance equals $1/(2N)$ times a difference between the separation distance and the initial spacing, N being an integer not less than 2.

7. The method of claim 6, wherein:

the two trimmable etch mask patterns are trimmed by a second isotropic trimming distance during a mask trimming process within one of the iterations of the set of processing steps that is performed after the first subset of the iterations; and the second isotropic trimming distance equals $3/(2N)$ times the difference between the separation distance and the initial spacing.

8. The method of claim 7, wherein:

the two trimmable etch mask patterns are trimmed by the first isotropic trimming distance during each mask trimming process within a second subset of the iterations of the set of processing steps; and the second subset of the iterations is performed after said one of the iterations of the set of processing steps.

9. The method of claim 8, wherein:

the measurement operation is performed after performing the second subset of the iterations; and the measurement operation measures locations of a first subset of the vertical steps that is formed prior to said one of the iterations of the set of processing steps, and measures location of a second subset of the vertical steps that is formed after said one of the iterations of the set of processing steps.

10. The method of claim 6, wherein:

the first subset of the iterations of the set of processing steps equals an entirety of the iterations of the set of processing steps; and each of the primary terrace patterns is covered by the two trimmable etch mask patterns during each of the iterations of the set of processing steps.

11. The method of claim 5, wherein a combination of the primary terrace patterns and the additional terrace patterns has a bottommost horizontal surface within an area of the gap during the measurement operation.

12. The method of claim 1, wherein:

each of the primary terrace patterns is covered by the two trimmable etch mask patterns after a final iteration of the set of processing steps of the set of processing steps; and the method further comprises performing a terminal anisotropic etch process after performing the iterations of the set of processing steps, and removing the patterned trimmable etch mask layer after performing the terminal anisotropic etch process.

13. The method of claim 12, wherein the primary terrace patterns comprise patterned portions of a combination of the topmost insulating layer and the topmost spacer material layer within the alternating stack after removing the patterned trimmable etch mask layer.

14. The method of claim 12, wherein:

the two trimmable etch mask patterns are trimmed by a first isotropic trimming distance during each mask trimming process within the iterations of the set of processing steps;

the first isotropic trimming distance equals 1/(2N) times a difference between the separation distance and the initial spacing, N being an integer not less than 2; and upon performing a final mask trimming process within the iterations of the set of processing steps, a first lateral distance between the first terrace pattern and a proximal sidewall of a first one of the two trimmable etch mask patterns equals the first isotropic trimming distance, and a second lateral distance between the second terrace pattern and a proximal sidewall of a first one of the two trimmable etch mask patterns equals the first isotropic trimming distance.

15. The method of claim 1, wherein the first terrace pattern and the second terrace pattern are located entirely within a gap between the two trimmable etch mask patterns of the patterned trimmable etch mask layer upon formation of the patterned trimmable etch mask layer.

16. The method of claim 15, wherein the two trimmable etch mask patterns of the patterned trimmable etch mask layer are laterally spaced from each other along the first horizontal direction by a lateral gap having an initial spacing that is greater than a separation distance between the first terrace pattern and the second terrace pattern.

17. The method of claim 1, further comprising forming a two-dimensional array of memory stack structures located in a memory array region and vertically extending through the alternating stack, wherein each of the memory stack structures comprises a respective vertical stack of memory elements and a vertical semiconductor channel.

18. The method of claim 17, wherein:

the two trimmable etch mask patterns are trimmed by a first isotropic trimming distance during each mask trimming process within a first subset of the iterations of the set of processing steps; and the first isotropic trimming distance equals 1/(2N) times a difference between the initial spacing and the separation distance, N being an integer not less than 2.

19. A three-dimensional memory device comprising:

an alternating stack of insulating layers and electrically conductive layers located over a semiconductor material layer; and a two-dimensional array of memory stack structures located in a memory array region and vertically extending through the alternating stack, wherein each of the memory stack structures comprises a respective vertical stack of memory elements and a vertical semiconductor channel; and wherein the alternating stack comprises a staircase structure located in a contact region, wherein the staircase structure comprises, in order from one side to another along a first horizontal direction:

a first horizontal surface segment;

a first upward vertical step having a first height that equals a unit height, the unit height being equal to a vertical distance between top surfaces of a vertically neighboring pair of insulating layers within the alternating stack;

a second horizontal surface segment through which a first layer contact via structure extends which contacts a first electrically conductive layer of the electrically conductive layer, the second horizontal surface segment having a first edge that coincides with a top edge of the first upward vertical step;

a downward vertical step having a height that equals the unit height and having a top edge that coincides with a second edge of the second horizontal surface segment;

a third horizontal surface segment through which a second layer contact via structure extends which contacts a second electrically conductive layer of the electrically conductive layers, the third horizontal surface segment having a first edge that coincides with a bottom edge of the downward vertical step;

a second upward vertical step having a second height that equals double the unit height and having a bottom edge that coincides with a second edge of the third horizontal surface segment;

a fourth horizontal surface segment through which a third layer contact via structure extends which contacts a third electrically conductive layer of the electrically conductive layers, the fourth horizontal surface segment having a first edge that coincides with a top edge of the second upward vertical step;

a third upward vertical step having a third height that equals the unit height and having a bottom edge that coincides with a second edge of the fourth horizontal surface segment; and a fifth horizontal surface segment through which a fourth layer contact via structure extends which contacts a fourth electrically conductive layer of the electrically conductive layers, the fifth horizontal surface segment having a first edge that coincides with a top edge of the third upward vertical step.

20. A three-dimensional memory device comprising:

an alternating stack of insulating layers and electrically conductive layers located over a semiconductor material layer; and a two-dimensional array of memory stack structures located in a memory array region and vertically extending through the alternating stack, wherein each of the memory stack structures comprises a respective vertical stack of memory elements and a vertical semiconductor channel; and wherein the alternating stack comprises a staircase structure located in a contact region, wherein the staircase structure comprises, in order from one side to another along a first horizontal direction:

a first horizontal surface segment through which a first layer contact via structure extends which contacts a first electrically conductive layer of the electrically conductive layer;

a first upward vertical step having a first height that equals a unit height, the unit height being equal to a vertical distance between top surfaces of a vertically neighboring pair of insulating layers within the alternating stack;

a second horizontal surface segment through which a second layer contact via structure extends which contacts a second electrically conductive layer of the electrically conductive layers;

a second upward vertical step having a second height that equals double the unit height and having a bottom edge that coincides with an edge of the second horizontal surface segment;

a third horizontal surface segment through which a third layer contact via structure extends which contacts a third electrically conductive layer of the electrically conductive layers, the third horizontal surface segment having a first edge that coincides with a top edge of the second upward vertical step;

a downward vertical step having a height that equals the unit height and having a top edge that coincides with a second edge of the third horizontal surface segment;

a fourth horizontal surface segment through which a fourth layer contact via structure extends which contacts a fourth electrically conductive layer of the electrically conductive layers, the fourth horizontal surface segment having a first edge that coincides with a bottom edge of the downward vertical step; and a third upward vertical step having a third height that equals double the unit height and having a bottom edge that coincides with a second edge of the fourth horizontal surface segment.

* * * * *